US007684456B2

(12) United States Patent
Jikutani

(10) Patent No.: US 7,684,456 B2
(45) Date of Patent: *Mar. 23, 2010

(54) LASER DIODE AND SEMICONDUCTOR LIGHT-EMITTING DEVICE PRODUCING VISIBLE-WAVELENGTH RADIATION

(75) Inventor: Naoto Jikutani, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 5 days.

This patent is subject to a terminal disclaimer.

(21) Appl. No.: 11/580,918

(22) Filed: Oct. 16, 2006

(65) Prior Publication Data

US 2007/0171949 A1 Jul. 26, 2007

Related U.S. Application Data

(62) Division of application No. 10/866,901, filed on Jun. 15, 2004, now Pat. No. 7,139,297, which is a division of application No. 10/427,909, filed on May 2, 2003, now Pat. No. 6,983,004, which is a division of application No. 09/633,230, filed on Aug. 4, 2000, now Pat. No. 6,614,821.

(30) Foreign Application Priority Data

| Aug. 4, 1999 | (JP) | ................................. 11-220649 |
| Aug. 16, 1999 | (JP) | ................................. 11-229794 |
| Aug. 30, 1999 | (JP) | ................................. 11-243745 |
| Nov. 30, 1999 | (JP) | ................................. 11-339267 |
| Mar. 2, 2000 | (JP) | ............................. 2000-057254 |
| May 12, 2000 | (JP) | ............................. 2000-1440604 |

(51) Int. Cl.
*H01S 5/00* (2006.01)

(52) U.S. Cl. ..................................... 372/50.11; 438/46

(58) Field of Classification Search ................. 359/326; 438/22; 372/46.01
See application file for complete search history.

(56) References Cited

U.S. PATENT DOCUMENTS 4,288,757 A 9/1981 Kajimura (Continued)

FOREIGN PATENT DOCUMENTS

JP 36-128-0687 A 12/1986

(Continued)

OTHER PUBLICATIONS

Notice of Rejection of Japanese Patent Application No. 11-229794 (date of issue Nov. 14, 2006).

(Continued)

*Primary Examiner*—Minsun Harvey
*Assistant Examiner*—Tuan N. Nguyen
(74) *Attorney, Agent, or Firm*—Dickstein Shapiro LLP

(57) ABSTRACT

A laser diode includes a substrate having a lattice constant of GaAs or between GaAs and GaP, a first cladding layer of AlGaInP formed on the substrate, an active layer of GaInAsP formed on the first cladding layer, an etching stopper layer of GaInP formed on the active layer, a pair of current-blocking regions of AlGaInP formed on the etching stopper layer so as to define a strip region therebetween, an optical waveguide layer of AlGaInP formed on the pair of current-blocking regions so as to cover the etching stopper layer in the stripe region, and a second cladding layer of AlGaInP formed on the optical waveguide layer, wherein the current-blocking regions having an Al content substantially identical with an Al content of the second cladding layer.

8 Claims, 33 Drawing Sheets

U.S. PATENT DOCUMENTS

| | | |
|---|---|---|
| 4,866,488 A | 9/1989 | Frensley |
| 5,206,871 A | 4/1993 | Deppe et al. |
| 5,295,147 A * | 3/1994 | Jewell et al. ............. 372/45.01 |
| 5,386,429 A | 1/1995 | Naito |
| 5,446,753 A | 8/1995 | Yoshida |
| 5,557,627 A | 9/1996 | Schneider et al. |
| 5,594,751 A | 1/1997 | Scott |
| 5,602,866 A | 2/1997 | Fukunaga |
| 5,719,891 A * | 2/1998 | Jewell ................... 372/46.013 |
| 5,815,524 A | 9/1998 | Ramdani et al. |
| 5,985,683 A | 11/1999 | Jewell |
| 5,986,288 A * | 11/1999 | Hasegawa .................... 257/94 |
| 6,008,067 A * | 12/1999 | Ramdani et al. ............. 438/46 |
| 6,014,395 A | 1/2000 | Jewell |
| 6,028,874 A | 2/2000 | Wada et al. |
| 6,072,196 A * | 6/2000 | Sato ........................... 257/87 |
| 6,075,804 A | 6/2000 | Deppe et al. |
| 6,118,800 A | 9/2000 | Kidoguchi |
| 6,207,973 B1 * | 3/2001 | Sato et al. ..................... 257/98 |
| 6,542,528 B1 | 4/2003 | Sato et al. |
| 6,563,851 B1 | 5/2003 | Jiruthani et al. |

FOREIGN PATENT DOCUMENTS

| | | |
|---|---|---|
| JP | 63-278395 | 11/1988 |
| JP | 05-013884 | 1/1993 |
| JP | 05-041560 | 2/1993 |
| JP | 40-515-7919 A | 6/1993 |
| JP | 06-268318 | 9/1994 |
| JP | 06-350189 | 12/1994 |
| JP | 07-302953 | 11/1995 |
| JP | 07-307525 | 11/1995 |
| JP | 08-181378 | 7/1996 |
| JP | 09-298337 | 11/1997 |
| JP | 10-032364 | 2/1998 |
| JP | 10-098232 | 4/1998 |
| JP | 10-505465 | 5/1998 |

OTHER PUBLICATIONS

Notice of Rejection of Japanese Patent Application 2000-057254 dated Feb. 15, 2008.

* cited by examiner

LASER DIODE AND SEMICONDUCTOR LIGHT-EMITTING DEVICE PRODUCING VISIBLE-WAVELENGTH RADIATION

CROSS-REFERENCE TO RELATED APPLICATIONS

The present application is a divisional of U.S. patent application Ser. No. 10/866,901, filed on Jun. 15, 2004 now U.S. Pat. No. 7,139,297, which is a division of U.S. application Ser. No. 10/427,909, filed on May 2, 2003 (now U.S. Pat. No. 6,983,004), which is a division of U.S. patent application Ser. No. 09/633,230, filed on Aug. 4, 2000 (now U.S. Pat. No. 6,614,821) which is based on Japanese priority applications No. 11-220649 filed on Aug. 4, 1999, No. 11-229794 filed on Aug. 16, 1999, No. 11-243745 filed on Aug. 30, 1999, No. 11-339267 filed on Nov. 30, 1999, No. 2000-057254 filed on Mar. 2, 2000, and No. 2000-144604 filed on May 12, 2000, the entire contents of which are hereby incorporated in their entirety by reference herein.

BACKGROUND OF THE INVENTION

The present invention generally relates to semiconductor devices and more particularly to semiconductor light-emitting devices and laser diodes.

Particularly, the present invention relates to a laser diode operable in a wavelength range of 360-680 nm. Further, the present invention relates to a laser diode for use in optical recording and optical reading of information or light-emitting display of information. Further, the present invention relates to a semiconductor light-emitting device based on a III-V compound semiconductor material.

Further, the present invention relates to a vertical-cavity laser diode suitable for an optical source of optical recording and reading of information or light-emitting display of information. The present invention further relates to an optical information recording apparatus such as a xerographic image recording system or an optical system and optical telecommunication system including an optical interconnection device that uses a vertical-cavity laser diode.

In these days, efforts are being made to develop a red-wavelength laser diode operable in the wavelength range of 630-680 nm as an optical source of optical disk recording apparatuses. Such an optical disk recording apparatus includes a DVD (Digital Video Disk or Digital Versatile Disk) player. The laser diode is used in such disk recording apparatuses as the optical source for reading and/or writing of information.

In order to increase the writing speed of information into the optical disk in such optical disk devices, it is necessary to increase the output power of the laser diode used therein.

Hereinafter, a brief review will be made on conventional red-wavelength laser diodes.

FIG. 1 shows the cross-sectional diagram of a conventional red-wavelength laser diode of an AlGaInP system disclosed in the Japanese Laid-Open Patent Publication 11-26880.

Referring to FIG. 1, a substrate 1 of n-type GaAs carries thereon a buffer layer 2 of n-type GaAs, a cladding layer 3 n-type AlGaInP, a quantum well active layer 4 including therein alternate and repetitive stacking of an AlGaInP layer and a GaInP layer, a cladding layer 5 of AlGaInP of low carrier concentration ($2$-$6 \times 10^{17}$ cm$^{-3}$), and an etching stopper layer 6 of p-type GaInP.

Further, there is provided a ridge structure 10 on a part of the etching stopper layer 6 wherein the ridge structure 10 includes a carrier-diffusion suppressing layer 7 of p-type AlGaInP, a cladding layer 8 of p-type AlGaInP, and a band-discontinuity relaxation layer 9 of p-type GaInP. Further, there are formed a pair of electric current blocking regions 11 of n-type GaAs on the surface part of the etching stopper layer 6 where the ridge structure 10 is not formed, and a contact layer 12 of p-type GaAs is formed continuously on the current blocking regions 11 and the band-discontinuity relaxation layer 9 therebetween. The contact layer 12 carries thereon a p-type electrode 13, and an n-type electrode 14 is formed on the bottom surface of the substrate 1.

In the laser diode of FIG. 1, there occurs a current confinement in the ridge structure 10 wherein the ridge structure 10 provides a current path between the current-blocking regions 11, and the electric current is confined into the ridge structure 10 thus formed of p-type GaAs. Further, it should be noted that the current-blocking regions 11 absorb the optical radiation from the quantum well active layer 4 and there is induced a refractive-index difference between the ridge structure 10 and the region outside, the ridge structure 10 as a result of such an optical absorption. Thereby, there occurs an optical confinement in the ridge structure 10.

Such a ridge structure 10, while being able to form so-called optical loss-guide structure in the laser diode, has a drawback in that it increases the threshold current of laser oscillation due to the optical absorption caused by the current-blocking regions 10.

FIG. 2 shows the cross-sectional structure of a red-wavelength laser diode disclosed in the Japanese Laid-Open Patent Publication 9-172222.

Referring to FIG. 2, the laser diode is constructed on a substrate 15 of n-type GaAs and includes a buffer layer 16 of n-type GaAs, a cladding layer 17 of n-type AlGaInP, an active layer 18 of GaInP, a cladding layer 19 of p-type AlGaInP and an intermediate layer 20 of p-type GaInP, wherein the layers 16-20 are formed on the substrate 15 consecutively by an epitaxial process.

In the intermediate layer 20, there are formed a pair of stripe grooves reaching the p-type cladding layer 19, and the stripe grooves thus formed define a stripe ridge 21 therebetween. Further, current-blocking regions 22 are formed by filling the stripe grooves with a layer of n-type AlGaAs, and the entire structure is covered by a cap layer 23 of p-type GaAs formed by an epitaxial process.

In the case of the laser diode of FIG. 2, the current-blocking regions 22 are formed of AlGaAs having a bandgap larger than a bandgap of the active layer 18. For example, the current-blocking regions 22 are formed to contain Al with a concentration of 39% in terms of atomic percent when the laser diode is designed to operate at the wavelength of 650 nm. In the case the laser diode is to be operated at the wavelength of 630 nm, the Al content in the current-blocking regions 22 should be 45% or more in terms of atomic percent. In such a case, the current-blocking regions 22 are transparent to the laser beam and the loss at the optical waveguide is minimized.

FIG. 3 shows the cross-sectional diagram of a red-wavelength laser diode disclosed in the Japanese Laid-Open Patent Publication 7-249838.

Referring to FIG. 3, the laser diode is constructed on a substrate 24 of GaAs and includes, on the substrate 24, a cladding layer 25 of n-type AlGaInP having a composition $(Al_{0.6}Ga_{0.4})_{0.5}In_{0.5}P$, an active layer 26 having a quantum well structure formed by an AlGaInP barrier layer and a GaInP quantum well layer, an inner cladding layer 27 of p-type AlGaInP having a composition of $(Al_{0.6}Ga_{0.4})_{0.5}In_{0.5}P$, an etching stopper layer 28 of p-type GaInP having a composition of $Ga_{0.5}In_{0.5}P$, an outer cladding layer 29 of p type AlGaInP having a composition (Al$_{0.6}$Ga$_{0.4}$)$_{0.5}$In$_{0.5}$P, a buffer layer 30 of p-type GaInP having a composition of Ga$_{0.5}$In$_{0.5}$P, and a cap layer 31 of p-type GaAs.

The laser diode is formed with a mesa structure by a wet etching process, wherein the wet etching process is conducted while using an SiN mask formed on the cap layer 31 with a width of 6 μm, until the etching stopper layer 28 is exposed. After the mesa structure is thus formed, a pair of current-blocking regions 32 of n-type AlInP and a pair of cap regions 33 of n-type GaAs are formed on the mesa surface. Thereby, the current-blocking regions 32 are grown so as to have a composition of Al0.5In0.5P on the part making contact with the mesa surface. After removing the SiN mask, a contact layer 34 of p-type GaAs is formed so as to cover the cap regions 33, the current-blocking regions 32 and the cap layer 31 on the mesa structure.

In the laser diode of FIG. 3, too, the problem of waveguide loss is avoided due to the large bandgap energy of AlInP used for the current-blocking regions 10. Further, the use of the AlInP current-blocking regions 32 is advantageous in view of the fact that AlInP has a smaller refractive-index as compared with the inner and outer cladding layers of p-type AlGaInP. Thereby, it should be noted that there is formed a real refractive-index difference between the region inside the ridge and the region outside the ridge, and a real refractive-index waveguide is formed in the laser diode.

In the laser diode of FIGS. 2 and 3, it should be noted that the current-blocking regions 22 or 32 contain an increased amount of Al for minimizing the optical absorption by the current-blocking regions. As noted already with reference to FIG. 2, the Al content in the current-blocking region 22 of AlGaAs has to be set to 39% or more in atomic percent when the laser diode is to be operated at the wavelength of 650 nm. In the case of the laser diode of FIG. 3, on the other hand, the current-blocking region 32 contains Al with an amount of 50% in terms of atomic percent in the vicinity of the mesa surface, while this value of Al concentration is larger than the Al concentration (35% in atomic percent) of the AlGaInP cladding layer typically used in an AlGaInP laser diode. When the Al content in a semiconductor layer is large as such, there tends to occur a problem of optical damaging at the edge surface of the laser optical cavity due to non-optical recombination of carriers. It should be noted that the increase of Al content tends to increase surface states, while the surface states tend to facilitate the non-optical recombination of carriers.

Thus it is an object of the present invention to provide a red-wavelength laser diode having a reduced optical waveguide loss and simultaneously a reduced optical damage at the edge surface of the optical cavity formed in the laser diode.

As noted already, the laser diode of the AlGaInP system is becoming an important target of investigation in relation to application to laser beam printers, optical disk drives and the like, due to the fact that the laser diode of this system can produce an optical beam with the wavelength range of about 600 μm.

In the application to the optical source of disk drives, it is required that the fundamental mode of laser oscillation is a horizontal lateral mode of single peak. Further, it is required that astigmatism is small.

Such a single fundamental mode laser oscillation with reduced astigmatism is realized by using a real refractive-index waveguide structure, and there is proposed a visible-wavelength laser diode structure based on an AlGaInP system as represented in FIG. 4.

Referring to FIG. 4, the laser diode is constructed on a substrate 42 of n-type GaAs and includes a cladding layer 43 of AlGaInP, an active layer 44 of GaInP, and a cladding layer 45 of AlGaInP, formed consecutively on the substrate 42.

After forming the cladding layer 45, a ridge stripe of an inverse-mesa structure is formed so as to extend axially, and high-resistance regions 46 of AlInP are formed at both lateral sides of the stripe structure by causing a selective growth process while using an SiO$_2$ mask on the stripe region. Further, a GaInP layer 48 and a p-type GaAs layer 49 are grown selectively and consecutively on the AlGaInP layer forming the stripe region while using an SiO$_2$ mask formed on the high-resistance regions 46. Further, n-type GaAs regions 47 are formed on the high-resistance regions 46 at both lateral sides of the central stripe region, and a p-type electrode of Cr/Au/Pt/Au structure is formed on the top surface of the p-type GaAs layer 49. Further, an n-type electrode 41 of AuGe/Ni is formed on the bottom surface of the substrate 42.

In such a structure, there is formed a real refractive-index waveguide structure in correspondence to the central ridge stripe. Generally, such a laser diode is fabricated such that the epitaxial layers constituting the laser structure achieves a lattice fitting with the GaAs substrate 42.

On the other hand, the Japanese Laid-Open Patent Publication 5-41560 describes a refractive-index waveguide laser diode that uses a double heterostructure of a mixed crystal of (AlGa)$_a$In$_{1-a}$P (0.51<a≦0.73) formed on a GaAs substrate, wherein the foregoing double heterostructure is formed with an intervening lattice misfit relaxation layer having a composition represented as GaP$_x$As$_{1-x}$.

FIG. 5 shows the relationship between the band edge energy and the lattice constant for various III-V crystals, wherein the continuous lines represent the band edge energy of the conduction band Ec and the valence band Ev of a GaInP mixed crystal while the broken lines represent the conduction band energy and valence band energy of an AlInP mixed crystal.

Referring to FIG. 5, it can be seen that a mixed crystal of the AlGaInP system can be used for the cladding layer and the active layer as long as the AlGaInP mixed crystal has a composition in which the lattice constant is smaller than that of GaAs. When the composition is chosen as such, the bandgap energy increases and the laser oscillation wavelength shifts in the shorter wavelength direction. Thus, the foregoing Japanese Laid-Open Patent Publication 5-41560 proposes a laser diode that can oscillate at the wavelength shorter than 600 nm, by choosing the composition of the AlGaInP mixed crystal constituting the laser diode.

On the other hand, the relationship of FIG. 5 also indicates the possibility of improvement of performance of the red-wavelength laser diode oscillating in the wavelength range of 600-660 nm, by using a mixed crystal of AlGaInP having a lattice constant between those of GaAs and GaP, for the cladding layer and the optical waveguide layer.

Further, laser diodes having a refractive-index waveguide structure with current-blocking regions of GaAs or AlInP are proposed. In such a refractive-index waveguide laser diode, it is also possible to use a mixed crystal of AlGaInP for the current-blocking regions. However, the use of a mixed crystal composition containing a large amount of Al such as AlInP causes a problem to be described later.

In order to fabricate such a real refractive-index waveguide laser diode, it is necessary to form a real refractive-index profile in a transverse direction of the active layer. Normally, this is achieved by forming a ridge-stripe structure or a groove-stripe during the fabrication process of the laser diode by an etching process and by forming a cladding layer or current-blocking regions of AlGaInP, and the like, by a regrowth process.

In the case of forming a layer of AlGaInP on a substrate of GaP, GaAs or $GaP_{0.4}As_{0.6}$ by an MOCVD process, there is a tendency of extensive formation of hillock structure on the surface of the AlGaInP layer thus grown when the AlGaInP layer is grown on the substrate having a (100) principal surface or when the offset angle of the substrate principal surface from the (100) surface is small. This tendency of hillock formation is enhanced when the mixed crystal layer thus grown contains a large amount of Al as in the case of an AlInP mixed crystal.

It is possible to suppress the hillock formation to some extent by using an offset substrate and by increasing the offset angle of the substrate. However, such suppressing of hillock formation by way of using an offset substrate tends to become difficult in the case of an AlGaInP mixed crystal containing a large amount of Al and Ga and hence having a lattice constant smaller than that of GaAs. Further, use of an offset GaAsP substrate having a large offset angle poses a problem of availability as compared with the case of using a readily available industrial standard GaAs substrate.

When such hillock structure exists extensively in the semiconductor layers constituting a laser diode or an LED, the device performance or the yield of device production may be degraded seriously. This problem appears particularly serious in the case of regrowing a mixed crystal containing Al. In such a case, realization of a sufficient crystal quality is extremely difficult due to the surface oxidation of the underlying layer.

In the case of the laser diode disclosed in the Japanese Laid-Open Patent Publication 5-41560, op. cit., it is believed that fabrication of a satisfactory laser diode device with high-quality crystal layers is difficult.

Thus, it is an object of the present invention to provide a laser diode operable in the wavelength range of 600-660 nm wherein the device performance is improved by improving the quality of the crystal constituting the current-blocking regions.

A material of the AlGaInP system is a direct-transition type III-V material having the largest bandgap energy except for a material of the AlGaInN system. The bandgap energy can reach as much as 2.3 eV (540 nm in bandgap wavelength).

Thus, efforts have been made with regard to optical semiconductor devices of the AlGaInN system to provide a high-luminosity, green to red optical source for use in various color display devices or a laser diode for use in laser printers, compact disk drives, DVDs for optical writing of information.

In the case of a laser diode, a material system achieving a lattice matching with a GaAs substrate has conventionally been used. It should be noted that a laser diode for high-density optical recording is required to produce a large optical output of short-wavelength in a high temperature environment.

In order to construct a laser diode, it is necessary to provide a structure for confining both carriers and optical radiation in an active layer or light-emitting layer by using a cladding layer. Thus, a cladding layer is required to have a bandgap larger than a bandgap of the active layer.

In this regard, the material in the system of AlGaInP has a drawback in that the band discontinuity $\Delta Ec$ on the conduction band tends to become smaller. In such a case, the injected carriers easily escape from the active layer into the cladding layer by causing an overflow. When such an overflow of carriers takes place, the threshold current of laser oscillation becomes sensitive with the operational temperature of the laser diode and the temperature characteristic of the laser diode is deteriorated.

In order to overcome the problem, the Japanese Laid-Open Patent Publication 4-114486 proposes a structure that uses an MQB (multiple quantum barrier) structure, in which a large number of extremely thin layers are stacked between the active layer and the cladding layer for carrier confinement. This structure, however, is complex, and it has been difficult to achieve the desired effect in view of the necessity of precision control of thickness of the layers to the degree of atomic layer level.

In an ordinary edge-emission type red-wavelength laser diode that uses a structure in which the active layer is sandwiched by a pair of optical guide layers having a composition represented as $(Al_xGa_{1-x})_{0.5}In_{0.5}P$, the desired optical confinement is realized in the optical guide layers of the composition $(Al_xGa_{1-x})_{0.5}In_{0.5}P$. On the other hand, the optical guide layers generally contain Al with a composition x of 0.5 or more, while such a high concentration of Al in the optical waveguide layer causes the problem of optical damaging at the optical cavity edge surface of the laser diode due to the recombination of carriers facilitated by Al. Thus, there has been a difficulty in obtaining a high optical output power or realizing a stable operation of the laser diode over a long period of time.

Summarizing above, conventional laser diodes constructed on a GaAs substrate with lattice matching therewith have a problem in operation under high temperature environment, or high-output operation, or operation over a long period of time. For example, it has been difficult to realize a red-wavelength laser diode operable under a high temperature environment such as 80° C. with high output power such as 70 mW or more, over a long period of time such as ten thousand hours. The difficulty increases with decreasing output wavelength of the laser diode.

The material of the system of AlGaInP having a lattice constant smaller than the lattice constant of GaAs is characterized by a wide bandgap and is suitable for decreasing the output wavelength of the laser diode or light-emitting diode. Thus, there is a proposal in the Japanese Laid-Open Patent Publication 8-18101 with regard to a light-emitting diode (LED) using the foregoing material system as well as other material systems. Further, there are proposals of a short wavelength laser diode oscillating at a wavelength of 600 nm or less. For example, the Japanese Laid-Open Patent Publication 5-41560 proposes a laser diode in which a double heterostructure having a composition of $(AlGa)_aIn_{1-a}P$ ($0.51<a\leq0.73$) and a lattice constant intermediate between GaAs and GaP is provided on a GaAs substrate with an intervening buffer layer of $GaP_xAs_{1-x}$ having a composition adjusted so as to achieve a lattice matching with the foregoing double heterostructure. In the foregoing proposal, the problem of lattice misfit is resolved by interposing the buffer layer between the substrate and the double heterostructure.

FIG. 6 shows the relationship between the bandgap energy and the lattice constant for various III-V materials.

Referring to FIG. 6, the continuous lines represent the composition causing a direct-transition, while the broken lines represent the composition causing an indirect-transition. It should be noted that the material of the foregoing composition $(AlGa)_aIn_{1-a}P$ ($0.51<a\leq0.73$) having the lattice constant between GaAs and GaP falls in the region defined by the composition of AlInP and the composition of GaInP. By using the material system of AlGaInP having a bandgap larger than the bandgap of the material achieving a lattice matching with a GaAs substrate for the active layer and the cladding layers, it is possible to reduce the oscillation wavelength of the laser diode to be smaller than 600 nm.

FIG. 7 shows the construction of a laser diode having a refractive-index waveguide disclosed in the Japanese Laid-Open Patent Publication 5-41560, wherein the laser diode has a lattice constant between GaAs and GaP.

Referring to FIG. 7, the laser diode is constructed on a substrate 51 of n-type GaAs and includes a graded layer 52 of n-type GaPAs formed on the substrate 51, and a superlattice layer 53 of n-type $Ga_{0.7}In_{0.3}P/(Al_{0.7}Ga_{0.3})_{0.7}In_{0.3}P$ formed on the graded layer 52, wherein the substrate 51, the graded layer 52 and the superlattice layer 53 form together a GaPAs semiconductor substrate 54. The GaPAs semiconductor substrate 54 thus formed carries thereon consecutively an optical waveguide layer 55 of n-type AlGaInP having a composition of $(Al_{0.7}Ga_{0.3})_{0.7}In_{0.3}P$, an active layer 56 of undoped GaInP having a composition of $Ga_{0.7}In_{0.3}P$, and an optical waveguide layer 57 of p-type AlGaInP having a composition of $(Al_{0.7}Ga_{0.3})_{0.7}In_{0.3}P$, and a first buffer layer 58 of p-type GaInP having a composition of $Ga_{0.7}In_{0.3}P$ is provided further on the optical waveguide layer 57.

The first buffer layer 58 and the underlying optical waveguide layer 57 are then subjected to a mesa etching process to form a ridge stripe structure, wherein the mesa etching process is conducted such that the optical waveguide layer 57 is left with a thickness of 0.2-0.4 μm outside the ridge stripe structure.

At both lateral sides of the ridge stripe structure, a pair of current-blocking regions 59 of n-type GaInP having a composition of $Ga_{0.7}In_{0.3}P$ are formed by a regrowth process, wherein the current-blocking regions 59 function also as an optical absorption region. Further, a contact layer 60 of p-type GaInP having a composition of $Ga_{0.7}In_{0.3}P$ is formed on the current-blocking regions 59 including the ridge stripe region formed therebetween, by a regrowth process. Further, p-type electrode 62 and an n-type electrode 61 are formed respectively on the top surface of the contact layer 60 and on the bottom surface of the GaAs substrate 51.

In the foregoing laser diode that uses a material system having a lattice constant between GaP and GaAs, it is necessary to carry out three regrowth process steps, one for growing the GaInP buffer layer 58, one for growing the current-blocking regions 59, and one for growing the contact layer 60. Thereby, the fabrication process of the laser diode is complex and the yield of production tends to be reduced.

In order to facilitate the fabrication of a ridge-waveguide laser diode, there is also a proposal in the Japanese Laid-Open Patent Publication 10-4239, to form the current-blocking regions by way of oxidation of an AlGaAs mixed crystal having a composition represented as $Al_xGa_{1-x}As$ ($0.8<x\leqq1$). According to the foregoing proposal, the ridge structure is formed to have a width of 4 μm at the bottom part thereof, and there is provided a current path region as a non-oxidized part of the AlGaAs region of the foregoing composition of $Al_xGa_{1-x}As$ ($0.8<x\leqq1$), with a width of 3 μm.

According to the foregoing proposal, it is possible to form a laser diode having the current-blocking structure in a single crystal growth process.

On the other hand, the laser diode of the foregoing prior art has a drawback, in view of the difference in the lattice constant between the material system having a lattice constant between GaAs and GaP and the foregoing AlGaAs mixed crystal of the composition $Al_xGa_{1-x}As$ ($0.8<x\leqq1$), which achieves a lattice matching with the GaAs substrate, in that the thickness of the AlGaAs mixed crystal layer of the composition $Al_xGa_{1-x}As$ ($0.8<x\leqq1$) is inevitably limited when the AlGaAs mixed crystal layer is to be provided in the material system having a lattice constant between GaAs and GaP. Further, in view of the fact that the current path region of the not-oxidized $Al_xGa_{1-x}As$ ($0.8<x\leqq1$) mixed crystal layer extends such that the edge of the current path region is located near the edge of the ridge structure, there appears a substantial optical waveguide loss and increase of optical output power is difficult.

Thus, the present invention has an object to provide a semiconductor light-emitting device formed of a semiconductor material having a lattice constant between GaP and GaAs wherein the fabrication process is simplified. Further, the present invention has an object to provide a semiconductor light-emitting device formed of a semiconductor material having a lattice constant between GaP and GaAs wherein the optical waveguide loss is minimized and suitable for increasing output optical power.

Meanwhile, vertical-cavity laser diodes, which emit optical beam in a direction perpendicular to a substrate surface, draw attention in relation to application of red-wavelength optical source in the wavelength range of 630-650 nm for use in high-density optical disk drives and laser printers, in view of the fact that a vertical-cavity laser diode provides various advantageous features such as high-efficiency of laser oscillation, excellent beam property, excellent vertical mode property, and the like. Further, the vertical-cavity laser diodes are suitable for constructing a two dimensional array, and thus, there are possibility of application to the art of optical interconnection or optical array for laser beam printers.

In view of the limited length of optical cavity, a vertical-cavity laser diode requires to provide a large reflectance. Because of this reason, a distributed Bragg reflector (DBR) is generally used as the mirror of the vertical optical cavity. By using a DBR, it is possible to achieve a near 100% reflectance. A DBR is, formed by stacking two semiconductor layers or dielectric layers having mutually different refractive index alternately and repeatedly with an optical distance corresponding to a quarter of the oscillation wavelength.

When the difference of refractive index between the two semiconductor layers constituting a DBR is large, a high reflectance is achieved with a reduced number of repetition. In order to avoid optical absorption and to increase the efficiency of laser oscillation, the semiconductor layers constituting the DBR are required to be transparent to the laser oscillation wavelength.

In the case of a vertical-cavity laser diode using the material of an AlGaInP system and oscillating at the wavelength of 630-650 nm, an active layer of GaInP is formed on a GaAs substrate, and a DBR is formed of high refractive layers of AlGaInP and low refractive layers of AlInP.

In view of the tendency of increase of bandgap and decrease of refractive index with increasing Al content in a semiconductor layer containing Al, it is desirable to construct a DBR by stacking AlInP layers and GaInP layers. Unfortunately, a GaInP layer is not transparent to the optical radiation in the wavelength range of 630-650 nm. Thus, there occurs a problem of optical absorption and degradation of optical cavity efficiency.

FIG. 8 shows the relationship between the lattice constant and bandgap for the GaInP and AlInP mixed crystals, wherein FIG. 8 shows the Γ valley energy and the X valley energy of the conduction band and further the band edge energy of the valence band. As can be seen from FIG. 8, the bandgap energy increases with decreasing lattice constant in the foregoing material system.

In the invention disclosed in the Japanese Laid-Open Patent Publication 9-199793, a DBR is constructed by combining an AlInP/GaInP layered structure formed on a GaAs substrate with a lattice constant smaller than the lattice constant of the substrate and an AlGaAs/GaAs layered structure, for reducing the optical loss caused by the DBR. According to the foregoing prior art, a first DBR structure of the AlGaAs/GaAs layered structure is formed on the GaAs semiconductor substrate and a second DBR structure of the GaInP/AlInP is formed thereon, with a graded layer interposed between the first and second DBR structures for relaxing the lattice misfit. On the DBR thus formed, a first graded cladding layer, a GaInP active layer and a second graded cladding layer are formed such that the composition grading is symmetric between the first and second graded cladding layers. Further, a further DBR structure is formed on the second cladding layer.

The invention disclosed in the foregoing Japanese Laid-Open Patent Publication 9-199793 is designed so as to minimize the optical absorption in the visible wavelength region and to improve the optical cavity efficiency. The two different material systems are used for constructing a DBR to eliminate the problem of lattice misfit of the AlGaInP mixed crystal and for avoiding the difficulty of growing a high quality AlGaInP mixed crystal layer. The difficulty of growing an AlGaInP layer will be explained later. Thus, the foregoing prior art uses the material system of AlGaInP for the DBR structure in the vicinity of the active layer where the intensity of optical radiation is large and uses the material system of AlGaAs for the DBR structure in the part away from the active layer in order to avoid the problem of degradation of the crystal quality associated with the increase of the number of stacks.

Further, there is another prior art vertical-cavity laser diode disclosed in the Japanese Laid-Open Patent Publication 10-200202 wherein the vertical-cavity laser diode of this prior art is constructed on a GaINP substrate.

According to this prior art, a substrate of GaInP having a composition of $Ga_{0.75}In_{0.25}P$ is used and a DBR of the AlInP/GaInP is formed thereon with lattice matching. On the DBR thus formed, an active layer of GaInP is formed. According to this prior art, the problem of degradation of the crystal quality associated with lattice misfit is improved.

In the case of the forgoing prior art device of the Japanese Laid-Open Patent Publication 9-199793, it should be noted a plurality of DBR structures having different lattice constants are provided in a single laser diode device for changing the lattice constant. Further, in view of the fact that the DBR structure that causes a lattice misfit with the substrate has a large thickness, the use of the lattice misfit relaxation layer is not effective for improving the crystal quality. It should be noted that the DBR structure that causes a lattice misfit with the substrate contains at least 20 pairs of layers (40 layers or more) therein.

In the case of the laser diode disclosed in the Japanese Laid-Open Patent Publication 200202, a lattice matching is successfully achieved with respect to the GaInP layer transparent to the optical radiation in the wavelength range of 635-650 nm by choosing the lattice constant of the substrate to be smaller than the lattice constant of GaAs. On the other hand, the laser diode of the foregoing prior art has a drawback in that increase of Al or Ga content in the AlInP or GaInP material system facilitates hillock formation. Particularly, increase of Al content causes an extensive hillock formation and causes a serious problem in the AlInP material. There is no fundamental solution to this problem of hillock formation. When such defects are formed, the homogeneity of the heteroepitaxial interface is degraded substantially, and the optical scattering associated with such a poor quality interface increases the optical loss. Thereby, the optical cavity efficiency is deteriorated.

Further, the invention disclosed in the foregoing Japanese Laid-Open Patent Publication 10-200202 has a drawback, associated with the use of the GaInP active layer, in that there is a limitation imposed over the lattice constant when the laser diode is to be operated in the wavelength range of 630-650 nm.

More specifically, the wavelength of the GaInP mixed crystal that achieves lattice matching with GaAs is about 650 nm, and the wavelength becomes shorter when a GaInP mixed crystal having a lattice constant smaller than that of GaAs is used for the active layer. In order to achieve the foregoing desired wavelength range, it is therefore necessary to reduce the Ga content so as to increase the oscillation wavelength of the laser diode. However, such a decrease of the Ga content causes a compressive strain in the active layer and the quality of the crystal of the active layer is deteriorated. Thus, the lattice constant of the active layer is practically limited to the range close to the lattice constant of GaAs and the degree of freedom in designing the laser oscillation wavelength is limited.

On the other hand, the foregoing construction of the Japanese Laid-Open Patent Publication provides a possibility of increasing the degree of freedom in the laser diode design associated with the deviation of lattice constant from the lattice constant of GaAs, such as increased degree of freedom in selecting the material for various parts of the laser diode. It should be noted that the laser diode of the foregoing Japanese Laid-Open Patent Publication 10-200202 merely focuses on the problem of the optical absorption of the DBR, and no further proposals are made with regard to the improvement of other aspects of the laser diode.

There are further rooms for improvement in the vertical-cavity laser diode having a lattice constant between GaAs and GaP.

Thus, the present invention provides a vertical-cavity laser diode operable in the wavelength range of 630-660 nm and various optical systems using such a vertical-cavity laser diode.

SUMMARY OF THE INVENTION

Accordingly, it is a general object of the present invention to provide a novel and useful laser diode, a vertical-cavity laser diode and an optical semiconductor device wherein the foregoing problems are eliminated.

Another and more specific object of the present invention is to provide a red-wavelength laser diode having a reduced optical waveguide loss and simultaneously a reduced optical damage at an edge surface of an optical cavity formed in the laser diode.

Another object of the present invention is to provide a laser diode, comprising:

a substrate of a first conductivity type, said substrate having a lattice constant of GaAs or a lattice constant between GaAs and GaP;

a first cladding layer of AlGaInP having said first conductivity type formed over said substrate;

an active layer of GaInAsP formed over said first cladding layer;

an etching stopper layer of GaInP formed over said active layer;

a pair of current-blocking regions of AlGaInP formed over said etching stopper layer, said pair of current-blocking regions defining therebetween a strip region;

an optical waveguide layer of AlGaInP formed over said pair of current-blocking regions so as to include said stripe regions, said optical waveguide layer covering said etching stopper layer in said stripe region; and a second cladding layer of AlGaInP of a second conductivity type formed over said optical waveguide layer;

said current-blocking regions having an Al content substantially identical with an Al content of said second cladding layer.

According to the present invention, the real refractive-index increases in correspondence to the strip region where the optical waveguide layer of AlGaInP is formed, and the laser diode has a real refractive-index waveguide structure characterized by a low optical loss. Due to the fact that the current-blocking regions outside the stripe region are formed of AlGaInP characterized by a large bandgap, the optical loss caused by such current-blocking regions is successfully minimized. In view of the fact that the AlGaInP current-blocking regions contain Al with a concentration substantially identical with the second cladding layer, which is also formed of AlGaInP, there is no increase of Al content in these parts of the laser diode. Thereby, the problem of damaging at the edge surface of the laser optical cavity caused by non-optical recombination of carriers, is successfully minimized.

Another object of the present invention is to provide a laser diode, comprising:

a substrate having a lattice constant between GaAs and GaP, said substrate having a first conductivity type;

a first cladding layer of AlGaInP having said first conductivity type formed over said substrate;

a lower optical waveguide layer of GaInP formed over said first cladding layer;

an active layer of GaInAsP formed over said lower optical waveguide layer;

a first upper optical waveguide layer of GaInP formed over said active layer;

a pair of current-blocking regions of AlGaInP formed over said first upper optical waveguide layer, said pair of current-blocking regions defining therebetween a stripe region;

a second upper optical waveguide layer of GaInP formed over said pair of current-blocking regions so as to include said stripe regions, said second upper optical waveguide layer covering said first upper optical waveguide layer in said stripe region; and a second cladding layer of AlGaInP having a second conductivity type formed over said second upper optical waveguide layer;

said current-blocking regions having an Al content generally identical with an Al content of said second cladding layer.

According to the present invention, the laser diode has an SCH structure in which the active layer is sandwiched vertically by the lower optical waveguide layer and the first upper optical waveguide layer both free from Al. Thereby, the problem of optical damaging at the edge surface of the laser optical cavity is successfully avoided.

Another object of the present invention is to provide a laser diode, comprising:

a substrate having a lattice constant between GaAs and GaP, said substrate having a first conductivity type;

a first cladding layer of AlGaInP having said first conductivity type formed over said substrate;

a lower optical waveguide layer of GaInP formed over said first cladding layer;

an active layer of GaInAsP formed over said lower optical waveguide layer;

a first upper optical waveguide layer formed over said active layer;

a pair of current-blocking regions of AlGaInP formed over said first upper optical waveguide layer, said pair of current-blocking regions defining therebetween a stripe region;

a second upper optical waveguide layer of GaInP formed over said pair of current-blocking regions so as to include said stripe regions, said second upper optical waveguide layer covering said first upper optical waveguide layer in said stripe region; and a second cladding layer of AlGaInP having a second conductivity type formed over said second upper optical waveguide layer;

said current-blocking regions having an Al content generally identical with an Al content of said second cladding layer, said first upper optical waveguide layer of GaInP and said second upper optical waveguide layer of GaInP having respective thicknesses such that a sum of said thickness of said first upper optical waveguide layer and said thickness of said second upper optical waveguide layer is equal to a thickness of said lower optical waveguide layer of GaInP.

According to the present invention, the vertical distribution profile of refractive-index becomes substantially symmetric about the active layer due the fact that the first and second upper optical waveguide layers of GaInP have the total thickness generally identical with the thickness of the lower optical waveguide layer of GaInP. Thereby, the optical radiation produced by the laser diode is effectively confined at the central part of the laser structure and the threshold of laser oscillation can be reduced.

Another object of the present invention is to provide a laser diode operable in the wavelength range of 600-660 nm wherein the device performance is improved by improving the quality of the crystal constituting the current-blocking regions.

Another object of the present invention is to provide a laser diode, comprising:

a substrate having a first conductivity type;

a first cladding layer of said first conductivity type provided over said substrate, said first cladding layer having a lattice constant between GaAs and GaP;

an active layer formed over said first cladding layer;

a second cladding layer of a second conductivity type provided over said active layer, said second cladding layer having said lattice constant;

a ridge-stripe region formed in said second cladding layer; and a pair of current-blocking regions of said first conductivity type respectively provided over said second cladding layer at both lateral sides of said ridge-stripe region;

each of said current-blocking regions having a composition represented as $(Al_{x1}Ga_{1-x1})_{y1}In_{1-y1}As_{z1}P_{1-z1}$ ($0 \leq x_1 \leq 1$, $0 \leq y_1 \leq 1$, $0.01 \leq z_1 \leq 1$).

Another object of the present invention is to provide a laser diode, comprising:

a substrate having a first conductivity type;

a first cladding layer of said first conductivity type provided over said substrate, said first cladding layer having a lattice constant between GaAs and GaP;

an active layer formed over said first cladding layer;

a second cladding layer of a second conductivity type provided over said active layer, said second cladding layer having said lattice constant;

a current-blocking layer of said first conductivity type respectively provided over said second cladding layer;

a stripe depression formed in said current-blocking layer; and a third cladding layer of said second conductivity type formed over said current-blocking layer so as to include said stripe depression, said current-blocking layer having a composition represented as $(Al_{x2}Ga_{1-x2})_{y2}In_{1-y2}As_{z2}P_{1-z2}$ ($0 \leq x_2 \leq 1$, $0 \leq y_2 \leq 1$, $0.01 \leq z_2 \leq 1$).

According to the present invention, the hillock formation is successfully suppressed by incorporating As into said current-blocking regions or current-blocking layer.

It should be noted that the inventor of the present invention has discovered that the hillock formation is successfully suppressed by incorporating As when growing an AlGaInP mixed crystal layer. It is also discovered that the hillock formation can be reduced by suitably choosing the condition of growth of the AlGaInP mixed crystal layer such as increasing growth temperature from 700° C. to 750° C. However, the optimization of the growth condition was not sufficient for decreasing the hillock formation to the desired level of hillock density. By adding As, on the other hand, a remarkable decrease was observed for the hillock density, even in such a case the growth is conducted at the temperature of 700° C. It is believed that As atoms thus incorporated successfully suppressed the droplet formation of Al or Ga during the process of growing the AlGaInP layer.

It was further observed that the suppression of hillock formation by As is effective even in such a case in which the amount of the As atoms incorporated is very small. Naturally, the effect of suppressing hillock formation increases with increasing amount of As in the AlGaInP layer.

It should be noted that the foregoing suppression of hillock formation during the growth process of an AlGaInP mixed crystal layer by way of incorporating As is particularly effective when a substrate having a small offset angle, such as a commercially available GaAsP substrate, is used.

Thus, the laser diode of the present invention has an improved reliability and lifetime as a result of use of an AlGaInAsP mixed crystal containing As for the current-blocking regions or for the current-blocking layer. By using the AlGaInAsP mixed crystal for the current-blocking regions or the, current-blocking layer, the flatness and crystal quality of the device surface are improved. Further, the use of the AlGaInAsP mixed crystal is effective for reducing the leakage current path which is formed inside the laser diode as a result of the hillock formation. Further, the decrease of the hillock density reduces the optical scattering in the current-blocking regions and the waveguide loss of the laser diode is reduced accordingly. Thereby, the threshold current of laser oscillation is reduced.

By using a material transparent to the laser beam produced by the laser diode, in other words by using a material having a bandgap larger than a bandgap of the active layer, for the current-blocking regions or layer, the optical absorption outside the current path region of the laser diode is reduced. Thereby, the threshold current of laser oscillation is reduced and the efficiency of laser oscillation is improved. Further, in view of the fact that the AlGaInAsP current-blocking regions or layer, containing a large amount of Al, forms a real refractive-index waveguide structure with the second cladding layer. It should be noted that the current-blocking regions have a smaller refractive-index as compared with the second cladding layer. Thereby, the optical radiation is effectively confined in the stripe region of the laser diode, and the lateral mode of laser oscillation is stabilized. Associated with this, the astigmatism of the laser diode is reduced.

Further, by providing a GaInAsP layer in the second cladding layer or on the current-blocking layer of AlGaInAsP, the GaInAsP layer functions as an etching stopper layer with respect to the etching process applied to the second cladding layer or the current-blocking layer, and the process of forming the stripe ridge structure in the second cladding layer or the process of forming the stripe groove structure in the current-blocking layer as a result of a wet etching process, is facilitated substantially. As a result of use of the GaInAsP etching stopper layer, the height of the stripe ridge structure or the depth of the stripe groove structure is controlled exactly. Further, the use of the GaInAsP etching stopper layer protects the surface of the second cladding layer or the current-blocking layer from being exposed to the air after the etching process, and the problem of surface oxidation of Al in the second cladding layer or in the current-blocking layer is successfully avoided. It should be noted that a GaAsP composition acts as an effective etching stopper against an etching process applied to an AlGaInAsP layer by a hydrochloric acid etchant, while a GaInP composition acts as an effective etching stopper against an etching process applied to an AlGaInAsP layer by a phosphoric or sulfuric acid etchant.

Further, the use of the optical waveguide layer of GaInP adjacent to the active layer eliminates the direct contact of the active layer and the cladding layer that contains Al, and the problem of damaging of the laser cavity edge surface caused by Al is effectively eliminated. Thereby, it becomes possible to operate the laser diode with a high output power.

Another object of the present invention is to provide a semiconductor light-emitting device formed of a semiconductor material having a lattice constant between GaP and GaAs wherein the fabrication process is simplified.

Another object of the present invention is to provide a semiconductor light-emitting device formed of a semiconductor material having a lattice constant between GaP and GaAs wherein the optical waveguide loss is minimized and suitable for increasing output optical power.

Another object of the present invention is to provide a semiconductor light-emitting device, comprising:

a semiconductor substrate;

an active layer provided over said semiconductor substrate, said active layer emitting optical radiation;

a semiconductor layer vertically sandwiching said active layer with another semiconductor layer, said semiconductor layer having a bandgap larger than a bandgap of said active layer and a lattice constant between GaP and GaAs, said semiconductor layer containing a to-be-oxidized layer in a part thereof with a composition represented as $Al_xGa_y In_{1-x-y}P_tAs_{1-t}$ ($0.8 \leq x \leq 1$, $0 \leq y \leq 0.2$, $0 \leq t \leq 1$), a part of said to be-oxidized layer being oxidized to form a selective oxidation region.

According to the present invention, the selective oxidation region forms a current-blocking structure for confining an injected electric current. In view of the fact that the selective oxidation region thus formed has a reduced refractive index, there appears a difference in the real refractive index between the part of the AlGaInPAs to-be-oxidized layer where the oxidized region is formed and the current path region where no such oxidized region is formed. In other words, the current-blocking structure thus formed by the selective oxidation of the AlGaInPAs layer functions also as the real refractive index waveguide structure effective for lateral mode control. As the real refractive index waveguide structure thus formed contains, in the vicinity of the active layer, only the material which is free from waveguide less for all the wavelengths, the laser diode is easily operated to produce a large output optical power.

It should be noted that the foregoing advantageous structure can be formed by a single crystal growth process.

Thereby, the semiconductor light-emitting device of the present invention can be fabricated easily with high yield.

Another object of the present invention is to provide a semiconductor light-emitting device, comprising:

a semiconductor substrate;

an active layer provided over said semiconductor substrate, said active layer producing optical radiation; and a pair of cladding layers sandwiching said active layer vertically, said active layer being one of a single quantum well structure containing therein a quantum well layer and a multiple quantum well structure containing therein a quantum well layer and a barrier layer, said quantum well layer comprising a mixed crystal of AlGaInPAs having a composition represented as $(Al_{x1}Ga_{1-x1})_{\alpha1}In_{1-\alpha1}P_{t1}As_{1-t1}$ $(0 \leq x_1 < 1, 0 < \alpha_1 \leq 1, 0 \leq t_1 \leq 1)$, said barrier layer comprising a mixed crystal of AlGaInPAs having a composition represented as $(Al_{x2}Ga_{1-x2})_{\alpha2}In_{1-\alpha2}P_{t2}As_{1-t2}$ $(0 \leq x_2 < 1, 0.5 < \alpha_2 < 1, 0 \leq t_2 \leq 1)$, each of said cladding layers comprising a mixed crystal of AlGaInPAs containing Al and having a composition represented as $(Al_yGa_{1-y})_\beta In_{1-\beta}P_vAs_{1-v}$ $(0 < y \leq 1, 0.5 < \beta < 1, 0 < v \leq 1)$, each of said cladding layers having a lattice constant between GaP and GaAs and a bandgap larger than a bandgap of said active layer, an optical waveguide layer of AlGaInPAs interposed between said active layer and each of said cladding layers, said optical waveguide layer having a bandgap larger than the bandgap of said active layer but smaller than the bandgap of said cladding layer, said optical waveguide layer having a composition represented as $(Al_zGa_{1-z})_\gamma In_{1-\gamma}P_uAs_{1-u}$ $(0 \leq z < 1, 0.5 < \gamma < 1, 0 < u \leq 1)$, a to-be-oxidized layer provided in at least one of said cladding layers such that said cladding layer contains said to-be-oxidized layer in correspondence to a part thereof, or between said active layer and one of said cladding layers, said to-be-oxidized layer having a composition represented as $Al_xGa_yIn_{1-x-y}P_tAs_{1-t}$ $(0.8 \leq x \leq 1, 0 \leq y \leq 0.2, 0 \leq t \leq 1)$, a part of said to-be-oxidized layer being selectively oxidized to form a selective oxidized region.

According to the present invention, it is possible to oscillate the laser diode in the visible wavelength band in view of the fact that the active layer is formed of a mixed crystal of AlGaInPAs having a composition represented as $(Al_{x1}Ga_{1-x1})_{\alpha1}In_{1-\alpha1}P_{t1}AS_{1-t1}$ $(0 \leq x_1 < 1, 0 < \alpha_1 \leq 1, 0 \leq t_1 \leq 1)$. In view of the fact that a mixed crystal of AlGaInPAs containing Al with a composition represented as $(Al_yGa_{1-y})_\beta In_{1-\beta}P_vAs_{1-v}$ $(0 < y \leq 1, 0.5 < \beta < 1, 0 < v \leq 1)$ and having a lattice constant between GaP and GaAs is used for the cladding layer, the bandgap of the cladding layer is increased as compared with the case of using a cladding layer having a lattice matching composition to the GaAs substrate, and the wavelength of the output optical radiation of the semiconductor light-emitting device is reduced.

Further, in view of the fact that the semiconductor light-emitting device of the present invention employs the an SCH structure in which the mixed crystal of $(Al_{x1}Ga_{1-x1})_{\alpha1}In_{1-\alpha1}P_{t1}As_{1-t1}$ $(0 \leq x_1 < 1, 0 < \alpha_1 \leq 1, 0 \leq t_1 \leq 1)$ is used for the quantum well layer forming the active layer and in which the mixed crystal of $(Al_zGa_{1-z})_\gamma In_{1-\gamma}P_uAs_{1-u}$ $(0 \leq z < 1, 0.5 < \gamma < 1, 0 < u \leq 1)$ is used for the optical waveguide layer, a wide bandgap can be realized with a reduced Al content as compared with the case of using a material forming a lattice matching with a GaAs substrate, and the non-optical recombination of carriers is reduced substantially. Associated with this, the efficiency of optical emission is improved. In the case of a laser diode, the problem of damaging of optical cavity edge surface as a result of the non-optical recombination of carries is reduced and the laser diode can be operated stably and reliably with high optical output power.

Further, it is possible to induce a strain in the semiconductor light-emitting device of the present invention with respect to the cladding layer. In this case, bandgap of the active layer can be reduced. Further, a large conduction band discontinuity can be realized in the semiconductor light-emitting device of the present invention by reducing the Al content in the optical waveguide layer. Thereby, the problem, pertinent to a conventional red-wavelength laser diode of the AlGaInP system, of carrier overflow taking place on the conduction band, is reduced substantially.

By interposing the to-be-oxidized layer in a part of one or both of the two cladding layers or at the interface between the active layer and one of the cladding layers with the composition of $Al_xGa_yIn_{1-x-y}P_tAs_{1-t}$ $(0.8 \leq x \leq 1, 0 \leq y \leq 0.2, 0 \leq t \leq 1)$, followed by an oxidizing process oxidizing a part of the to-be-oxidized layer, it is possible to form a current-blocking region by the oxidized region thus formed selectively in the to-be-oxidized layer. As the oxidized region thus formed has a reduced refractive index, there is also formed a real refractive index waveguide structure by the part of the to-be-oxidized region where the selective oxidation has occurred and by the part where no such a selective oxidation has occurred. Thereby the lateral mode control becomes possible in the semiconductor light-emitting device. The real refractive index waveguide structure thus formed contains, in the vicinity of the active layer, only the material which is free from waveguide less for all the wavelengths, the laser diode is easily operated to produce a large output optical power.

It should be noted that the foregoing advantageous structure can be formed by a single crystal growth process. Thereby, the semiconductor light-emitting device of the present invention can be, fabricated easily with high yield.

Another object of the present invention is to provide a semiconductor light-emitting device, comprising:

a GaAs substrate;

an active layer provided over said GaAs substrate, said active layer emitting an optical radiation;

a pair of semiconductor layers sandwiching said active layer vertically, said semiconductor layer containing a to-be-oxidized layer in a part thereof with a composition represented as $Al_xGa_yIn_{1-x-y}P_tAs_{1-t}$ $(0.8 \leq x \leq 1, 0 \leq y \leq 0.2, 0 \leq t \leq 1)$ and containing P, a part of said to be-oxidized layer being oxidized to form a selective oxidation region.

According to the present invention, it is possible to achieve a lattice matching for the to-be-oxidized layer with respect to the GaAs substrate by introducing P therein. Thereby, the adversary effect of strain caused in the to-be-oxidized layer is effectively eliminated.

Another object of the present invention is to provide a semiconductor light-emitting device, comprising:

a GaAs substrate;

an active layer of an AlGaInP system formed over said GaAs substrate, said active layer emitting optical radiation;

a pair of semiconductor layers sandwiching said active layer vertically, each of said semiconductor layers having a bandgap larger than a bandgap of said active layer, said semiconductor layers including, in a part thereof, a layer of AlGaInAs having a composition represented as $Al_xGa_yIn_{1-x-y}As$ $(0.8 \leq x \leq 1, 0 \leq y \leq 0.2)$, a part of said semiconductor layer being oxidized to form a pair of oxidized regions, with a not-oxidized region formed therebetween with a width w1, a total width of said pair of oxidized regions being defined as w2, wherein said width w1 is set such that a ratio of said width w1 with respect to a sum of said width w1 and said width w2, defined as w1/(w1+w2) is smaller than 0.6.

According to the present invention, the waveguide loss caused by the variation of the edge width is successfully eliminated by setting the foregoing width to be smaller than 0.6.

Another object of the present invention is to provide a semiconductor light-emitting device, comprising:

a GaAs substrate;

an active layer provided over said GaAs substrate, said active layer emitting optical radiation; and a pair of semiconductor layers sandwiching said active layer vertically, each of said semiconductor layers having a bandgap larger than a bandgap of said active layer, said semiconductor layers including, in a part thereof, a layer of AlGaInAs having a composition represented as $Al_xGa_yIn_{1-x-y}As$ ($0.8 \leq x \leq 1$, $0 \leq y \leq 0.2$), a part of said semiconductor layer being oxidized to form an oxidized region, a ridge structure being formed in a part of said semiconductor layer located at least above said layer of AlGaInAs, said ridge structure having a ridge width exceeding 10 μm.

According to the present invention, a large contact area for electrode is secured by setting the ridge width to be larger than 10 μm and the differential resistance during the device operation is reduced. Further, the structure is suitable for a flip-chip mounting in which the heat of the active region is efficiently dissipated to a supporting substrate via the electrode.

Another object of the present Invention is to provide a vertical-cavity laser diode operable in the wavelength range of 630-660 nm and various optical systems using such a vertical-cavity laser diode.

Another object of the present invention is to provide a vertical-cavity laser diode, comprising:

a substrate;

an active layer provided over said substrate, said active layer emitting optical radiation; and a distributed Bragg reflector provided over said substrate in an optical path of said optical radiation emitted from said active layer in a direction perpendicularly to a plane of said active layer, said distributed Bragg reflector comprising a plurality of layers stacked over said substrate, said distributed Bragg reflector having a lattice constant between GaAs and GaP and including at least two semiconductor layers of respective, mutually different compositions, at least one of said semiconductor layers having a composition represented as $(Al_{x1}Ga_{1-x1})_{y1}In_{1-y1}As_{z1}P_{1-z1}$ ($0 \leq x_1 \leq 1$, $0.5 \leq y_1 \leq 1$, $0 < z_1 < 1$).

According to the present invention, the distributed Bragg reflector (DBR) is formed of an AlInAsP mixed crystal containing therein As. Thereby, the hillock formation on the surface of the layers constituting the DBR is substantially completely suppressed. Thereby, the problem of optical loss associated with the hillocks formed in the DBR is eliminated and the reflectance of the DBR is improved remarkably. With the improvement in the reflectance of the DBR, the oscillation threshold of the laser diode is improved and the device performance and device lifetime are improved also. The improvement becomes appreciable when As is added with a concentration of about 1%.

Another object of the present invention is to provide a vertical-cavity laser diode, comprising:

a substrate;

an active layer provided over said substrate, said active layer emitting optical radiation; and a distributed Bragg reflector provided over said substrate in an optical path of said optical radiation emitted from said active layer in a direction perpendicularly to a plane of said active layer, said distributed Bragg reflector comprising a plurality of layers stacked over said substrate, said active layer having a composition represented as $Ga_{1-x2}In_{1-y2}As_{z2}P_{1-z2}$ ($0 \leq y_2 \leq 1$, $0 \leq z_2 \leq 1$).

According to the present invention, the desired laser oscillation wavelength is realized with reduced strain as a result of use of GaInAsP for the active layer. Thereby, the surface morphology of the active layer is improved, and the efficiency of laser oscillation is improved as a result of the improvement of quality of crystal of the active layer. Further, as a result of reduced strain in the active layer, the degree of freedom for designing the laser diode is improved. As the active layer has a lattice constant closer to GaP or AlP as compared with the prior art vertical-cavity laser diode, it becomes possible to use a layer of AlInAsP for the DBR. As the layer of AlInAsP has a small refractive index, the number of stacks of the layers in the DBR is reduced, and the resistance of the laser diode is accordingly reduced.

Another object of the present invention is to provide a vertical-cavity laser diode, comprising:

a substrate;

an active layer provided over said substrate, said active layer emitting optical radiation;

a distributed Bragg reflector provided over said substrate in an optical path of said optical radiation emitted from said active layer in a direction perpendicularly to a plane of said active layer, said distributed Bragg reflector having a lattice constant between GaAs and GaP; and a pair of semiconductor layers having a composition represented as $Ga_{y3}In_{1-y3}P$ ($0.5 \leq y_3 \leq 1$) provided at upper and lower sides of said active layer.

According to the present invention, it is possible to reduce the number of non-optical recombination centers associated with Al by providing the GaInP layers at both upper and lower sides of the active layer. Further, the problem of multiplication of crystal defects originating from Al, or the problem of migration of the crystal defects into the active region of the laser diode, is also reduced and the reliability of the laser diode is improved.

Another object of the present invention is to provide a vertical-cavity laser diode, comprising:

a substrate;

an active layer provided over said substrate, said active layer emitting optical radiation;

a distributed Bragg reflector provided over said substrate in an optical path of said optical radiation emitted from said active layer in a direction perpendicularly to a plane of said active layer, said distributed Bragg reflector having a lattice constant between GaAs and GaP;

a contact layer provided over said distributed Bragg reflector; and an electrode provided on said contact layer in ohmic contact therewith, said contact layer being transparent to an optical beam produced as a result of interaction of said optical radiation produced by said active layer with said distributed Bragg reflector.

According to the present invention, the process of eliminating a part of the contact layer in correspondence to an optical window, from which the optical beam is emitted to the region outside the laser diode, is eliminated as a result of use of a material transparent to the optical beam for the contact layer.

Another object of the present invention is to provide a vertical-cavity laser diode, comprising:
a substrate;
an active layer provided over said substrate, said active layer emitting optical radiation; and
a distributed Bragg reflector provided over said substrate in an optical path of said optical radiation emitted from said active layer in a direction perpendicularly to a plane of said active layer, said distributed Bragg reflector having a lattice constant between GaAs and GaP,
said distributed Bragg reflector including therein a semiconductor layer having a composition represented as $AlAs_{z4}P_{1-z4}$ ($0 \leqq z_4 \leqq 1$).

According to the present invention that uses AlAsP characterized by a small refractive index as compared with AlInP of the same lattice constant, it becomes possible to increase the diffraction index different or step inside the DBR and the number of stacks of layers in the DBR can be reduced. Associated therewith, the threshold current of laser oscillation is reduced together with the device resistance.

Another object of the present invention is to provide a vertical-cavity laser diode, comprising:
a substrate;
an active layer provided over said substrate, said active layer emitting optical radiation; and
a distributed Bragg reflector provided over said substrate in an optical path of said optical radiation emitted from said active layer in a direction perpendicularly to a plane of said active layer, said distributed Bragg reflector having a lattice constant between GaAs and GaP,
said distributed Bragg reflector including therein a semiconductor layer having a composition represented as $AlAs_{z5}P_{1-z5}$ ($0 \leqq z_5 \leqq 1$),
said semiconductor layer being laterally sandwiched by a pair of oxide regions formed coplanar to said semiconductor layer, said semiconductor layer and said pair of oxide regions forming a current confinement structure.

According to the present invention, the oxidized regions are formed in the form of high-quality insulator by selective oxidation process of a semiconductor layer containing Al. Larger the Al content, easier for the selective oxidation process. Particularly, an AlAsP mixed crystal, which contains Al as the sole group III element, is easy for oxidation. According to the present invention, the threshold current of laser oscillation is decreased as a result of formation of the current confinement structure.

Another object of the present invention is to provide a vertical-cavity laser diode, comprising:
a substrate;
an active layer provided over said substrate, said active layer emitting optical radiation;
a distributed Bragg reflector provided over said substrate in an optical path of said optical radiation emitted perpendicularly to a plane of said active layer, said distributed Bragg reflector having a lattice constant between GaAs and GaP; and
a semiconductor layer interposed between said active layer and said distributed Bragg reflector, said semiconductor layer having a composition represented as $AlAs_{z6}P_{1-z6}$ ($0 \leqq z_6 \leqq 1$),
said semiconductor layer being laterally sandwiched by a pair of oxidized regions formed coplanar to said semiconductor layer.

According to the present invention, a current confinement structure is formed between the DBR and the active layer by applying a selective oxidation process to the semiconductor layer. As the current confinement structure is thus formed in the vicinity of the active layer, the current is injected to the active layer in the form of highly confined state, and lateral spreading of the carriers in the active layer is effectively suppressed. Further, the refractive index distribution in the layer containing the semiconductor layer and the oxidized regions enables an effective control of lateral mode of laser oscillation. Thus, the laser diode of the present invention oscillates at low threshold current with a stabilized lateral mode.

Other objects and further features of the present invention will become apparent from the following detailed description when read in conjunction with the attached drawings.

DETAILED DESCRIPTION OF THE INVENTION

First Embodiment

Figure 1:
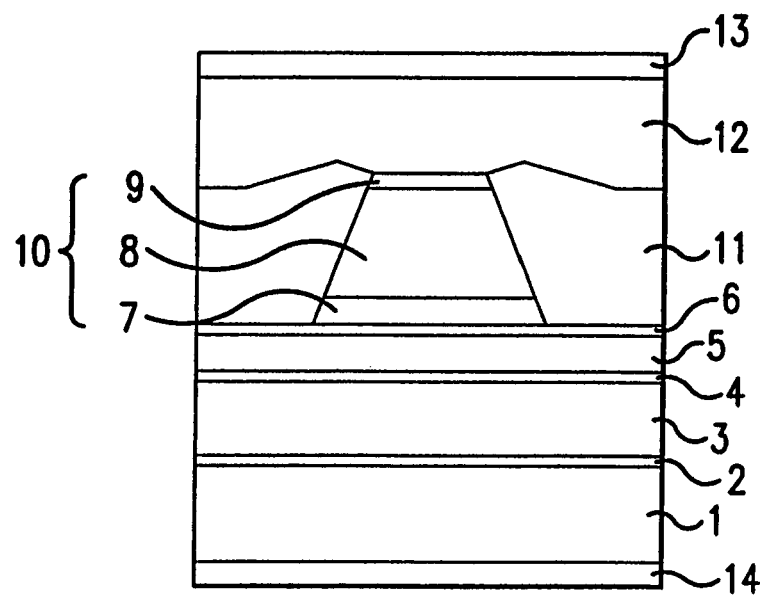
FIG. 1 is a diagram showing the construction of a conventional laser diode of edge-emission type.
Figure 2:
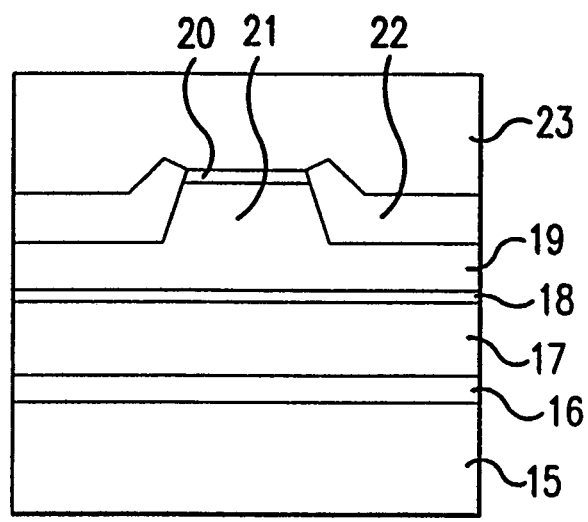
FIG. 2 is a diagram showing the construction of another conventional laser diode of edge-emission type.
Figure 3:
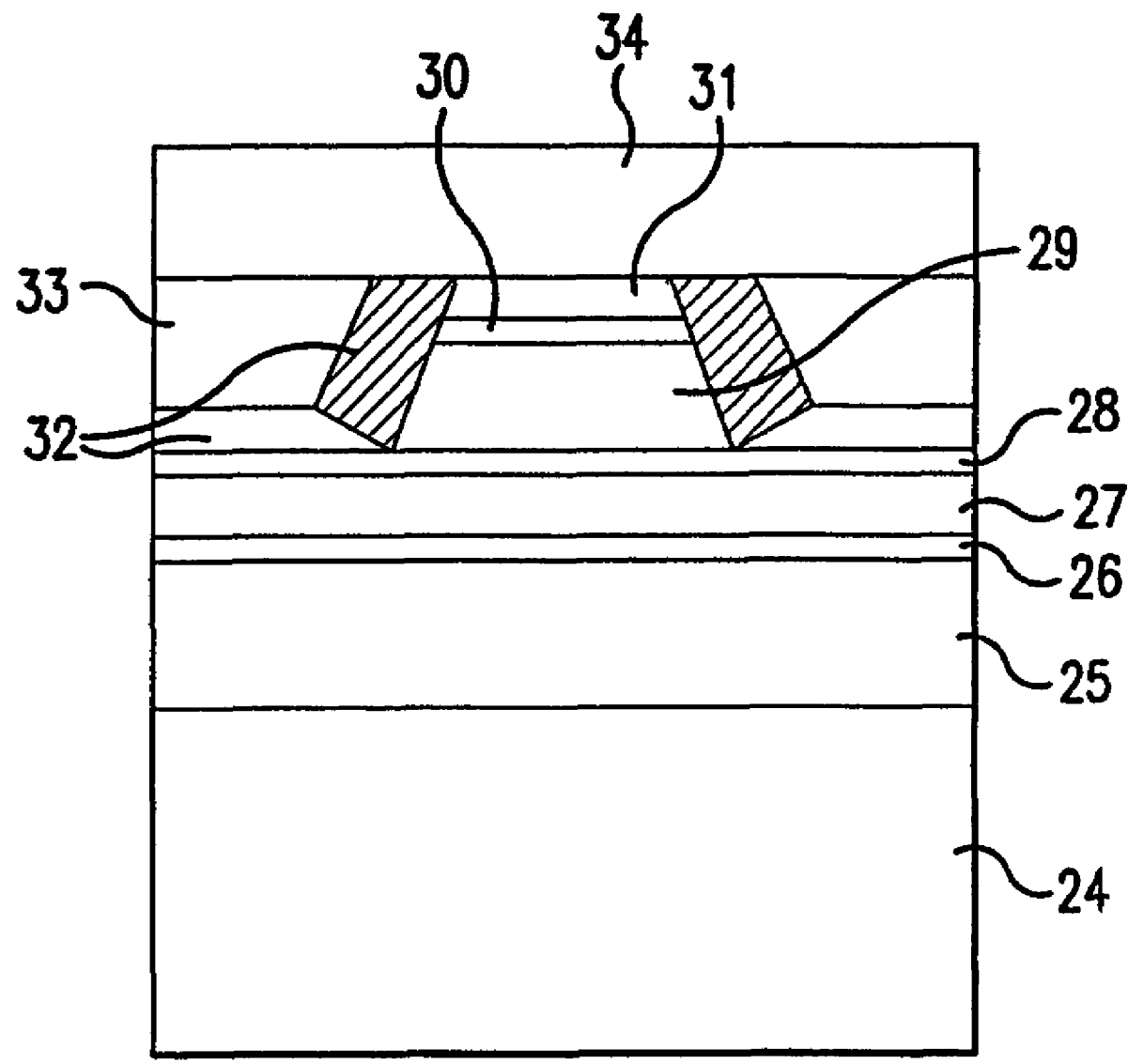
FIG. 3 is a diagram showing the construction of a further conventional laser diode of edge-emission type.
Figure 4:
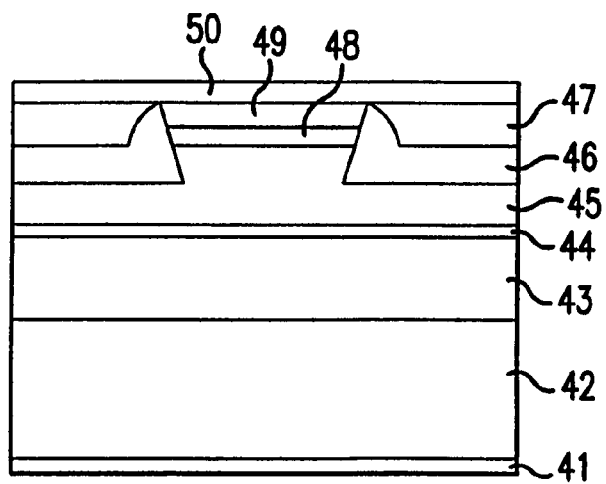
FIG. 4 is a diagram showing the construction of a further conventional laser diode of edge-emission type.
Figure 5:
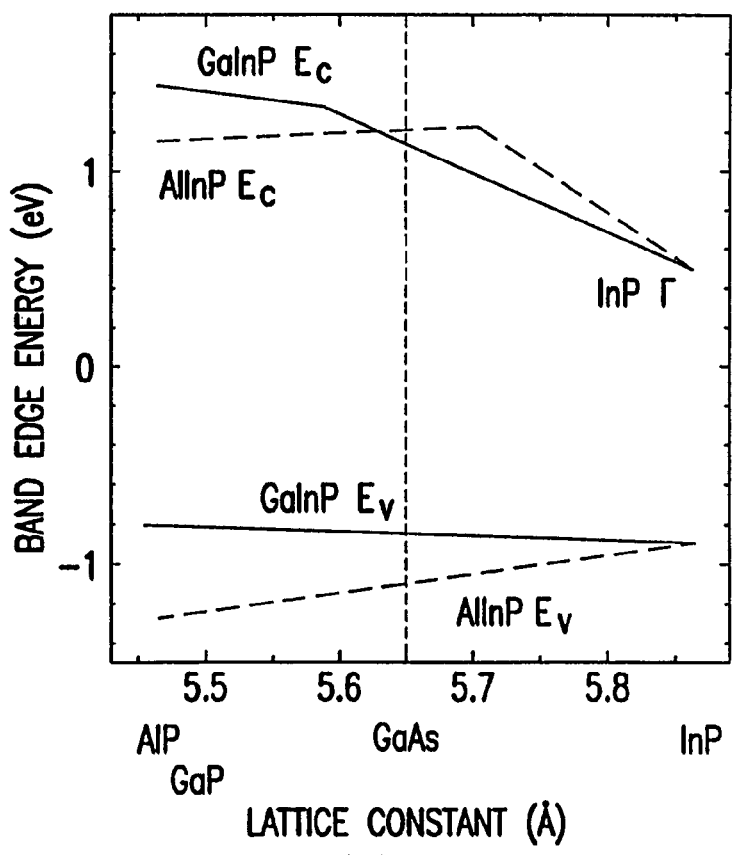
FIG. 5 is a diagram showing the relationship between bandgap energy and lattice constant for a III-V semiconductor material system.

FIG. 1 shows the structure of a laser diode according to a first embodiment of the present invention.

Referring to FIG. 1, the laser diode is constructed on a GaAsP substrate 115, wherein the GaAsP substrate 115 is formed by stacking, on a GaAs substrate 101 of n-type, a GaAsP composition graded layer 102 of n-type and a $GaAs_{0.6}P_{0.4}$ thick film 103 of p-type.

On the GaAsP substrate 115, there is provided a cladding layer 104 of n-type AlGaInP having a composition represented as $(Al_{0.5}Ga_{0.5})_{0.7}In_{0.3}P$, and an active layer 105 of GaInAsP is formed on the cladding layer 104. Further, an etching stopper layer 106 of GaInP is formed on the active layer with the composition of $Ga_{0.7}In_{0.3}P$.

On the etching stopper layer 106, there are formed a pair of current-blocking regions of p-type AlGaInP 107 at both lateral sides of a stripe region, in which a current injection is made, wherein the current-blocking regions 107 have a composition represented as $(Al_{0.5}Ga_{0.5})_{0.7}In_{0.3}P$. On each of the current-blocking regions 107, there is provided another current-blocking region 108 of n-type AlGaInP having a composition represented as $(Al_{0.5}Ga_{0.5})_{0.7}In_{0.3}P$.

On the current blocking regions 108 thus formed, there is provided an optical waveguide layer 109 of AlGaInP having a composition represented as $(Al_{0.1}Ga_{0.9})_{0.7}In_{0.3}P$, wherein the optical waveguide layer 109 covers the stripe region where the etching stopper layer 106 is exposed.

On the optical waveguide layer 109, there is provided a cladding layer 110 of p-type AlGaInP having a composition represented as $(Al_{0.5}Ga_{0.5})_{0.7}In_{0.3}P$. Further, a band-discontinuity relaxation layer 111 of p-type GaInP is formed on the cladding layer 110 with the composition of $Ga_{0.7}In_{0.3}P$. Further, a cap layer 112 of p-type GaAsP is formed on the band-discontinuity relaxation layer 111 with the composition of $GaAs_{0.6}P_{0.4}$.

Further, a p-type electrode 113 is formed on the surface of the p-type cap layer 112 and an n-type electrode 114 is formed on the bottom surface of the GaAs substrate 101.

Next, the fabrication process of the laser diode of FIG. 9 will be described with reference to FIGS. 10A-10D.

Figure 10A:
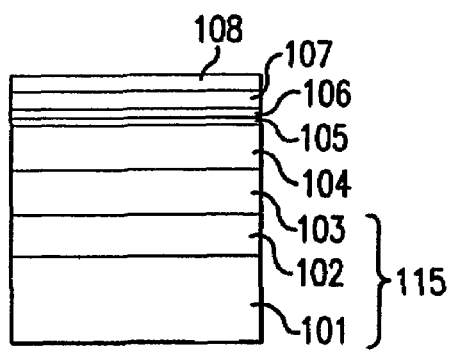
FIG. 10A-10D are diagrams showing the fabrication process of the laser diode of FIG. 9.

Referring to FIG. 10A, the cladding layer 104, the active layer 105, the etching stopper layer 106, a p-type AlGaInP layer corresponding to the current-blocking regions 107, and an n-type AlGaInP layer corresponding to the current-blocking regions 108 are grown epitaxially on the GaAsP substrate 115 by an MOCVD process. The active layer 105 may have a composition tuned to the bandgap wavelength of 635 nm.

Figure 10B:
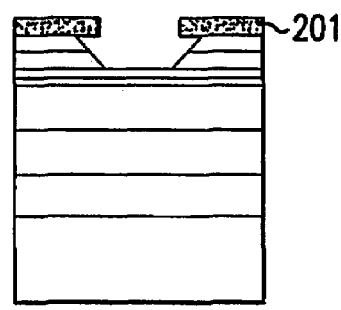
Figure 10C:
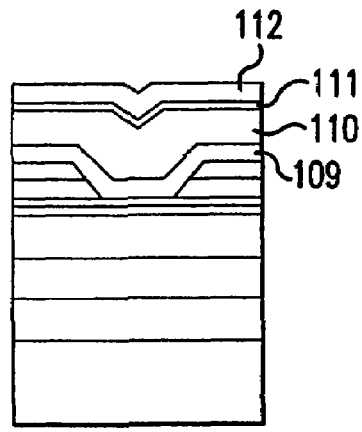
Figure 10D:
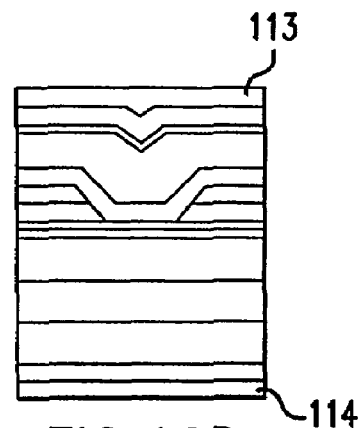

Next, a resist film 201 is formed on the AlGaInP layer corresponding to the current-blocking regions 108 and a stripe window is formed in the resist film 201 by applying a photolithographic process. Further, the AlGaInP layers corresponding to the current-blocking regions 108 and the current-blocking regions 107 are patterned by a chemical etching process while using the resist film as a mask, until the etching stopper layer 106 is exposed in correspondence to the stripe region. As a result, a stripe groove as represented in FIG. 10B is formed, and the current blocking regions 107 are separated from each other by the central stripe groove. Similarly, the current-blocking regions 108 are separated from each other by the stripe groove. The chemical etching process may be conducted by using a sulfuric solution as an etchant.

Next, the resist film 201 is removed and the optical waveguide layer 109, the cladding layer 110, the band-discontinuity relaxation layer 111, and the cap layer 112 are formed consecutively by an epitaxial process. Thereafter, the p-type electrode 113 is formed on the cap layer 112 and the bottom surface of the GaAs substrate 101 is polished. Finally, the n-type electrode 114 is formed on the polished bottom surface of the GaAs substrate 101.

Figure 9:
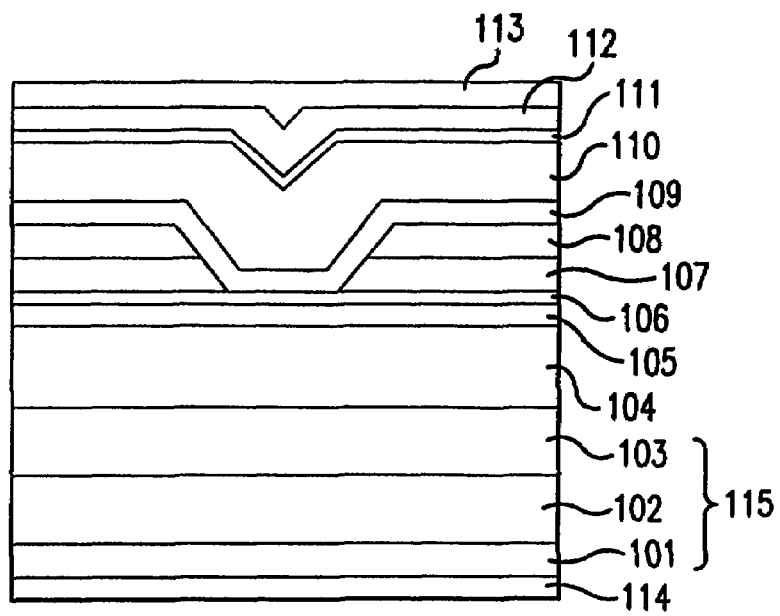
FIG. 9 is a diagram showing the construction of a laser diode according to a first embodiment of the present invention.

The laser diode of FIG. 9 has s current-confinement structure formed by the current-blocking regions 107 and 108, wherein the current-blocking regions 107 and 108 confine the injected drive current into the stripe region thus formed.

As the current-confinement structure thus formed include a stacking of the p-type AlGaInP layer 107 and the n-type AlGaInP layer 108, there is formed a pnpn junction in the region outside the stripe region. Because of the reverse biasing of the pn junction, there flows no substantial electric current in such a current-confinement structure, and the electric current is effectively confined into the stripe region.

Of course it is possible to construct the current-confinement structure by stacking of more than two layers with different carrier density or different conductivity type. Alternatively, the current-confinement structure may be formed by using a high-resistance or semi-insulating AlGaInP layer.

When a drive current is injected into the GaInAsP active layer 105, there occurs emission of optical radiation with a wavelength of 635 nm in correspondence to the bandgap. Thereby, it should be noted that the optical waveguide layer 109 of AlGaInP covers the stripe groove over the thin GaInP etching stopper layer 106. In view of the fact that the optical waveguide layer 109 has a refractive index smaller than the refractive index of the active layer 105 but larger than the refractive index of the cladding layer 110 or the current-blocking regions 107 and 108, and further in view of the fact that the optical waveguide layer 109 is located away from the active layer 105 in the region outside the stripe groove, there is formed a refractive index structure in which the refractive index is larger in the stripe groove than in the region outside the strip groove. Thereby, the optical radiation emitted by the active layer 105 is effectively confined in the stripe groove.

While it is true that the horizontal lateral mode leaks into the region outside the stripe groove, the optical loss outside the stripe groove is minimized due to the large bandgap of the p-type current-blocking regions 107 and the n-type current-blocking regions 108. There occurs no substantial optical absorption. Thus, the drive current of the laser diode is effectively minimized.

In the structure of FIG. 9, it should be noted that the foregoing real refractive index profile is formed, not by reducing the refractive index of the current-blocking regions 107 and 108 but by changing the location of the optical waveguide layer 109. Thus, the same composition can be used for the p-type current-blocking regions 107 and the n-type current-blocking regions 108. Thereby, there is no need of increasing the Al content and the problem of optical damaging of the optical cavity edge is minimized.

In view of the fact that the laser diode of FIG. 9 is constructed on the GaAsP substrate 115 having a lattice constant between the lattice constant of GaAs and the lattice constant of GaP, the GaInP etching stopper layer 106 that achieves lattice matching with the GaAsP substrate 115 has the composition of $Ga_{0.7}In_{0.3}P$ and a bandgap wavelength of 560 nm. As this wavelength is substantially shorter than the bandgap wavelength of 635 nm of the active layer 105, the etching stopper layer 106 functions as a carrier-blocking layer having a bandgap larger than the bandgap of the active layer 105. Thereby, there occurs no optical absorption by the etching stopper layer 106. In view of the fact that a GaInP layer shows a very low etching rate with respect to an AlGaInP layer when subjected to an etching process using a sulfuric acid etchant, the selective etching process for forming the current-blocking regions 107 and 108 is substantially facilitated.

It should be noted that the $GaAs_{0.6}P_{0.4}$ 115 is formed on the n-type GaAs substrate 101 as a result of stacking of the n-type GaAsP composition graded layer 102 and the n-type $GaAs_{0.6}P_{0.4}$ thick film 103 formed by a vapor-phase epitaxial process, as noted previously. Such a GaAsP substrate is marketed commercially as a substrate for 660 nm-wavelength red LED. Thus, fabrication of the laser diode is easily made, by utilizing such a commercially available substrate.

Second Embodiment

Next, a second embodiment of the present invention will be described with reference to FIG. 11 wherein those parts corresponding to the parts described previously are designated by the same reference numerals and the description thereof will be omitted.

Figure 11:
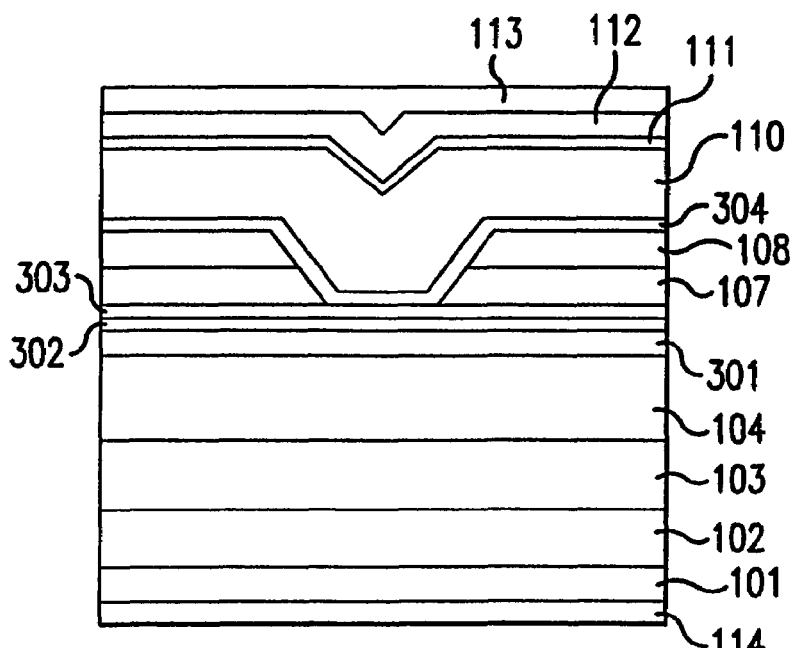
FIG. 11 is a diagram showing the construction of a laser diode according to a second embodiment of the present invention.

Referring to FIG. 11, there is provided a lower optical waveguide layer 301 on the n-type cladding layer 104 with a composition of $Ga_{0.7}In_{0.3}P$, and a quantum-well active layer 302 is formed on the lower optical waveguide layer 301 by alternately stacking GaInP and GaInAsP layers so as to form a strained superlattice structure. Further, a first upper optical waveguide layer 303 is formed on the quantum-well active layer 302 with a composition represented as Ga0.7In0.3P. Further, a second upper optical waveguide layer 304 is formed on the n-type current-blocking regions 108 with a composition of Ga0.7In0.3P, wherein the second upper optical waveguide layer is formed on the current-blocking regions 108 so as to cover the stripe groove region. Otherwise, the laser diode of FIG. 11 has a construction disclosed in FIG. 9.

In the present embodiment, the laser diode has an SCH structure as a result of use of the optical waveguide layers 301 and 303 on the GaInAsP/GaInP quantum-well active layer 302, wherein it should be noted that the lower optical waveguide layer 301 and the first upper optical waveguide layer 303 have an Al-free composition of Ga0.7In0.3P.

Thus, the laser diode of the present embodiment has an advantageous feature over the laser diode of the previous embodiment in the point in that the problem of oxidation or formation of surface states at the optical cavity edge surface is reduced. Thereby, the problem of optical damaging at such a cavity edge surface is reduced.

Further, there is an advantageous point,.in view of the fact that the second upper optical waveguide layer 304 covering the first optical waveguide layer 303 and the n-type current-blocking regions 108 is formed with the composition of Ga0.7In0.3P, that the second crystal growth is started from the layer thus free from Al. Thereby, the quality of the crystal of the semiconductor layers thus formed by the regrowth process is improved.

Further, it should be noted, in the laser diode of FIG. 11, that the total thickness of the $Ga_{0.7}In_{0.3}P$ first upper optical waveguide layer 303 and the $Ga_{0.7}In_{0.3}P$ second upper optical waveguide layer 304 is set generally equal to the thickness of the $Ga_{0.7}In_{0.3}P$ lower optical waveguide layer 301. Thus, there appears a symmetric refractive profile about the quantum-well active layer 302 in the vertical cross section of the laser diode for the part that includes the stripe region. As a result of such a vertically symmetric refractive index profile, the quantum-well active layer 302 is located at the position where the vertical mode optical intensity is maximum. Thereby, the coefficient of optical confinement is improved and the threshold current of laser oscillation is reduced.

Third Embodiment

Figure 12:
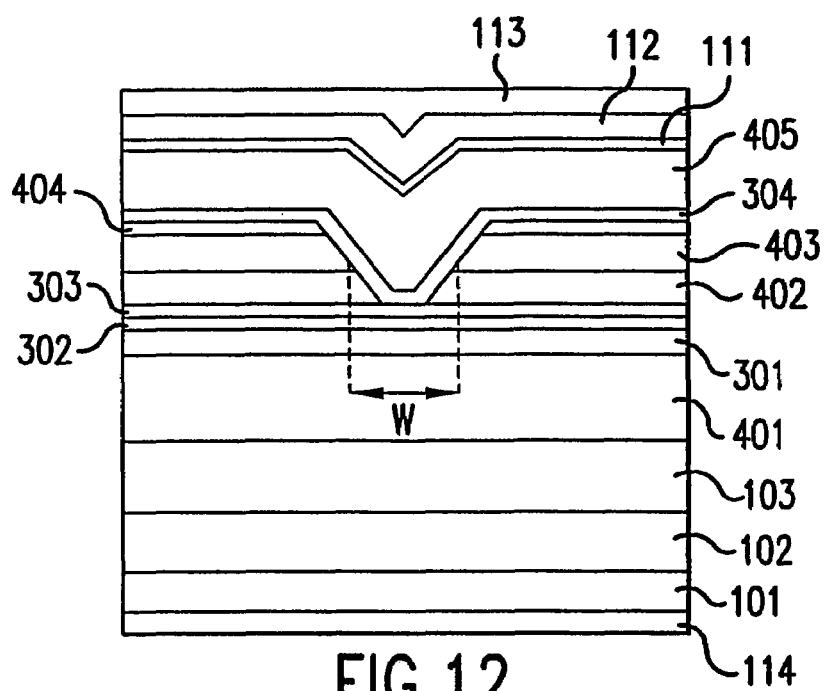
FIG. 12 is a diagram showing the construction of a laser diode according to a third embodiment of the present invention.

FIG. 12 shows the construction of a laser diode according to a third embodiment of the present invention, wherein those parts corresponding to the parts described previously are designated by the same reference numerals and the description thereof will be omitted.

Referring to FIG. 12, the laser diode includes an n-type cladding layer 401 formed on the n-type $GaAs_{0.6}P_{0.4}$ thick film 103 with a composition of $(Al_{0.5}Ga_{0.5})_{0.7}In_{0.3}As_{0.05}P_{0.95}$. Further, the laser diode includes a pair of current-blocking regions 402 of p-type AlGaInAsP formed on the first upper optical waveguide layer 303 with the composition of $(Al_{0.5}Ga_{0.5})_{0.7}In_{0.3}As_{0.05}P_{0.95}$ except for the stripe region, and a pair of current-blocking regions 403 of n-type AlGaInAsP having a composition represented as $(Al_{0.5}Ga_{0.5})_{0.7}In_{0.3}As_{0.05}P_{0.95}$ are formed on the p-type current-blocking regions 402 respectively. Each of the n-type current-blocking regions 403 is covered by a cap layer 404 of GaInP having a composition represented as $Ga_{0.7}In_{0.3}P$.

Further, the laser diode includes, on the second upper optical waveguide layer 304, a cladding layer 405 of p-type AlGaInAsP with a composition represented as $(Al_{0.5}Ga_{0.5})_{0.7}In_{0.3}As_{0.05}P_{0.95}$.

In the present embodiment, the n-type AlGaInAsP current-blocking regions 403 are covered with the $Ga_{0.7}In_{0.3}P$ cap layer 404, which is free from Al. Thereby, the surface of the current-blocking regions 403 containing Al is not exposed for the surface on which the regrowth process is to be conducted. Thus, the quality of the crystal layers to be grown thereon is improved.

Further, it should be noted that the n-type cladding layer 401, the p-type current-blocking regions 402, the n-type current-blocking regions 403, and the p-type cladding layer 405 are formed of AlGaInAsP containing As with an amount of about 5%. By adding a small amount of As to the mixed crystal of AlGaInP, the hillock density and hillock size are reduced substantially in the mixed crystal layer grown by an MOCVD process. Thereby, the smoothness of the device surface is improved and the scattering loss of the optical radiation in the optical waveguide is minimized. Associated therewith, the threshold current of laser oscillation is reduced and the slope efficiency is improved.

According to the present embodiment, it is possible to set a width W of the stripe region to be smaller than 5 μm. For example, it is possible to set the width to 3 μm. When the width of the stripe region is thus decreased, the leakage of the lateral mode optical radiation to the region outside the stripe region increases inevitably. If the current-blocking regions of the laser diode are formed of a material that absorbs the optical radiation, there would occur an extensive optical absorption loss and the slope efficiency of the laser diode would have been deteriorated. Further, when the Al-content in the current-blocking regions is large, there is a risk of optical damaging caused in the current-blocking regions in correspondence to the optical cavity edge as a result of optical absorption by the surface states. It should be noted that the current-blocking regions contain Al with a concentration identical with the concentration of the cladding layer, and there occurs no increase of optical damaging in the current-blocking regions. The decrease of the stripe width of course contributes to the decrease of the drive current of the laser diode.

Fourth Embodiment

Figure 13:
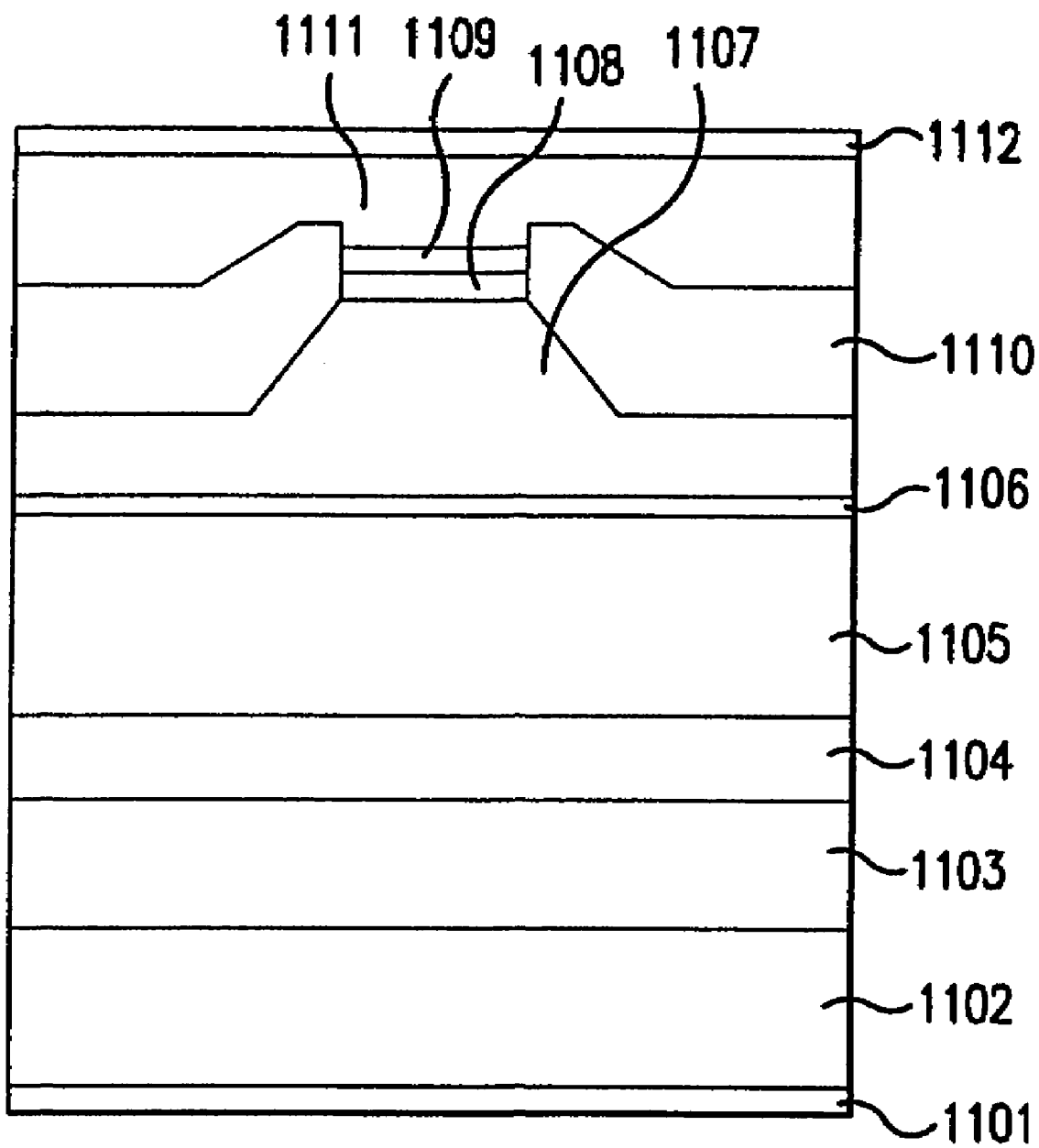
FIG. 13 is a diagram showing the construction of a laser diode according to a fourth embodiment of the present invention.

FIG. 13 shows the construction of a laser diode according to a fourth embodiment of the present invention.

Referring to FIG. 13, the laser diode is constructed on a substrate 1102 of n-type GaAs carrying thereon a composition-graded layer 1103 of n-type GaAsP having a composition represented as $GaAs_yP_{1-y}$, wherein the composition-graded layer 1103 is formed by an MOCVD process while changing the composition y continuously and gradually from 1 to 0.4. The growth process of the composition-graded layer 1103 is well established a smooth surface is realized by optimizing the composition gradient.

Next, a buffer layer 1104 of n-type GaAsP having a composition of $GaAs_{0.6}P_{0.4}$ is grown on the composition-graded layer 1103, and cladding layer 1105 of n-type AlGaInAsP, an undoped active layer 1106 of GaInAsP, a cladding layer 1107 of p-type AlGaInAsP, a spike-elimination layer 1108 of p-type GaInP, and a cap layer 1109 of p-type GaAsP, are grown consecutively on the buffer layer 1104 by an MOCVD process.

After the formation of the cap layer 1109, an $SiO_2$ film is deposited by a CVD process, followed by a photolithographic process to form a stripe pattern in correspondence to the region where injection of electric current is to be made, with a width of 10 m.

Next, the layers 1109 and 1108 are patterned consecutively by a chemical etching process while using the $SiO_2$ film thus formed as a mask, wherein the chemical etching process is continued until the etching reaches a part of the semiconductor layer 1107. As a result, a mesa ridge stripe is formed as represented in FIG. 13.

In the foregoing chemical etching process, the p-type GaAs cap layer 1109 is patterned while using a sulfuric acid etchant, while the p-type GaInP layer 1108 and the p-type AlGaInAsP layer 1107 are patterned by a hydrochloric acid etchant. The depth of etching of the cladding layer 1107 is controlled by way of controlling the duration of the etching process. According to such a process, it is possible to simplify the fabrication process and device structure.

Next, a pair of current-blocking regions 1110 of n-type AlGaInAsP are formed on the mesa structure thus formed by a regrowth process while using the $SiO_2$ film as the mask covering the ridge region of the mesa structure, wherein the current-blocking regions 1110 are grown on the region of the cladding layer 1107 not covered by the $SiO_2$ mask.

Further, the $SiO_2$ mask is removed and a contact layer 1111 of p-type GaAsP is grown on the current-blocking regions 1110 by a regrowth process so as to cover the p-type GaAsP cap layer 1109 exposed at the ridge region of the mesa structure.

Thereafter, the bottom surface of the substrate 1102 is polished and an n-type electrode 1101 is formed thereon by an evaporation deposition process. Further, a p-type electrode 1112 is deposited on the contact layer 1111. The electrodes 1101 and 1112 are subjected to an annealing process, and the optical cavity of the laser diode is formed by cleaving the structure thus formed.

In the laser diode of FIG. 13, it should be noted that the cladding layer 1107, the contact layer 1111 and the cap layer 1109 achieve a lattice matching to the GaAsP mixed crystal layer of the composition GaAs$_{0.6}$P$_{0.4}$.

In the GaInAsP active layer 1106 formed with lattice matching with the GaAs$_{0.6}$P$_{0.4}$ mixed crystal composition, it is possible to change the bandgap wavelength from 560 nm to 650 nm. Further, it is also possible to increase the range of optical wavelength by adopting a quantum-well structure or applying strain to the active layer 1106. Further, it is possible to realize an optical wavelength of the 630 nm band or 650 nm band by introducing As into the active layer.

In the case of the laser diode of the illustrated construction, the laser diode oscillated at the wavelength of 635 nm. In this case, a mixed crystal of AlGaInAsP was used for the current blocking regions 1110, and the As content was set to be 20% in atomic percent for the group V elements constituting the mixed crystal. As a result, the problem of hillock formation was successfully suppressed and a flat and smooth surface was obtained. Thereby, the leakage current associated with the hillocks was reduced, and the frequency of initial failure of the laser diode was also reduced. With the elimination of current leakage path, the injected drive current was effectively confined into the stripe region as a result of the current-confinement action of the pnp structure formed outside the ridge stripe.

Further, in view of the fact that an AlGaInAsP composition having a smaller bandgap as compared with the active layer 1106 is used for the current-blocking regions 1110, there occurs an optical absorption for the higher mode optical radiation leaked from the stripe region in the lateral direction. Thereby, a waveguide loss is caused at the region outside the ridge stripe for the higher-mode optical radiation that spreads into such a region outside the stripe ridge structure. Associated therewith, the fundamental mode optical radiation is alone is effectively confined in the ridge stripe and there is formed a refractive-index waveguide structure characterized by a single peak. The laser diode thereby oscillates stably in the fundamental lateral mode even when operated to provide a high output power.

Fifth Embodiment

Figure 14:
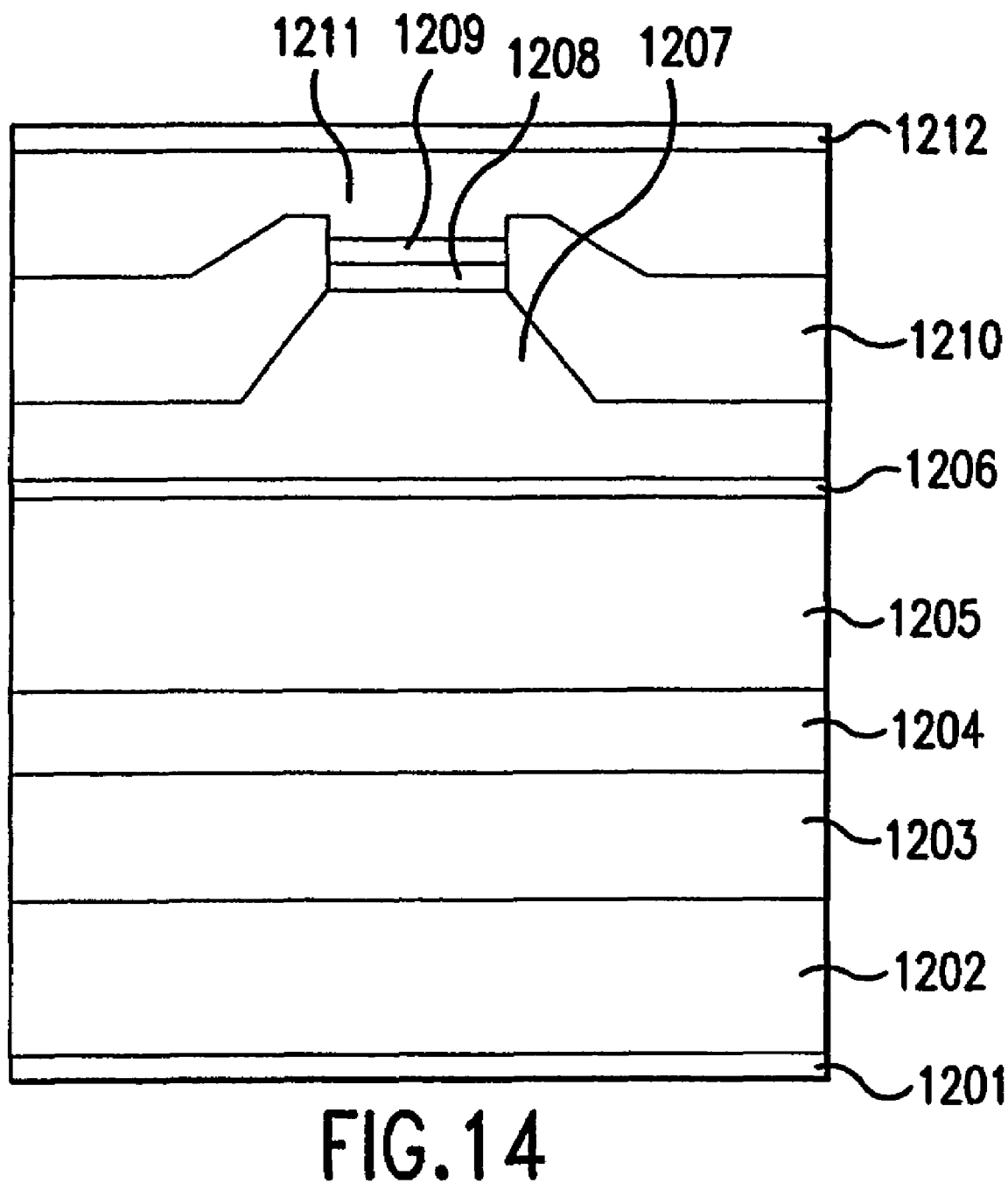
FIG. 14 is a diagram showing the construction of a laser diode according to a fifth embodiment of the present invention.

FIG. 14 shows the construction of a laser diode according to a fifth embodiment of the present invention.

Referring to FIG. 14, the laser diode is constructed on a substrate 1202 of n-type GaAs carrying thereon a composition-graded layer 1203 of n-type GaAsP having a composition represented as GaAs$_y$P$_{1-y}$, wherein the composition-graded layer 1203 is formed by an MOCVD process while changing the composition y continuously and gradually from 1 to 0.4. The growth process of the composition-graded layer 1203 is well established a smooth surface is realized by optimizing the composition gradient.

Next, a buffer layer 1204 of n-type GaAsP having a composition of GaAs$_{0.6}$P$_{0.4}$ is grown on the composition-graded layer 1203, and cladding layer 1105 of n-type AlGaInAsP, an undoped active layer 1206 of GaInAsP, a cladding layer 1207 of p-type AlGaInAsP, a spike-elimination layer 1208 of p-type GaInP, and a cap layer 1209 of p-type GaAsP, are grown consecutively on the buffer layer 1204 by an MOCVD process.

After the formation of the cap layer 1209, an SiO$_2$ film is deposited by a CVD process, followed by a photolithographic process to form a stripe pattern in correspondence to the region where injection of electric current is to be made, with a width of 10 μm.

Next, the layers 1209 and 1208 are patterned consecutively by a chemical etching process while using the SiO$_2$ film thus formed as a mask, wherein the chemical etching process is continued until the etching reaches a part of the semiconductor layer 1207. As a result, a mesa ridge stripe is formed as represented in FIG. 14.

In the foregoing chemical etching process, the p-type GaAs cap layer 1209 is patterned while using a sulfuric acid etchant, while the p-type GaInP layer 1208 and the p-type AlGaInAsP layer 1207 are patterned by a hydrochloric acid etchant. The depth of etching of the cladding layer 1207 is controlled by way of controlling the duration of the etching process. According to such a process, it is possible to simplify the fabrication process and device structure.

Next, a pair of current-blocking regions 1210 of n-type AlGaInAsP are formed on the mesa structure thus formed by a regrowth process with a composition set so as to achieve lattice matching with the GaAs$_{0.6}$P$_{0.4}$ mixed crystal composition while using the SiO$_2$ film as the mask covering the ridge region of the mesa structure, wherein the current-blocking regions 1210 are grown on the region of the cladding layer 1207 not covered by the SiO$_2$ mask. By introducing As with a concentration of 5% into the current-blocking regions 1210, the problem of hillock formation was effectively suppressed.

Further, the SiO$_2$ mask is removed and a contact layer 1211 of p-type GaAsP is grown on the current-blocking regions 1210 by a regrowth process so as to cover the p-type GaAsP cap layer 1209 exposed at the ridge region of the mesa structure.

Thereafter, the bottom surface of the substrate 1202 is polished and an n-type electrode 1201 is formed thereon by an evaporation deposition process. Further, a p-type electrode 1212 is deposited on the contact layer 1211. The electrodes 1201 and 1212 are subjected to an annealing process to form an ohmic contact, and the optical cavity of the laser diode is formed by cleaving the structure thus formed.

In the laser diode of FIG. 14, it should be noted that the cladding layer 1207, the current-blocking regions 1210, the contact layer 1211 and the cap layer 1209 achieve lattice matching to the GaAsP mixed crystal layer of the composition GaAs$_{0.6}$P$_{0.4}$.

In the GaInAsP active layer 1206 formed with lattice matching with the GaAs$_{0.6}$P$_{0.4}$ mixed crystal composition, it is possible to change the bandgap wavelength from 560 nm to 650 nm. Further, it is also possible to increase the range of optical wavelength by adopting a quantum-well structure or applying strain to the active layer 1206. Further, it is possible to realize an optical wavelength of the 630 nm band or 650 nm band by introducing As into the active layer 1206.

In the case of the laser diode of the illustrated construction, the laser diode oscillated at the wavelength of 635 nm. In this case, a mixed crystal of AlGaInAsP was used for the current blocking regions 1210 with the lattice matching composition to the GaAsP mixed crystal while setting the As content to 5% in atomic percent for the group V elements constituting the mixed crystal. Thereby, the refractive index of the current-blocking regions 1210 is reduced as compared with the refractive index of the cladding layer 1207, and there is formed a real refractive index waveguide structure.

Associated therewith, the efficiency of laser oscillation is improved and the laser diode can operate stably with high optical output power. The use of the real-refractive index waveguide structure also reduces astigmatism of the output optical beam.

Further, the problem of hillock formation was successfully suppressed and a flat and smooth surface was obtained by introducing 5% of As into the current-blocking regions 2210. Thereby, the leakage current associated with the hillocks was reduced, and the frequency of initial failure of the laser diode was also reduced. With the elimination of current leakage path, the injected drive current was effectively confined into the stripe region as a result of the current-confinement action of the pnp structure formed outside the ridge stripe.

Sixth Embodiment

Figure 15:
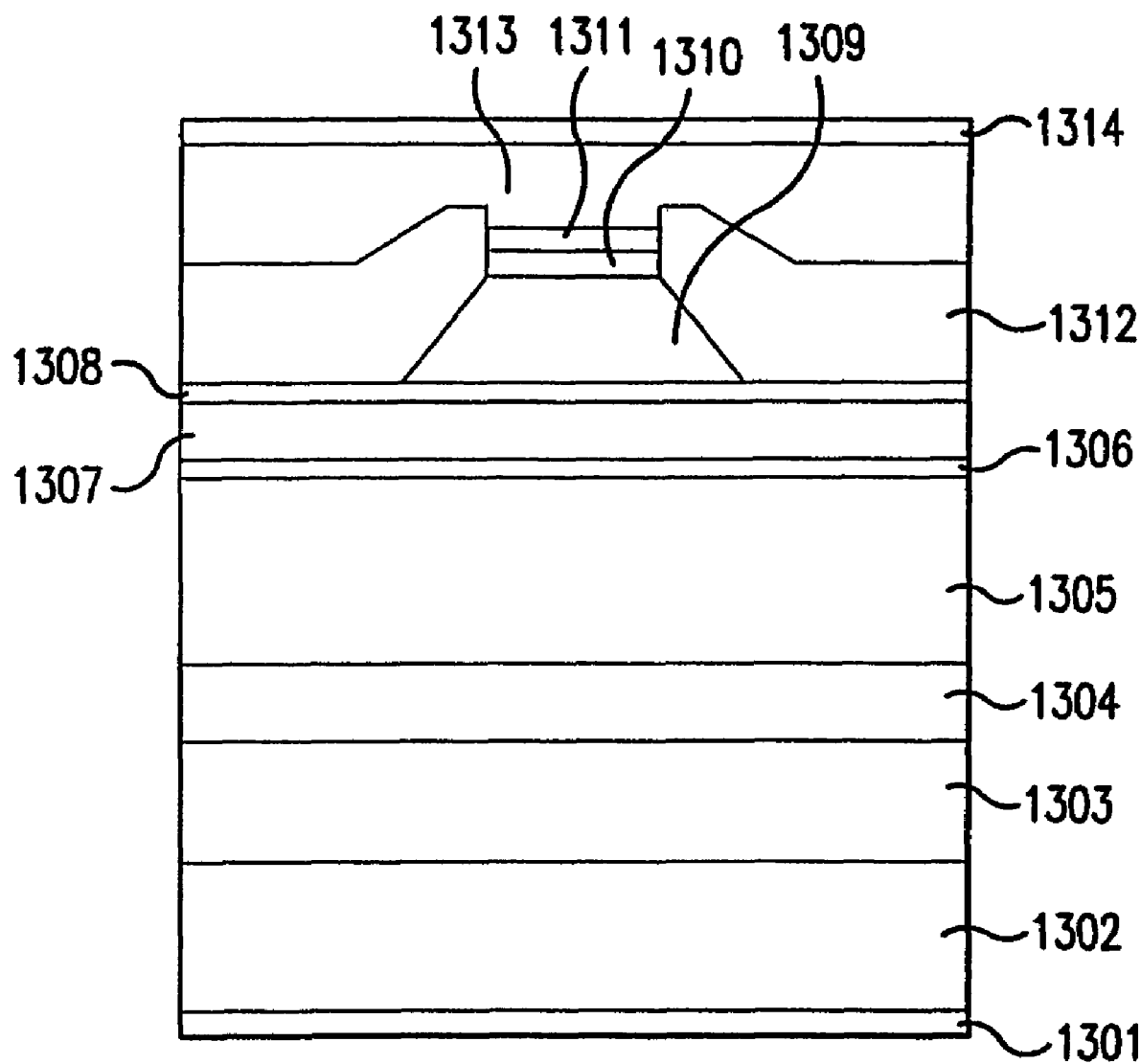
FIG. 15 is a diagram showing the construction of a laser diode according to a sixth embodiment of the present invention.

FIG. 15 shows the construction of a laser diode according to a sixth embodiment of the present invention.

FIG. 15 shows the construction of a laser diode according to a sixth embodiment of the present invention.

Referring to FIG. 15, the laser diode is constructed on a substrate 1302 of n-type GaAs carrying thereon a composition-graded layer 1303 of n-type GaAsP having a composition represented as $GaAs_yP_{1-y}$, wherein the composition-graded layer 1303 is formed by an MOCVD process while changing the composition y continuously and gradually from 1 to 0.4. The growth process of the composition-graded layer 1303 is well established a smooth surface is realized by optimizing the composition gradient.

Next, a buffer layer 1304 of n-type GaAsP having a composition of $GaAs_{0.6}P_{0.4}$ is grown on the composition-graded layer 1303, and cladding layer 1305 of n-type AlGaInAsP, an undoped active layer 1306 of GaInAsP, a first cladding layer 1307 of p-type AlGaInAsP, an etching stopper layer 308 of p-type GaAsP, a second cladding layer of p-type AlGaInAsP, a spike elimination layer 1310 of p-type GaInP, and a cap layer 1311 of p-type GaAsP, are grown consecutively on the buffer layer 1304 by an MOCVD process.

After the formation of the cap layer 1311, an $SiO_2$ film is deposited by a CVD process, followed by a photolithographic process to form a stripe pattern in correspondence to the region where injection of electric current is to be made, with a width of 10 μm.

Next, the layers 1311, 1310 and 1309 are patterned consecutively by a chemical etching process while using the $SiO_2$ film thus formed as a mask, wherein the chemical etching process is continued until the etching stopper layer 1308 is exposed. As a result, a mesa ridge stripe is formed as represented in FIG. 14.

In the foregoing chemical etching process, the p-type GaAsP cap layer 1311 is patterned while using a sulfuric acid etchant, while the p-type GaInP layer 1310 and the p-type AlGaInAsP layer 1309 are patterned by a hydrochloric acid etchant. As a result of use of the etching stopper layer 1308, the control of height of the ridge structure is substantially facilitated.

Next, a pair of current-blocking regions 1312 of n-type AlGaInAsP are formed on the mesa structure thus formed by a regrowth process while using the $SiO_2$ film as the mask covering the ridge region of the mesa structure, wherein the current-blocking regions 1312 are grown on the region of the cladding layer 1312 not covered by the $SiO_2$ mask.

Further, the $SiO_2$ mask is removed and a contact layer 1313 of p-type GaAsP is grown on the current-blocking regions 1312 by a regrowth process so as to cover the p-type GaAsP cap layer 1311 exposed at the ridge region of the mesa structure.

Thereafter, the bottom surface of the substrate 1302 is polished and an n-type electrode 1301 is formed thereon by an evaporation deposition process. Further, a p-type electrode 1314 is deposited on the contact layer 1313. The electrodes 1301 and 1314 are subjected to an annealing process so as to form an ohmic contact, and the optical cavity of the laser diode is formed by cleaving the structure thus formed.

In the laser diode of FIG. 15, a laser oscillation was obtained with the horizontal lateral mode at the wavelength of 650 nm.

As a result of use of the mixed crystal containing As for the current-confinement regions 1312, the problem of hillock formation was successfully eliminated. Thereby, the problem of leakage current or waveguide loss associated with optical scattering is eliminated and the threshold current of laser oscillation is reduced. In the illustrated example, a composition of $GaAs_{0.4}P_{0.6}$ was used for the etching stopper layer 1308 so as to form a lattice misfit of about −0.73%. Thereby, the bandgap of the etching stopper layer 1308 exceeds the photon energy of the laser beam radiation produced by the laser diode and the problem of optical loss is avoided. It should be noted that the etching stopper layer 1308 is provided with a thickness less than the critical thickness and the problem of degradation of crystal quality is avoided.

In the present embodiment that uses GaAsP for the etching stopper layer 1308, the bandgap energy is larger than the case of using GaInP for the etching stopper layer 1308. On the other hand, the lattice strain of the etching stopper layer 1308 can be minimized by using a composition of GaInAsP. The etching stopper layer 1308 having such a composition avoids optical absorption simultaneously.

As a result of use of the etching stopper layer 1308, it becomes possible, in the present embodiment, to apply an etching process to the region where the active layer 1306 is provided or to the region in the vicinity of the active layer 1306, without causing an over-etching of the active layer 1506. Even so, the effect of non-optical surface states on the etching surface was eliminated with regard to the device characteristic or scattering of device characteristic.

Further, in view of the fact that the etching stopper layer 1308 is covered with the cladding layer 1307, there occurs no surface oxidation, and the current-confinement regions 312 are formed thereon with excellent crystal quality. As a result, the laser diode of the present embodiment shows little aging and operates with excellent reliability.

Seventh Embodiment

Figure 16:
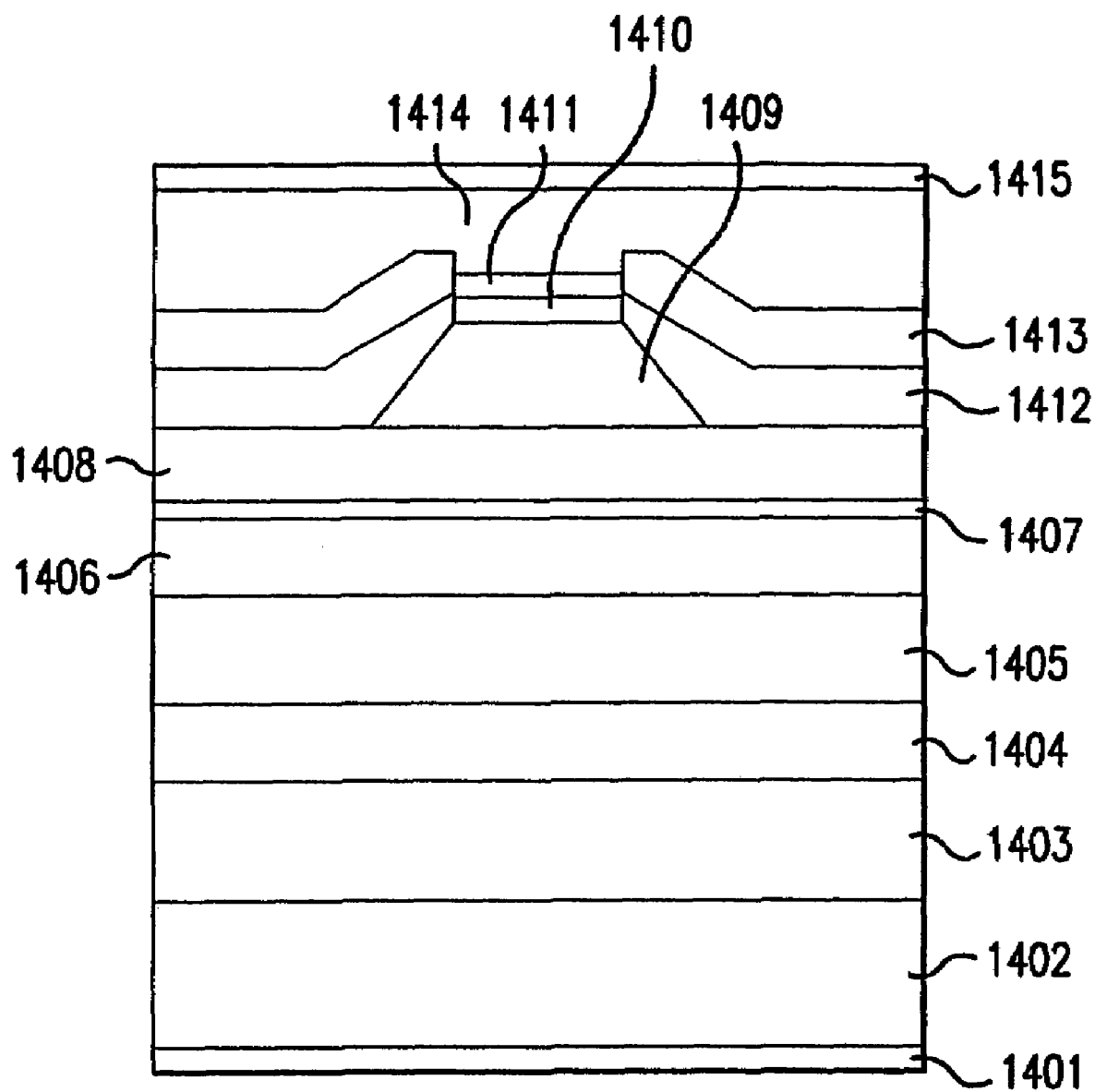
FIG. 16 is a diagram showing the construction of a laser diode according to a seventh embodiment of the present invention.

FIG. 16 shows the construction of a laser diode according to a seventh embodiment of the present invention.

Referring to FIG. 16, the laser diode is constructed on a substrate 1402 of n-type GaAs carrying thereon a composition-graded layer 1403 of n-type GaAsP having a composition represented as $GaAs_yP_{1-y}$, wherein the composition-graded layer 1403 is formed by an MOCVD process while changing the composition y continuously and gradually from 1 to 0.4. The growth process of the composition-graded layer 1403 is well established a smooth surface is realized by optimizing the composition gradient.

Next, a buffer layer 1404 of n-type GaAsP having a composition of $GaAs_{0.6}P_{0.4}$ is grown on the composition-graded layer 1403, and cladding layer 1405 of n-type AlGaInAsP, an optical waveguide layer 1406 of undoped GaInP, an active layer 1407 of undoped GaInAsP, an optical waveguide layer 1408 of undoped GaInP, a cladding layer 1409 of p-type AlGaInAsP, a spike-elimination layer 1410 of p-type GaInP, and a cap layer 1411 of p-type GaAsP, are grown consecutively on the buffer layer 1404 by an MOCVD process.

After the formation of the cap layer 1411, an $SiO_2$ film is deposited by a CVD process, followed by a photolithographic process to form a stripe pattern in correspondence to the region where injection of electric current is to be made, with a width of 10 μm.

Next, the layers 1411, 1410 and 1409 are patterned consecutively by a chemical etching process while using the $SiO_2$ film thus formed as a mask, wherein the chemical etching process is continued until the optical waveguide layer 1408 is exposed. As a result, a mesa ridge stripe is formed as represented in FIG. 16.

In the foregoing chemical etching process, the p-type GaAsP cap layer 1411 is patterned while using a sulfuric acid etchant, while the p-type GaInP layer 1410 and an upper part of the p-type AlGaInAsP layer 1409 are patterned by a hydrochloric acid etchant. Then the etchant is changed again to the sulfuric acid etchant and the remaining part of the AlGaInAsP cladding layer 1409 is etched until the optical waveguide layer 1408 is exposed. Thereby, the optical waveguide layer 1408 is used as the etching stopper. As a result of use of the etching stopper, the present invention can control the height of the ridge structure easily.

Next, a pair of current-blocking regions 1413 of p-type AlGaInAsP are formed on the mesa structure thus formed by a regrowth process while using the $SiO_2$ film as the mask covering the ridge region of the mesa structure, wherein the current-blocking regions 1412 are grown on the region of the optical waveguide layer 1408 and the cladding layer 1409 not covered by the $SiO_2$ mask. Further, n-type AlInAsP current blocking regions 1413 are grown on the p-type current-blocking regions 1412 while using the SiO2 mask, similarly to the process of forming the current-blocking regions 1412.

Further, the $SiO_2$ mask is removed and a contact layer 1414 of p-type GaAsP is grown on the current-blocking regions 1413 by a regrowth process so as to cover the p-type GaAsP cap layer 1411 exposed at the ridge region of the mesa structure.

Thereafter, the bottom surface of the substrate 1402 is polished and an n-type electrode 1401 is formed thereon by an evaporation deposition process. Further, a p-type electrode 1412 is deposited on the contact layer 1414. The electrodes 1401 and 1415 are subjected to an annealing process, and the optical cavity of the laser diode is formed by cleaving the structure thus formed.

In the laser diode of FIG. 16, it should be noted that the cladding layer 1409, the contact layer 1414 and the current-blocking regions 1412 and 1413 form together a pnp structure acting as a current confinement structure.

In the illustrated example, the laser diode oscillated with the fundamental lateral mode at the wavelength of 640 nm.

By adding. As into the mixed crystal layer constituting the current-blocking regions 412 and 413, the problem of hillock formation is successfully eliminated in the laser diode of the present embodiment. Associated with this, the leakage current path is eliminated and the waveguide loss caused as a result of optical scattering is minimized.

As the active layer 1407 is sandwiched by the GaInP optical waveguide layers 1406 and 1408, which is free from Al, non-optical recombination of carriers is reduced and the threshold of laser oscillation is reduced. Further, as a result of use of Al-free material in the optical waveguide of the laser diode in which the optical intensity is strong, the surface states associated with oxidation of Al is minimized and the COD level is increased. Thereby, the laser diode operates at a high optical output power.

Eighth Embodiment

Figure 17:
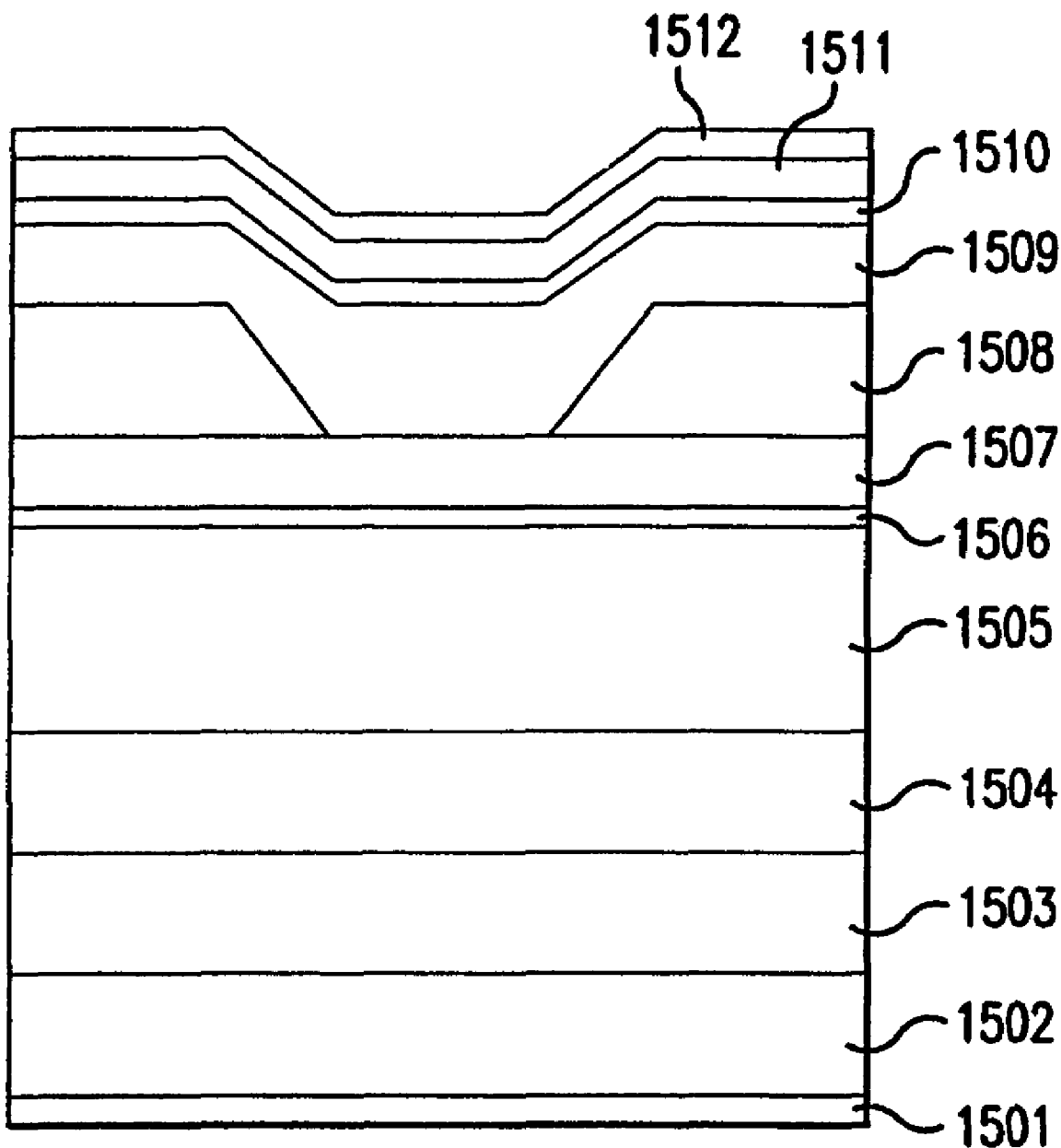
FIG. 17 is a diagram showing the construction of a laser diode according to an eighth embodiment of the present invention.

FIG. 17 shows the construction of a laser diode according to an eighth embodiment of the present invention.

Referring to FIG. 17, the laser diode is constructed on a substrate 1502 of n-type GaAs carrying thereon a composition-graded layer 1503 of n-type GaAsP having a composition represented as $GaAs_yP_{1-y}$, wherein the composition-graded layer 1503 is formed by an MOCVD process while changing the composition y continuously and gradually from 1 to 0.4. The growth process of the composition-graded layer 1503 is well established a smooth surface is realized by optimizing the composition gradient.

Next, a buffer layer 1504 of n-type GaAsP having a composition of $GaAs_{0.6}P_{0.4}$ is grown on the composition-graded layer 1503, and a cladding layer 1505 of n-type AlGaInAsP, an undoped active layer 1506 of GaInAsP, a first cladding layer 1507 of p-type AlGaInAsP, and a current confinement layer 1508 of n-type AlGaInAsP, are grown consecutively on the buffer layer 1504 by an MOCVD process.

After the formation of the current confinement layer 1508, a resist film is deposited by a spin-coating process, followed by a photolithographic process to form a stripe window in correspondence to the region where injection of electric current is to be made, with a width of 10 μm.

Next, the current confinement layer 1508 is patterned by a chemical etching process while using the resist film thus formed as a mask, wherein the chemical etching process is continued until the etching reaches the optical waveguide layer 1507. As a result, a stripe groove is formed as represented in FIG. 17. The chemical etching process may be conducted by using a sulfuric acid etchant. As a result of the chemical etching process, a pair current-blocking regions 1508 are formed with an intervening stripe groove region exposing the optical waveguide layer 1507.

Next, the resist film is removed and a second cladding layer 1509 of p-type AlGaInAsP, a spike-elimination layer 1510 of p-type GaInP, and a contact layer 1511 of p-type GaAsP are grown consecutively on the current-blocking regions 1508 by a regrowth process so as to cover the optical waveguide layer 1507 exposed at the stripe groove region.

Thereafter, the bottom surface of the substrate 1502 is polished and an n-type electrode 1501 is formed thereon by an evaporation deposition process. Further, a p-type electrode 1512 is deposited on the contact layer 1511. The electrodes 1501 and 1512 are subjected to an annealing process to form an ohmic contact, and the optical cavity of the laser diode is formed by cleaving the structure thus formed.

In the laser diode of FIG. 17, it should be noted that the cladding layer 1509 and the contact layer 1111 achieve a lattice matching to the GaAsP mixed crystal layer of the composition $GaAs_{0.6}P_{0.4}$.

In the case of the laser diode of the illustrated construction, the laser diode oscillated with the fundamental lateral mode at the wavelength of 635 nm.

It should be noted that the current-blocking layer or regions 1508 contain As with the concentration of 20%. As a result, there occurs no substantial formation of hillocks and a smooth and flat surface is obtained for the layer 1508. Thereby, the problem of leakage current induced by hillocks or the associated problem of initial failure of the laser diode is effectively eliminated.

Further, in view of elimination of the leakage current path, it becomes possible to confine the electric current into the stripe region more efficiently.

It should be noted that the fabrication process of the laser diode of the present embodiment requires only two MOCVD process, contrary to the case of forming the laser diode having a stripe ridge structure, which requires three separate MOCVD process. Thereby, the number of intermission of the growth process is reduced and degradation of quality of the epitaxial layers grown on such a surface is minimized.

Ninth Embodiment

Figure 18:
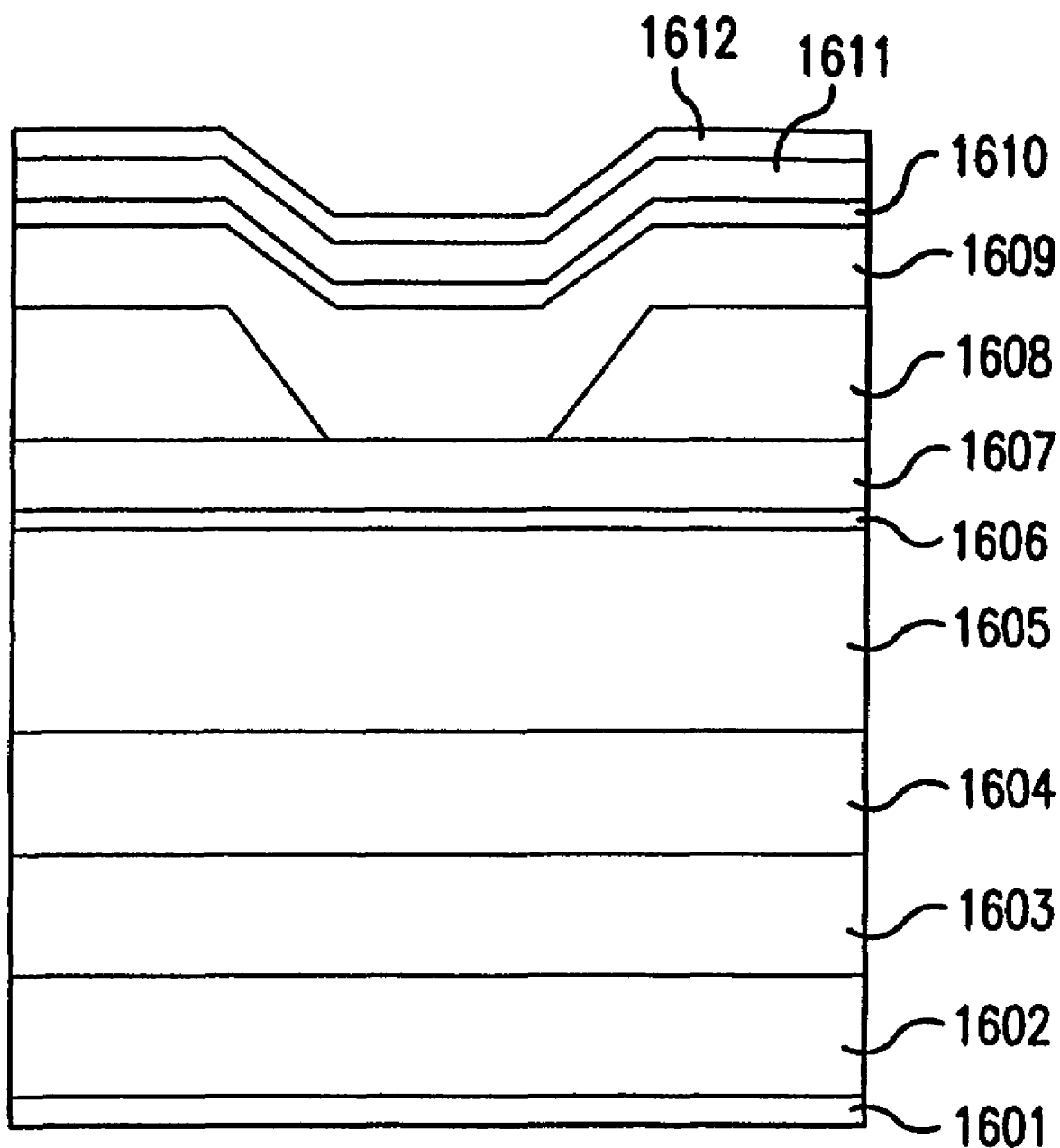
FIG. 18 is a diagram showing the construction of a laser diode according to a ninth embodiment of the present invention.

FIG. 18 shows the construction of a laser diode according to an eighth embodiment of the present invention.

Referring to FIG. 18, the laser diode is constructed on a substrate 1602 of n-type GaAs carrying thereon a composition-graded layer 1603 of n-type GaAsP having a composition represented as $GaAs_yP_{1-y}$, wherein the composition-graded layer 1603 is formed by an MOCVD process while changing the composition y continuously and gradually from 1 to 0.4. The growth process of the composition-graded layer 1603 is well established a smooth surface is realized by optimizing the composition gradient.

Next, a buffer layer 1604 of n-type GaAsP having a composition of $GaAs_{0.6}P_{0.4}$ is grown on the composition-graded layer 1603, and a cladding layer 1605 of n-type AlGaInAsP, an undoped active layer 1606 of GaInAsP, a first cladding layer 1607 of p-type AlGaInAsP, and a current confinement layer 1608 of n-type AlGaInAsP, are grown consecutively on the buffer layer 1604 by an MOCVD process.

After the formation of the current confinement layer 1608, a resist film is deposited by a spin-coating process, followed by a photolithographic process to form a stripe window in correspondence to the region where injection of electric current is to be made, with a width of 10 μm.

Next, the current confinement layer 1608 is patterned by a chemical etching process while using the resist film thus formed as a mask, wherein the chemical etching process is continued until the etching reaches the optical waveguide layer 1607. As a result, a stripe groove is formed as represented in FIG. 17. The chemical etching process may be conducted by using a sulfuric acid etchant. As a result of the chemical etching process, a pair current-blocking regions 1508 are formed with an intervening stripe groove region exposing the optical waveguide layer 1607.

Next, the resist mask is removed and a second cladding layer 1609 of p-type AlGaInAsP, a spike-elimination layer 1610 of p-type GaInP, and a contact layer 1611 of p-type GaAsP are grown on the current-blocking regions 1608 consecutively by a regrowth process so as to cover the optical waveguide layer 1607 exposed at the stripe groove region.

Thereafter, the bottom surface of the substrate 1602 is polished and an n-type electrode 1601 is formed thereon by an evaporation deposition process. Further, a p-type electrode 1612 is deposited on the contact layer 1611. The electrodes 1601 and 1612 are subjected to an annealing process to form an ohmic contact, and the optical cavity of the laser diode is formed by cleaving the structure thus formed.

In the laser diode of FIG. 18, it should be noted that the AlInAsP current-blocking layer 1608, and hence the current-blocking regions 1608, is formed to have a composition transparent to the laser beam radiation produced by the laser diode, by introducing 5% of As into the composition of AlInP. Thereby, the current-blocking regions 1608 achieve lattice matching with the composition $GaAs_{0.6}P_{0.4}$.

With this amount of As, it was observed that hillock formation is effectively suppressed. Further, it should be noted that the AlInAsP current-blocking regions 1608 of the foregoing lattice matching composition have a refractive index smaller than the refractive index of the cladding layer 1607. Thus, there occurs no substantial waveguide loss, and the threshold current is reduced further. Further, the outer differential quantum efficiency is improved and the laser diode can produce high output optical power. In addition, the use of the real-refractive index waveguide structure reduces the astigmatism of the output optical beam, and a single peak beam spot is obtained. The laser diode causes an oscillation with the fundamental lateral mode when driven to produce a high output optical power.

Tenth Embodiment

Figure 19:
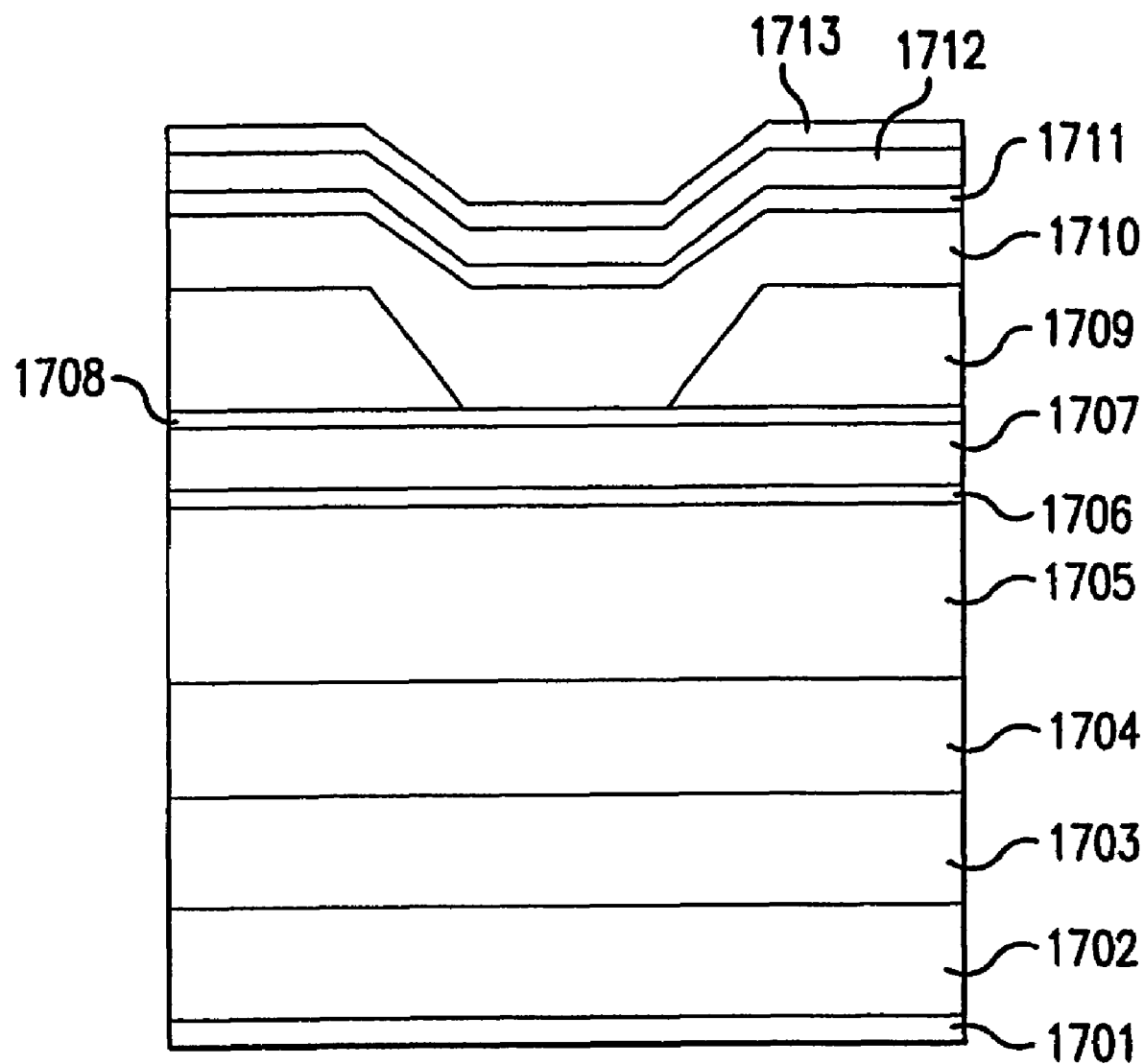
FIG. 19 is a diagram showing the construction of a laser diode according to a tenth embodiment of the present invention.

FIG. 19 shows the construction of a laser diode according to a tenth embodiment of the present invention.

Referring to FIG. 19, the laser diode is constructed on a substrate 1702 of n-type GaAs carrying thereon a composition-graded layer 1703 of n-type GaAsP having a composition represented as $GaAs_yP_{1-y}$, wherein the composition-graded layer 1703 is formed by an MOCVD process while changing the composition y continuously and gradually from 1 to 0.4. The growth process of the composition-graded layer 1703 is well established a smooth surface is realized by optimizing the composition gradient.

Next, a buffer layer 1704 of n-type GaAsP having a composition of $GaAs_{0.6}P_{0.4}$ is grown on the composition-graded layer 1703, and a cladding layer 1705 of n-type AlGaInAsP, an active layer 1706 of undoped GaInAsP, a first cladding layer 1707 of p-type AlGaInAsP, an etching stopper layer 1708 of p-type GaInAsP, and a current confinement layer 1709 of n-type AlGaInAsP, are grown consecutively on the buffer layer 1704 by an MOCVD process.

After the formation of the current confinement layer 1709, a resist film is deposited by a spin-coating process, followed by a photolithographic process to form a stripe window in correspondence to the region where injection of electric current is to be made, with a width of 10 μm.

Next, the current confinement layer 1709 is patterned by a chemical etching process while using the resist film thus formed as a mask, wherein the chemical etching process is conducted by using a hydrochloric acid etchant and continued until the etching stopper layer 1708 is exposed. As a result, a stripe groove is formed as represented in FIG. 19. As a result of the use of the etching stopper layer 1708, the depth of the stripe groove is controlled exactly.

Next, the resist mask is removed and a second cladding layer 1710 of p-type AlGaInAsP, a spike-elimination layer 1711 of p-type GaInP, and a contact layer 1712 of p-type GaAsP are grown consecutively on the current-blocking regions 1709 by a regrowth process so as to cover the etching stopper layer 1708 exposed at the stripe groove region.

Thereafter, the bottom surface of the substrate 1702 is polished and an n-type electrode 1701 is formed thereon by an evaporation deposition process. Further, a p-type electrode 1713 is deposited on the contact layer 1712. The electrodes 1701 and 1713 are subjected to an annealing process to form an ohmic contact, and the optical cavity of the laser diode is formed by cleaving the structure thus formed.

In the case of the laser diode of the illustrated example, the laser diode oscillated with the fundamental lateral mode at the wavelength of 635 nm.

It should be noted that the current-blocking regions 1709 contain As. Thus, there occurs no substantial formation of hillocks and a smooth and flat surface is obtained for the layer 1709 and the layers grown thereon. Thereby, the problem of leakage current induced by hillocks is effectively eliminated. Further, the problem of optical loss associated with the hillocks in the optical waveguide region is eliminated.

In the present invention, it should be noted that the GaInAsP etching stopper 1708 has a lattice-matching composition in which the etching stopper layer 1708 achieves lattice matching with the substrate. At this lattice-matching composition, the GaInAsP etching stopper layer 1708 has a bandgap energy of about 2.0 eV, while this value of bandgap energy exceeds the photon energy of the laser oscillation radiation. Further, in view of the fact that the etching stopper layer 1708 achieves lattice matching, there occurs no limitation with regard to the thickness of the etching stopper layer 1708, and a desirable large process margin can be secured for the etching process, by using a large thickness for the etching stopper layer 17.

By providing the etching stopper layer 1708, it becomes possible to continue the etching process to the active layer 1706 or the region in the vicinity of the active layer 1706, without causing over-etching of the active layer 1706.

The laser diode of the present embodiment has an advantageous feature in that the effect of non-optical recombination center such as surface state is minimized because of the excellent quality of the crystal layers constituting the laser diode and excellent efficiency of laser oscillation is realized. Further, device-to-device variation of the laser characteristic is also minimized. It should be noted that the first cladding layer 1707 of AlGaInAsP is covered by the p-type GaAsP etching stopper layer 1708. Thus, the first cladding layer 1707 remains intact even when the etching process is conducted. Thus, the surface of the first cladding layer 1707 is free from surface oxidation or damages, and the current-blocking layer 1709 is grown thereon with excellent quality.

Eleventh Embodiment

Figure 20:
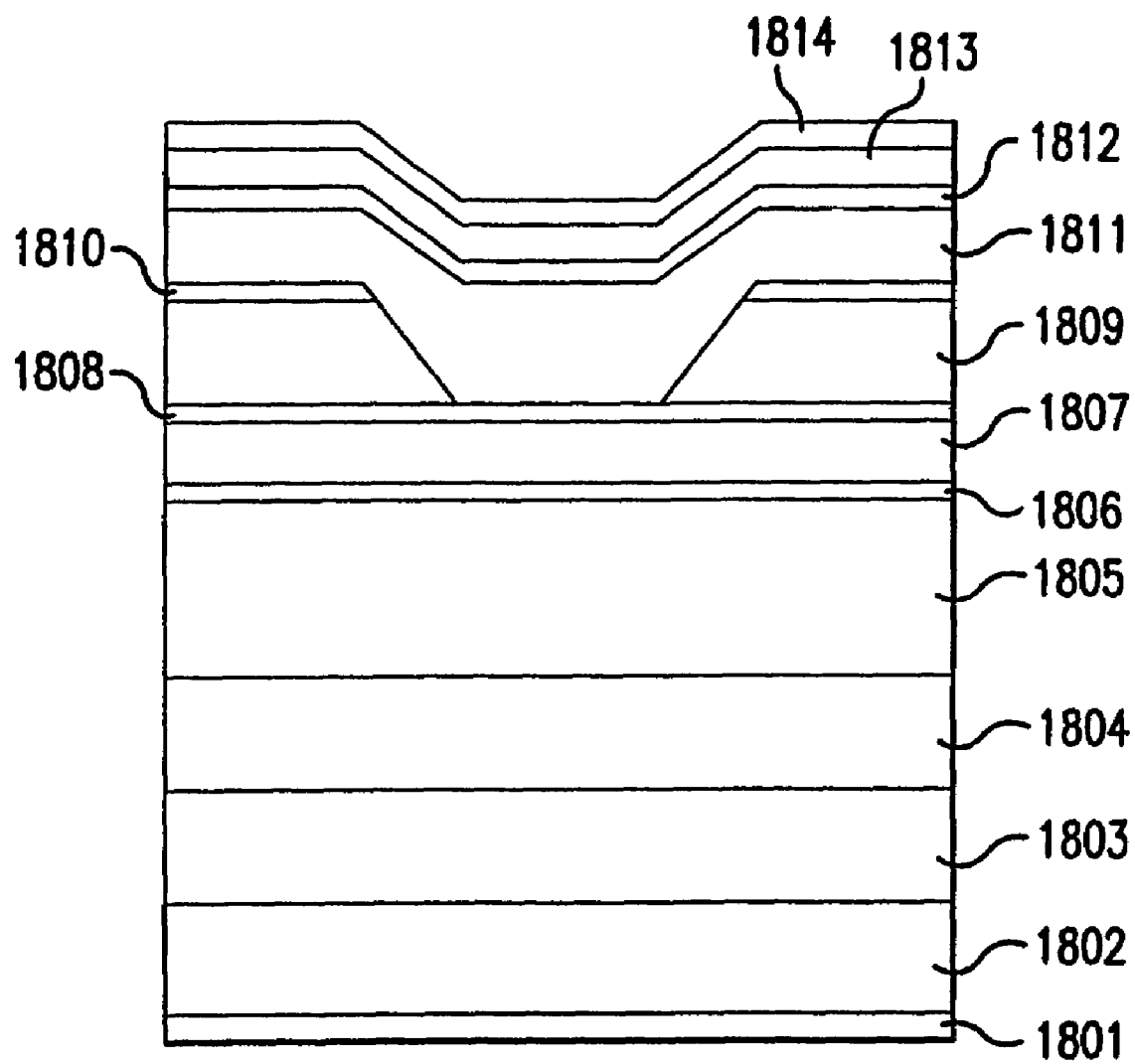
FIG. 20 is a diagram showing the construction of a laser diode according to an eleventh embodiment of the present invention.

FIG. 20 shows the construction of a laser diode according to an eleventh embodiment of the present invention.

Referring to FIG. 20, the laser diode is constructed on a substrate 1802 of n-type GaAs carrying thereon a composition-graded layer 1803 of n-type GaAsP having a composition represented as $GaAs_yP_{1-y}$, wherein the composition-graded layer 1803 is formed by an MOCVD process while changing the composition y continuously and gradually from 1 to 0.4. The growth process of the composition-graded layer 1803 is well established a smooth surface is realized by optimizing the composition gradient.

Next, a buffer layer 1804 of n-type GaAsP having a composition of $GaAs_{0.6}P_{0.4}$ is grown on the composition-graded layer 1803, and a cladding layer 1805 of n-type AlGaInAsP, an active layer 1806 of undoped GaInAsP, a first cladding layer 1807 of p-type AlGaInAsP, an etching stopper layer 1808 of p-type GaInAsP, a current confinement layer 1809 of n-type AlGaInAsP, and further an oxidation-prevention layer 1810 of p-type GaInP, are grown consecutively on the buffer layer 1804 by an MOCVD process.

After the formation of the oxidation-prevention layer 1810, a resist film is deposited by a spin-coating process, followed by a photolithographic process to form a stripe window in correspondence to the region where injection of electric current is to be made, with a width of 10m.

Next, the oxidation-prevention layer 1810 of GaInP and the underlying current-blocking layer 1809 of AlInAsP are patterned by a chemical etching process while using the resist film thus formed as a mask, wherein the chemical etching process is conducted by using a hydrochloric acid etchant and is continued until the etching stopper layer 1808 is exposed. As a result, a stripe groove is formed as represented in FIG. 20.

In the foregoing patterning process, the GaInP oxidation-prevention layer 1810 and the AlInAsP current-blocking layer 1809 are patterned selectively with respect to the GaAsP etching stopper layer 1808 by using a hydrochloric acid etchant, and a pair of current-blocking regions 1809 are formed from the current-blocking layer 1809.

Next, the resist mask is removed and a second cladding layer 1811 of p-type AlGaInAsP, a spike-elimination layer 1812 of p-type GaInP, and a contact layer 1813 of p-type GaAsP are grown consecutively on the current-blocking regions 1809 by a regrowth process so as to cover the etching stopper layer 1808 exposed at the stripe groove region.

Thereafter, the bottom surface of the substrate 1802 is polished and an n-type electrode 1801 is formed thereon by an evaporation deposition process. Further, a p-type electrode 1813 is deposited on the contact layer 1812. The electrodes 1801 and 1813 are subjected to an annealing process to form an ohmic contact, and the optical cavity of the laser diode is formed by cleaving the structure thus formed.

In the case of the laser diode of the illustrated example, the laser diode oscillated with the fundamental lateral mode at the wavelength of 630 nm.

It should be noted that the current-blocking regions 1809 contain As. Thus, there occurs no substantial formation of hillocks and a smooth and flat surface is obtained for the layer 1809 and the layers grown thereon. Thereby, the problem of leakage current induced by hillocks is effectively eliminated. Further, the problem of optical loss associated with the hillocks in the optical waveguide region is eliminated.

In the present embodiment, it should further be noted that the surface oxidation of the AlInAsP current-blocking layer 1809 is eliminated by the oxidation-prevention layer 1810, and the second cladding layer 1811 is grown thereon with excellent quality. Thus, the laser diode of the present embodiment shows little aging and operates reliably over a long time.

Twelfth Embodiment

Figure 21:
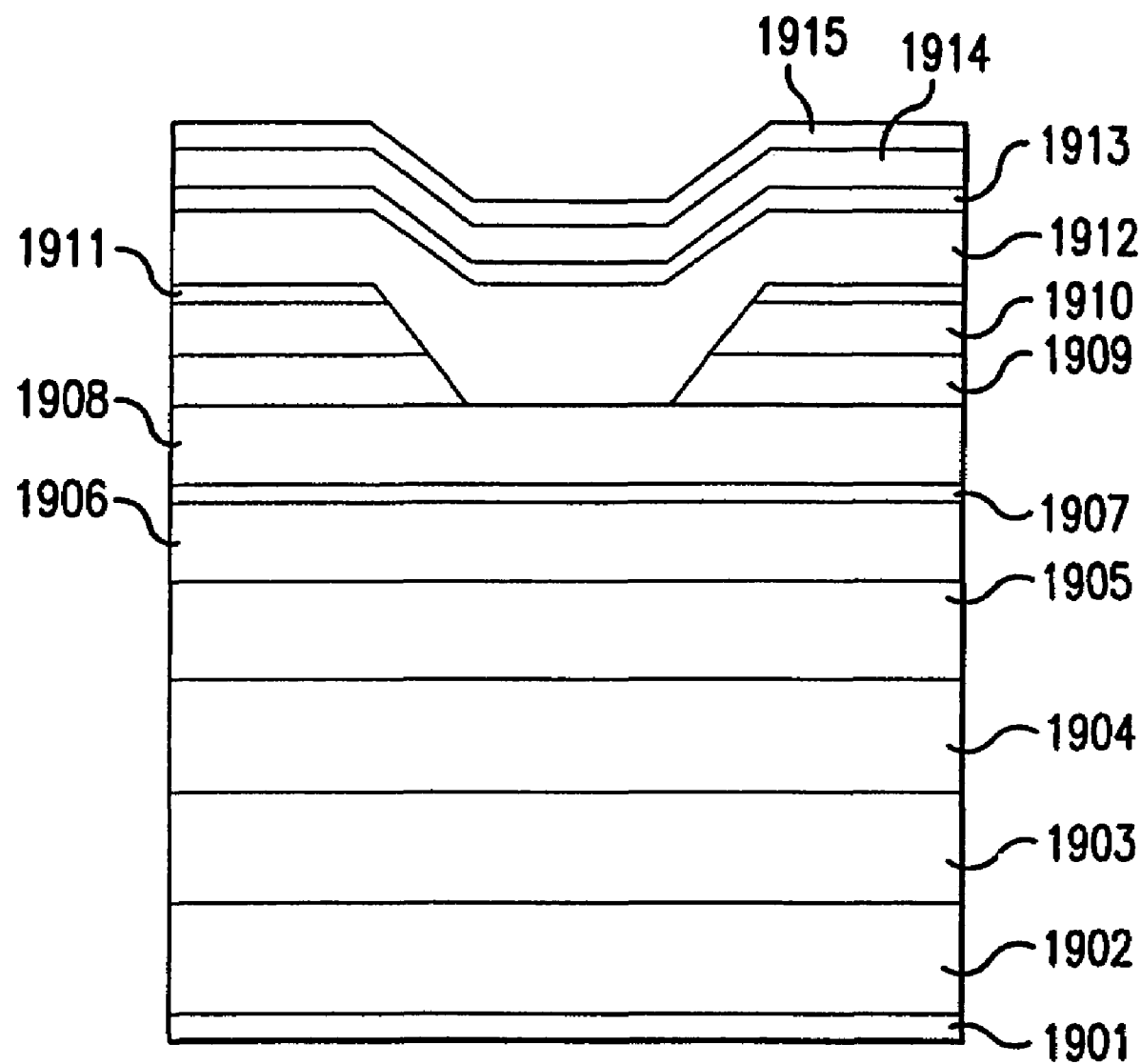
FIG. 21 is a diagram showing the construction of a laser diode according to a twelfth embodiment of the present invention.

FIG. 21 shows the construction of a laser diode according to a twelfth embodiment of the present invention.

Referring to FIG. 21, the laser diode is constructed on a substrate 1902 of n-type GaAs carrying thereon a composition-graded layer 1903 of n-type GaAsP having a composition represented as $GaAs_yP_{1-y}$, wherein the composition-graded layer 1903 is formed by an MOCVD process while changing the composition y continuously and gradually from 1 to 0.4. The growth process of the composition-graded layer 1903 is well established a smooth surface is realized by optimizing the composition gradient.

Next, a buffer layer 1904 of n-type GaAsP having a composition of $GaAs_{0.6}P_{0.4}$ is grown on the composition-graded layer 1903, and a cladding layer 1905 of n-type AlGaInAsP, an optical waveguide layer 1906 of undoped GaInP, an active layer 1907 of undoped GaInAsP, an optical waveguide layer 1908 of undoped GaInP, a first current-blocking layer 1909 of p-type AlGaInAsP, a second current-blocking layer 1910 of n-type AlGaInAsP, and an oxidation-prevention layer 1911 of p-type GaInP, are grown consecutively on the buffer layer 1904 by an MOCVD process.

After the formation of the oxidation-prevention layer 1911, a resist film is deposited by a spin-coating process, followed by a photolithographic process to form a stripe window in correspondence to the region where injection of electric current is to be made, with a width of 10 μm.

Next, the oxidation-prevention layer 1911 of GaInP and the underlying current-blocking layers 1910 and 1909 of AlInAsP are patterned by a chemical etching process while using the resist film thus formed as a mask similarly to the previous embodiment, wherein the chemical etching process is conducted until the optical waveguide layer 1908 is exposed. As a result, a stripe groove is formed as represented in FIG. 21. Thereby, the optical waveguide layer 1908 functions as an etching stopper.

Next, the resist mask is removed and a second cladding layer 1912 of p-type AlGaInAsP, a spike-elimination layer 1913 of p-type GaInP, and a contact layer 1914 of p-type GaAsP are grown consecutively on the oxidation-prevention layer 1911 by a regrowth process so as to cover the optical waveguide layer 1908 exposed at the stripe groove region.

Thereafter, the bottom surface of the substrate 1902 is polished and an n-type electrode 1901 is formed thereon by an evaporation deposition process. Further, a p-type electrode 1915 is deposited on the contact layer 1914. The electrodes 1901 and 1915 are subjected to an annealing process to form an ohmic contact, and the optical cavity of the laser diode is formed by cleaving the structure thus formed.

In the case of the laser diode of the illustrated example, the laser diode oscillated with the fundamental lateral mode at the wavelength of 630 nm.

It should be noted that the current-blocking regions 190.9 and 1910 contain As. Thus, there occurs no substantial formation of hillocks and a smooth and flat surface is obtained for the layers 1909 and 1910 and the layers grown thereon. Thereby, the problem of leakage current induced by hillocks is effectively eliminated. Further, the problem of optical loss associated with the hillocks in the optical waveguide region is eliminated.

Further, in view of the fact that the layer adjacent to the active layer is free from Al, non-optical recombination of carriers is suppressed and the threshold current of laser oscillation is reduced. In view of the fact that the region of the laser diode where there is formed strong optical radiation is free from Al, the number of surface states at the cavity edge surface is reduced and the optical damaging at the optical cavity edge surface is minimized.

In the foregoing embodiments a description was made with regard to the laser diode structure constructed on a graded GaAsP layer formed on a GaAs substrate. However, it is possible to construct the laser diode on a GaP substrate or GaAsP substrate. Further, a composition-graded layer of GaInP may be used in place of the GaAsP composition graded layer. Further, the composition-graded layer may be formed by a process other than a vapor phase epitaxial process.

Thirteenth Embodiment

Figure 22:
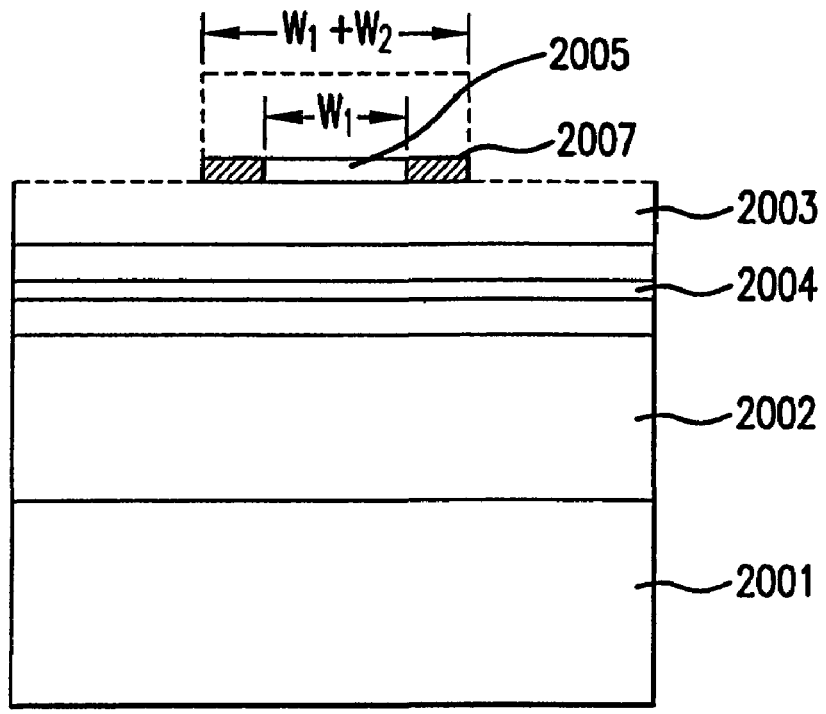
FIG. 22 is a diagram showing the construction of a laser diode according to a thirteenth embodiment of the present invention.

FIG. 22 shows the construction a semiconductor light-emitting device according to a thirteenth embodiment of the present invention.

Referring to FIG. 22, the semiconductor light-emitting device is constructed on a semiconductor substrate 2001 and includes an active layer 2004 emitting optical radiation and semiconductor layers 2002 and 2003 having a bandgap larger than a bandgap of the active layer and a lattice constant intermediate between a lattice constant of GaP and a lattice constant of GaAs, wherein the semiconductor layers 2002 and 2003 are formed so as to vertically sandwich the active layer 2004.

In the semiconductor light-emitting device of FIG. 22, the semiconductor layer 2003 includes, in a part thereon, a layer 2005 having a composition represented as $Al_xGa_yIn_{1-x-y}P_tAs_{1-t}$ ($0.8 \leq x \leq 1$, $0 \leq y \leq 0.2$, $0 \leq t \leq 1$), wherein a part of the layer 2005 is converted into oxidized regions 2007 as a result of selective oxidation.

In the semiconductor light-emitting device of FIG. 22, the foregoing oxidized regions 2007 become an insulator, and thus, the semiconductor layer 2005 functions as a current-confinement structure. As the oxidized regions 2007 have a reduced refractive index, there occurs a refractive index step between the unoxidized part of the semiconductor layer 2005 and the oxidized regions 2007. As a result, there emerges a real-refractive index waveguide structure suitable for lateral mode control.

Further, the structure of FIG. 22 is suitable for increasing the output power in view of the fact that the waveguide, structure in the vicinity of the active layer 2004 is formed of a material free from waveguide loss.

It should be noted that, in the prior art device, it has been necessary to realize such a real-waveguide structure by using a buried structure, which requires a number of crystal growth processes. Contrary to the prior art, the structure of FIG. 22 can be formed by a single crystal growth process. Thereby, the semiconductor light-emitting device of the present embodiment can be formed easily with high yield of production.

Fourteenth Embodiment

Figure 23:
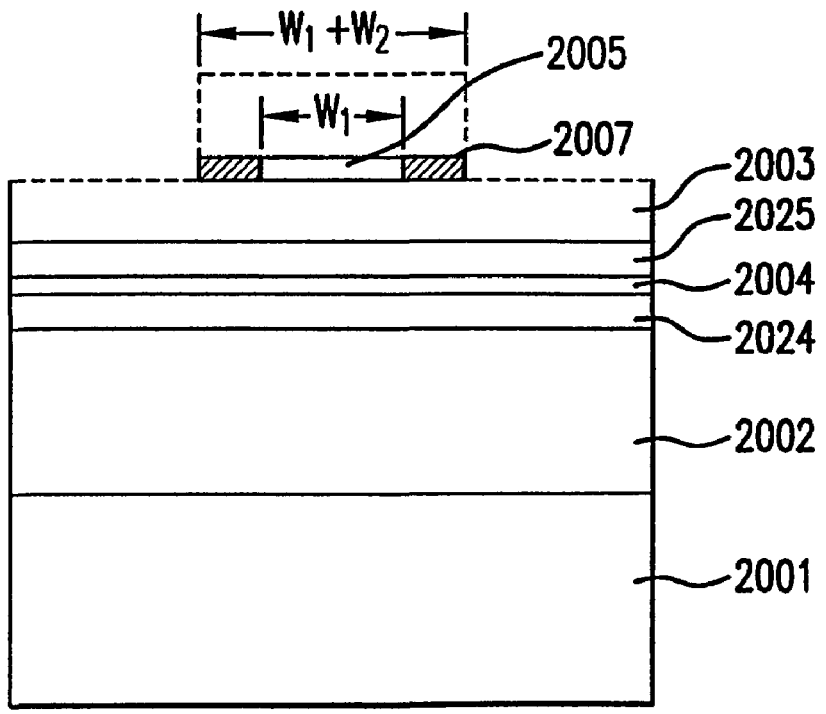
FIG. 23 is a diagram showing the construction of a laser diode according to a fourteenth embodiment of the present invention.

FIG. 23 shows the construction of a semiconductor light-emitting device according to a fourteenth embodiment of the present invention, wherein those parts corresponding to the parts described with reference to, FIG. 22 are designated by the same reference numerals and the description thereof will be omitted.

Referring to FIG. 23, the semiconductor light-emitting device has a structure similar to that of the device of FIG. 22 except that the active layer 2004 is formed of a single quantum well structure or a multiple quantum well structure and that the active layer 2004 is vertically sandwiched by a pair of optical waveguide layers 2024 and 2025 having a composition represented as $(Al_zGa_{1-z})_yIn_{1-\gamma}P_uAs_{1-u}$ ($0 \leq z < 1$, $0.5 < \gamma < 1$, $0 < u \leq 1$), wherein the active layer 2004 has a composition represented as $(Al_{x1}Ga_{1-x1})_{\alpha 1}In_{1-\alpha 1}P_{t1}As_{1-t1}$ ($0 \leq x1 < 1$, $0 < \alpha_1 1$, $0 \leq t_1 \leq 1$) when formed of a 5 single quantum well. When the active layer 2004 is formed of a multiple quantum well structure, on the other hand, the active layer 2004 is formed of alternate stacking of a quantum well layer of the foregoing composition and a barrier layer of a lo composition represented as $(Al_{x2}Ga_{1-x2})_{\alpha 2}In_{1-\alpha 2}P_{t2}As_{1-t2}$ ($0 \leq x_2 < 1$, $0.5 < \alpha_2 \leq 1$, $0 \leq t_2 \leq 1$). Further, each of the cladding layers 2002 and 2003 has a composition represented as $(Al_yGa_{1-y})_\beta In_{1-\beta}P_vAs_{1-v}$ ($0 < y \leq 1$, $0.5 < \beta < 1$, $0 < v \leq 1$), wherein the composition of the cladding 15 layers 2002 and 2003 is set such that the cladding layers 2002 and 2003 have a bandgap larger than a bandgap of the active layer 2004 and a lattice constant between GaP and GaAs. The composition of the optical waveguide layers 2024 and 2025 is set such 20 that the optical waveguide layers 2024 and 2025 have a bandgap larger than the bandgap of the active layer 2004 but smaller than the bandgap of the cladding layers 2002 and 2003.

Figure 24:
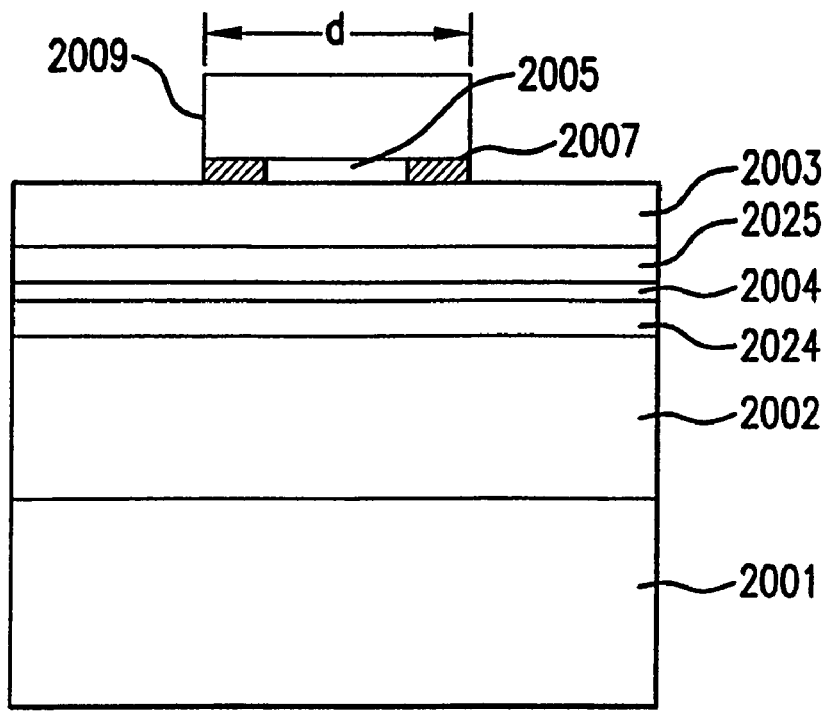
FIG. 24 is a diagram showing the construction of a laser diode according to a fifteenth embodiment of the present invention.

In the construction of FIG. 23 or 24, it should be noted that the semiconductor light-emitting device includes, in one of the cladding layers 2002 and 2003 (layer 2003 in the example of FIG. 23), or between one of the cladding layers 2002 or 2003 (layer 2003 in the example of FIG. 24) and the active layer 2004, a semiconductor layer 2005 having a composition represented as $Al_xGa_yIn_{1-x-y}P_tAs_{1-t}$ ($0.8 \leq x \leq 1$, $0 \leq y \leq 0.2$, $0 \leq t \leq 1$) is provided in such a manner that a part of the layer 2005 is selectively oxidized to form oxidized regions 2007.

In the case of the device of FIG. 23, the active layer 2004, having the composition of $(Al_{x1}Ga_{1-x1})_{\alpha 1}In_{1-\alpha 1}P_{t1}As_{1-t1}$ ($0 \leq x_1 < 1$, $0 < \alpha_1 1$, $0 \leq t_1 \leq 1$), is capable of emitting visible wavelength radiation. Further, the cladding layers 2002 and 2003, having the lattice constant between GaP and GaAs and the composition represented as $(Al_yGa_{1-y})_\beta In_{1-\beta}P_vAs_{1-v}$ ($0 < y \leq 1$, $0.5 < \beta < 1$, $0 < v \leq 1$), have a bandgap larger than the bandgap realized by a material formed on a GaAs substrate, and the device of FIG. 23 is suitable for producing short wave optical radiation.

Further, in view of the fact that the optical waveguide layers 2024 and 2025 of the composition $(Al_zGa_{1-z})_y In_{1-y}P_uAs_{1-u}$ ($0 \leq z < 1$, $0.5 < y < 1$, $0 < u \leq 1$) form an SCH structure together with the active layer of the composition $(Al_xGa_{1-x})_\alpha In_{1-\alpha} P_tAs_{1-t}$ ($0 \leq x < 1$, $0 < \alpha \leq 1$, $0 \leq t \leq 1$), the device of FIG. 23 can realize a wide bandgap with a reduced Al content for the optical waveguide layers 2024 and 2025, and the electric current caused as a result of non-optical recombination or carriers or surface recombination of carriers is reduced. As a result, the efficiency of optical emission is improved. In the case the device is a laser diode, the problem of degradation of the optical cavity edge is reduced and the laser diode becomes operable under high-output power condition. In the construction of FIG. 23, it is also possible to introduce strain into the cladding layer. Further, it is possible to reduce the bandgap of the cladding layers as compared with prior art devices.

It should be noted that a mixed crystal of GaInP increases the lattice constant and decreases the bandgap with decreasing Ga content. According to the estimation by Sandip, et al., Appl. Phys. Lett. 60, 1992, pp. 630-362 with regard to the band discontinuity, the band discontinuity increases primarily on the conduction band while there occurs no substantial change on the valence band. More specifically, the change of band structure for the valence band is small even when the composition of the GaInP mixed crystal is changed. Further, there is a tendency that the conduction band energy increases when Al is added to a GaInP mixed crystal. At the same time, the valence band energy is decreased. Thereby, the magnitude of change of energy is much larger in the valence band than in the conduction band energy. In relation to this situation, there has been a drawback in a conventional semiconductor light-emitting device constructed on a GaAs substrate in that, while there is formed a large band discontinuity on the conduction band, the band discontinuity on the valence band is not sufficient for effective carrier confinement.

The device structure of FIG. 23 is advantageous with this regard in that a large band discontinuity is secured for the conduction band due to the decrease of the Al content in the optical waveguide layers 2024 and 2025. Thereby, the problem of electron overflowing, which has been a major problem in red-wavelength laser diodes of the system of AlGaInP, is reduced substantially.

Further, as a result of formation of the insulating regions 2007, caused by the selective oxidation of the layer 2005 of $Al_xGa_yIn_{1-x-y}P_tAs_{1-t}$ ($0.8 \leq x \leq 1$, $0 \leq y \leq 0.2$, $0 \leq t \leq 1$) containing a high concentration Al, there is formed a current-confinement structure by the insulating regions 2007 and the remaining part of the layer 2005 having the composition of $Al_xGa_yIn_{1-x-y}P_tAs_{1-t}$ ($0.8 \leq x \leq 1$, $0 \leq y \leq 0.2$, $0 \leq t \leq 1$). In view of the fact that the selectively oxidized insulating regions 2007 have a refractive index smaller than the refractive index of the remaining part of the layer 2005 of the composition $Al_xGa_yIn_{1-x-y}P_tAs_{1-t}$ ($0.8 \leq x \leq 1$, $0 \leq y \leq 0.2$, $0 \leq t \leq 1$), there is a lateral diffraction index step formed in correspondence to the remaining part of the layer 2005, and there is formed a refractive-index J waveguide structure that can be used for controlling the lateral mode. It should be noted that the part of the device in the vicinity of the active layer 2004 and constituting the waveguide structure is formed of a material free from waveguide loss. Thus, the device of the present embodiment is suitable for producing a high optical output power. Conventionally, such an optical waveguide structure free from optical loss has to be formed by repeating a number of crystal growth steps. In the case of the present invention, on the other hand, it is possible to form the desired waveguide structure in a single crystal growth process.

In the semiconductor light-emitting device of FIG. 22 or FIG. 23, it should be noted that the substrate 2001 is formed of GaAsP, and the semiconductor layer 2005 of the composition represented as $Al_xGa_yIn_{1-x-y}P_tAs_{1-t}$ ($0.8 \leq x \leq 1$, $0 \leq y \leq 0.2$, $0 \leq t \leq 1$) achieves lattice matching with the substrate 2001. It should be noted that such a GaAsP substrate 2001 can be formed by growing a GaPAs graded layer having a lattice constant between GaP and GaAs on one of a GaAs substrate or a GaP substrate by an epitaxial process such as a vapor phase epitaxial process with a large thickness such as 50 μm such that the GaPAs composition changes gradually in the graded layer. By controlling the composition of the graded layer such that the lattice constant at the top part of the graded layer becomes identical with the lattice constant of the heterojunction part (at least the cladding layer 2002), it becomes possible to form a heteroepitaxial system without inducing the problem of lattice misfit.

There is a tendency that the oxidation rate of the semiconductor layer 2005 of the composition $Al_xGa_yIn_{1-x-y}P_tAs_{1-t}$ ($0.8 \leq x \leq 1$, $0 \leq y \leq 0.2$, $0t \leq 1$) becomes small when the thickness of the layer 2005 is small. Associated therewith, there is a possibility that the insulator regions 2007 may be too small for an effective current-blocking layer. In the present invention, in which the layer 2005 of the composition $Al_xGa_yIn_{1-x-y}P_tAs_{1-t}$ ($0.8 \leq x \leq 1$, $0 \leq y \leq 0.2$, $0 \leq t \leq 1$) achieves a lattice matching with the GaAsP substrate 2001, it becomes possible to form the layer 2005 with a sufficient thickness. Thereby, a sufficient oxidation rate is secured for the layer 2005 and the throughput of device fabrication process can be increased.

In the device of FIG. 22 or FIG. 23, it is possible to use a GaAs substrate for the substrate 2001. In this case, the active layer 2004 is sandwiched by semiconductor layers that have a lattice matching composition with GaAs.

In the case of using GaAs for the substrate 2001, it is possible to use AlAs for the layer 2005. In this case, however, there arises a problem, due to the fact that the AlAs layer accumulates a compressive strain of about 0.14%, that the active layer 2004 may be subjected to an adversary effect. By using the composition of $Al_xGa_yIn_{1-x-y}P_tAs_{1-t}$ ($0.8 \leq x \leq 1$, $0 \leq y \leq 0.2$, $0 \leq t \leq 1$) for the semiconductor layer 2005, it is possible to achieve a lattice matching with the GaAs substrate and the effect of strain is eliminated.

In the semiconductor light-emitting device of FIG. 22 or 23, the layer 2005 of the foregoing composition $Al_xGa_yIn_{1-x-y}P_tAs_{1-t}$ ($0.8 \leq x \leq 1$, $0 \leq y \leq 0.2$, $0 \leq t \leq 1$) is left unoxidized for the region having a width w1 as the current path of the device, wherein the width w1 is set such that a ratio of w1 with respect to a quantity defined as the sum of the width w1 and the total width, represented as w2, of the oxidized regions 2007 (w1/(w1+w2)) is equal to or smaller than 0.6. When the foregoing ratio is larger than 0.6, the light-emission can be caused in the region close to the edge of a ridge structure, provided that such a ridge structure is formed in the device as represented by a broken line in FIG. 22 or 23. Thereby, there can occur a waveguide loss as a result of fluctuation of the edge width. When the foregoing ratio w1/(w1+w2) is smaller, the effect of the edge width fluctuation is reduced and the device can operate with a larger optical output power.

Fifteenth Embodiment

FIG. 24 shows the construction of a semiconductor light-emitting device according to a fifteenth embodiment of the present invention, wherein those parts corresponding to the parts described previously with reference to FIGS. 22 and 23 are designated by the same reference numerals and the description thereof will be omitted.

Referring to FIG. 24, the semiconductor light-emitting device of the present embodiment has a construction similar to that of the device of FIG. 22 or 23, except that there is formed a ridge structure 2009 having a width d as a part of the cladding layer 2003 locating above the semiconductor layer 2005 of the composition represented as $Al_xGa_yIn_{1-x-y}P_tAs_{1-t}$ ($0.8 \leq x \leq 1$, $0 \leq y \leq 0.2$, $0 \leq t \leq 1$). In the illustrated example, the width d of the ridge structure 2009 is set equal to or larger than 10 μm.

In the construction of FIG. 24, in view of the fact that there is provided the selectively oxidized regions 2007 underneath the ridge structure 9, the ridge structure 9 itself can be formed with an increased with without deteriorating the current confinement taking place in the device. Because of the increased size of the ridge structure 9, it is possible to form a electrode thereon with large contact area, without providing a thermally insulating dielectric film. Thereby, the differential resistance of the device is minimized. Further, the structure is suitable for employing a junction-down mounting structure. In this case, the heat of the device is easily dissipated to a mounting substrate on which the device of FIG. 24 is flip-chip mounted.

Sixteenth Embodiment

Figure 25:
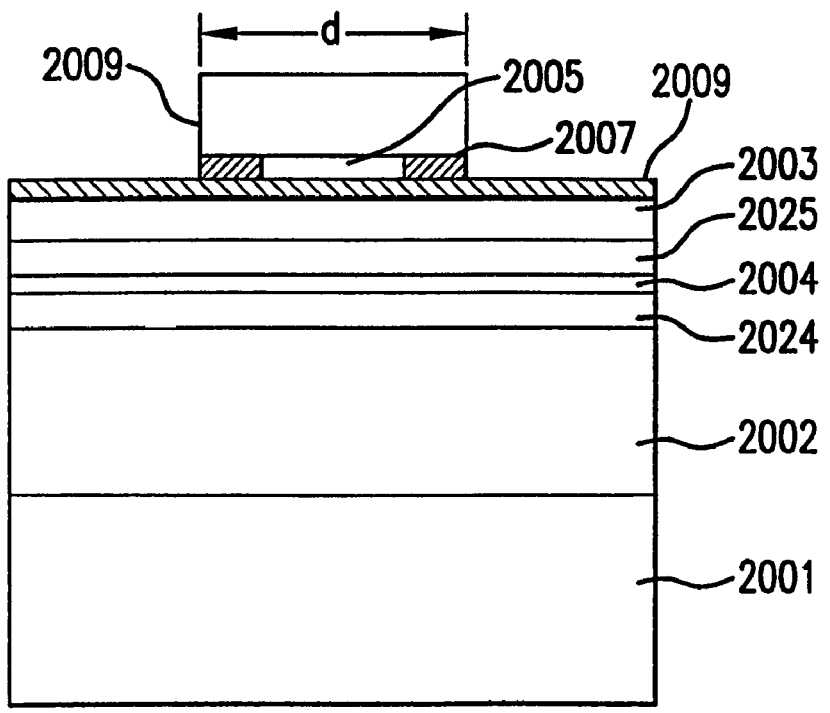
FIG. 25 is a diagram showing the construction of a laser diode according to a sixteenth embodiment of the present invention.

FIG. 25 shows the construction of a light-emitting semiconductor device according to a sixteenth embodiment of the present invention, wherein those parts corresponding to the parts described previously are designated by the same reference numerals and the description thereof will be omitted.

Referring to FIG. 25, the light-emitting semiconductor device has a construction similar to the device of FIG. 24 except that there is provided an etching stopper layer 2029 having a composition represented as $Ga_yIn_{1-y}P_tAs_{1-t}$ ($0 < y \leq 1$, $0 \leq t \leq 1$) underneath the semiconductor layer 2005 of the composition $Al_xGa_yIn_{1-x-y}P_tAs_{1-t}$ ($0.8 \leq x \leq 1$, $0 \leq y \leq 0.2$, $0 \leq t \leq 1$). By providing the etching stopper layer 2029, it becomes possible to control the height of the ridge structure 2009 exactly. Thereby, the fabrication of the semiconductor device is substantially facilitated.

In any of the foregoing embodiments of FIGS. 22-25, the layer 2005 of the composition $Al_xGa_yIn_{1-x-y}P_tAs_{1-t}$ ($0.8 \leq x \leq 1$, $0 \leq y \leq 0.2$, $0 \leq t \leq 1$) may actually have a composition of $AlP_tAs_{1-t}$ ($0 \leq t \leq 1$). In this case, Al is the only group III elements constituting the layer 2005. In view of the increased oxidation rate of the AlGaInPAs system, which is extremely sensitive to the Al content therein, it becomes possible to reduce the time needed for fabricating the semiconductor light-emitting device by using the AlPAs for the semiconductor layer 2005. In the case other layers, such as the cladding layer, contain Al with high concentration in view of the need of increasing the bandgap, such layer may also be oxidized together with the layer 2005 when the Al content in the layer 2005 is close to the Al content in such a widegap layer. Thus, the use of the $AlP_tAs_{1-t}$ ($0 \leq t \leq 1$) composition is advantageous for forming a current-blocking structure, by way of selective oxidation.

Sixteenth Embodiment

Figure 26:
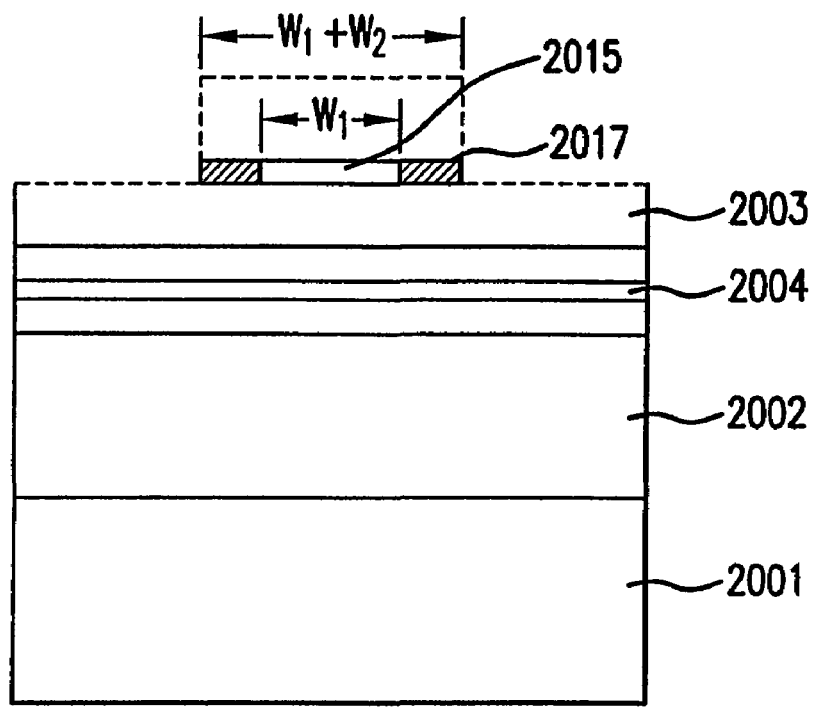
FIG. 26 is a diagram showing the construction of a laser diode according to a seventeenth embodiment of the present invention.

FIG. 26 shows the construction of a semiconductor light-emitting device according to a seventeenth embodiment of the present invention.

Referring to FIG. 26, the semiconductor light-emitting device has a structure similar to that of the device of FIG. 23 or FIG. 24 in that the active layer 2004 is vertically sandwiched by the cladding layers 2002 and 2003.

In the structure of FIG. 26, it should be noted that a part of the cladding layer 2003 includes a layer 2015 of AlGaInAs having a composition represented as $Al_xGa_yIn_{1-x-y}As$ ($0.8 \leq x \leq 1$, $0 \leq y \leq 0.2$), and a part of the layer 2015 is oxidized selectively to form a pair of insulator regions 2017, such that the insulator regions 2017 laterally sandwich an unoxidized region of the layer 2015 therebetween with the width of w1. Thereby, the width w1 is set such that the ratio w1(w1+w2) is equal to or smaller than 0.6.

In the present embodiment, too, it should be noted that the materials in the vicinity of the active layer 2004 are free from optical absorption with regard to the wavelength of the optical radiation produced as a result of laser oscillation, and the semiconductor light-emitting device can be produce a large output optical power.

Similarly to the embodiment of FIG. 22 or 23, there arises the problem of optical waveguide loss in the structure of FIG. 26 when the foregoing ratio w1/(w1+w2) is larger than 0.6 due to the fluctuation of edge width of the ridge structure, provided that a ridge structure is formed on the cladding layer 2003 as represented by a broken line in FIG. 26. By setting the ratio w1/(w1+w2) to be equal to or smaller than 0.6, the forgoing problem of optical waveguide loss is successfully eliminated.

Eighteenth Embodiment

Figure 27:
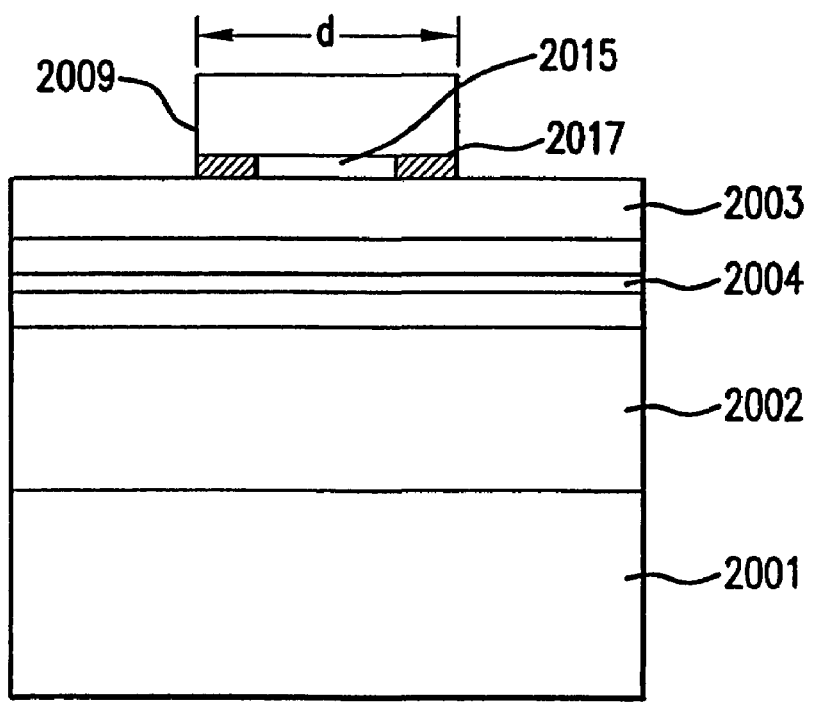
FIG. 27 is a diagram showing the construction of a laser diode according to an eighteenth embodiment of the present invention.

FIG. 27 shows the construction of a semiconductor light-emitting device according to an eighteenth embodiment of the present invention, wherein those parts corresponding to the parts described previously are designated by the same reference numerals and the description thereof will be omitted.

Referring to FIG. 27, the semiconductor light-emitting device has a structure similar to the device of FIG. 24 in that the ridge structure 2009 is formed on the structure of FIG. 26. Thereby, the ridge structure 2009 is formed so as to cover the semiconductor layer 2015 including the insulator regions 2017 with a width d set such that the width d exceeds 10 μm.

In the present embodiment in which the semiconductor layer 2015 is free from P, an effective current confinement is achieved. Thus, it becomes possible to increase the width d of the ridge structure 2009 and a large contact area is secured for the electrode provided on the ridge structure 2009. Further, in view of the fact that use of insulating film is not necessary in the device of the present embodiment, the differential resistance of the device is reduced. In view of the increased electrode area, the structure of FIG. 27 is suitable for flip-chip mounting on a support substrate, wherein such a flip-chip mounting is advantageous due to improved efficiency of heat dissipation.

Nineteenth Embodiment

Figure 28:
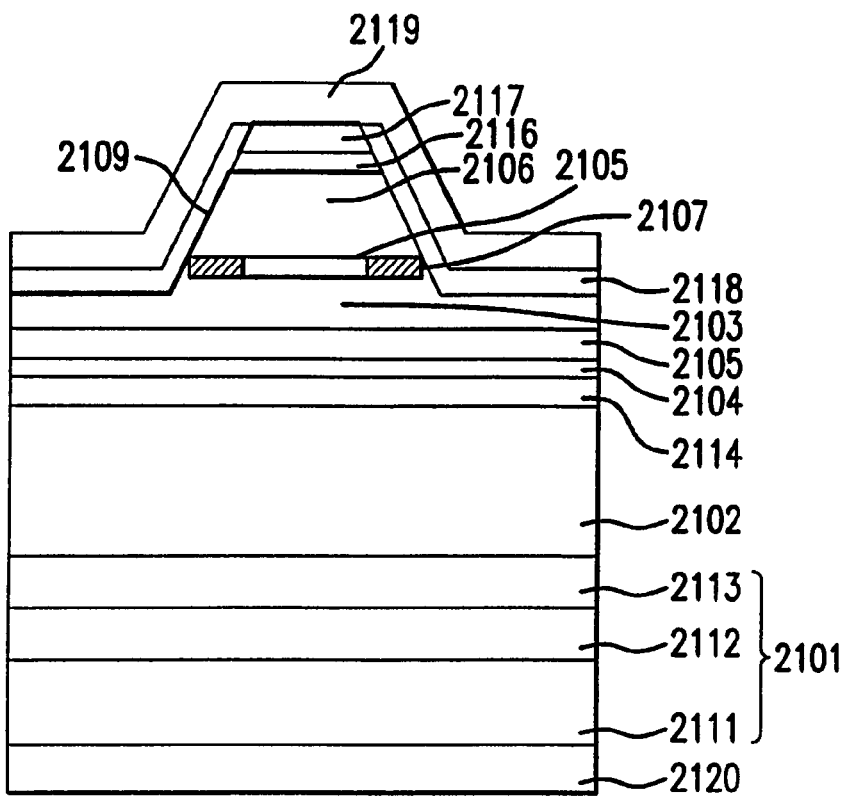
FIG. 28 is a diagram showing the construction of a laser diode according to a nineteenth embodiment of the present invention.

FIG. 28 shows the construction of a semiconductor light-emitting device according to a nineteenth embodiment of the present invention, wherein the device of FIG. 28 is actually a laser diode having an SCH-QW structure.

Referring to FIG. 28, the laser diode is constructed on a GaAs offset-substrate 2111 having an inclined principal surface inclined from the (100) surface in the [110] direction with an offset angle of 2°.

On the substrate 2111, there is formed a composition-graded layer 2112 of n-type GaPAs by a vapor phase epitaxial process such that the P content increases gradually from 0 to 0.4. Thus, the GaPAs composition-graded layer 2112 has a composition of $GaP_{0.4}As_{0.6}$ on the top part thereof. On the composition-graded layer 2112, a GaPAs layer 2113 having the foregoing composition of $GaP_{0.4}As_{0.6}$ is formed such that the total thickness of the layers 2112 and 2113 becomes about 50 μm. The layers 2112 and 2113 form, together with the GaAs substrate 2111, a GaPAs epitaxial substrate 2101. Alternatively a GaP substrate may be used in place of the GaAs substrate 2111. Generally, a GaPAs substrate includes an epitaxial layer of GaPAs on a GaAs or GaP substrate with a thickness of 30 μm or more. At the surface of the GaPAs layer, the lattice misfit is sufficiently relaxed, and thus, the substrate 2101 formed of the GaAs substrate 2111 and the GaPAs layers 2112 and 2113 can be regarded as a single GaPAs ternary substrate.

On the GaPAs substrate 2101, a cladding layer 2102 of n-type AlGaInPAs having a composition represented as $(Al_yGa_{1-y})_\beta In_{1-\beta}P_vAs_{1-v}$ (y=0.5, β=0.8, v=0.85) is formed by an MOCVD process with a thickness of 1 μm, wherein the cladding layer contains As and has the composition set so as to achieve lattice matching with the $GaP_{0.4}As_{0.6}$ substrate 2101.

On the cladding layer 2102, there is formed an optical waveguide layer 2114 of p-type AlGaInPAs having a composition represented as $(Al_zGa_{1-z})_\gamma In_{1-\gamma}P_uAs_{1-u}$ (z=0.1, γ=0.7, u=1) by an MOCVD process with a thickness of 0.1 μm, and a single quantum-well active layer 2104 of AlGaInPAs is formed on the optical waveguide layer 2114 with a thickness of 25 nm by an MOCVD process with a composition represented as $(Al_xGa_{1-x})_\alpha In_{1-\alpha}P_tAs_{1-t}$ (x=0, α=0.65, t=0.9), wherein the composition of the active layer 2104 is selected so as to accumulate a compressive strain therein.

Further, an optical waveguide layer 2115 of p-type AlGaInPAs having a composition represented as $(Al_zGa_{1-z})_\gamma In_{1-\gamma}P_uAs_{1-u}$ (z=0.1, γ=0.7, u=1) is formed on the active layer 2104 by an MOCVD process with a thickness of 0.1 μm, and a first p-type cladding layer 2103 of p-type AlGaInPAs is formed on the optical waveguide layer by an MOCVD process with a thickness of 0.1 μm and a composition represented as $(Al_yGa_{1-y})_\beta In_{1-\beta}P_vAs_{1-v}$ (y=0.5, β=0.8, v=0.85).

On the first p-type cladding layer 2103, there is formed a layer 2105 of p-type AlGaInPAs layer by an MOCVD process with a thickness of 50 nm such that the layer 2105 has a composition represented as $Al_xGa_yIn_{1-x-y}P_tAs_{1-t}$ (x=1, y=0, t=0.4), wherein this composition is actually represented as $AlP_{0.4}As_{0.6}$.

Further, a second p-type cladding layer 2106 is formed on the AlPAs layer 2105 by an MOCVD process with a thickness of about 0.9 μm, wherein the p-type cladding layer 2106 has a composition represented as $(Al_yGa_{1-y})_\beta In_{1-\beta}P_vAs_{1-x}$ (y=0.5, β=0.8, v=0.85). Further, a buffer layer 2116 of p-type GaInP having a composition represented as Ga0.7In0.3P and a contact layer 2117 of p-type GaPAs having a composition represented as $GaP_{0.4}As_{0.6}$ are grown consecutively on the second p-type cladding layer 2106 with respective thicknesses of 0.1 μm and 0.2 nm.

In the foregoing layered structure, it should be noted that the layers 2102, 2103, 2114, 2115 and 2105 have respective compositions chosen so as to achieve a lattice matching with the GaPAs substrate 2101. During the MOCVD process for forming the layered structure, TMG, TMI, TMA, $AsH_3$ and $PH_3$ may be used for the gaseous source together with a carrier gas of $H_2$.

After the formation of the layered structure, a photolithographic patterning process is applied so as to remove a part of the layered structure in correspondence to a stripe region, until the AlPAs layer 2105 of the composition $AlP_{0.4}As_{0.6}$ is removed and the underlying cladding layer 2103 is exposed. As a result of the photolithographic patterning process, there is formed a ridge stripe structure 2109 such that the ridge stripe structure 2109 extends in an axial direction of the laser diode.

After formation of the ridge stripe structure 2109, the half-product of the laser diode thus obtained is subjected to an oxidation process conducted in a water vapor atmosphere at 450° C., and there are formed oxidized regions 2107 such that each of the oxidized regions 2107 penetrates into the ridge structure 2109 from a lateral side of the ridge stripe structure 2109 with a depth of 1.5 μm. Thereby, there remains a central, non-oxidized region of the layer 2105 with a width of about 3 μm, wherein the unoxidized region form a current-confinement structure together with the oxidized regions 2107 acting as a current-blocking region. As a result of formation of the current-blocking structure in the layer 2105, a light-emission takes place in correspondence to the region right underneath the unoxidized region of the AlPAs layer 2105. In the foregoing construction, it should be noted that the ratio of the unoxidized region of the layer 2105 to the width of the ridge stripe structure is about 0.5.

After forming the oxidized regions 2107 by the selective oxidizing process, an $SiO_2$ film 2118 is deposited so as to cover the ridge structure, and a window is formed in correspondence to the ridge top surface. Further, a p-type electrode 2119 is deposited on the $SiO_2$ film 2118 in contact with the contact layer 2117 at the contact window.

The GaAs substrate 2111 is then subjected to a polishing process at the bottom surface thereof such that the thickness of the substrate 2111 becomes 100 μm, and an n-type electrode 120 is deposited on the polished bottom surface of the GaAs substrate 2111.

According to the present embodiment, a laser diode oscillating at the wavelength of 660 nm is obtained.

As a result of the selective oxidation of the AlGaInPAs layer 2105 containing Al with high concentration, a part of the layer 2105 is converted into insulator in correspondence to the regions 2107, and the oxidized regions 2107 form the desired current-confinement structure together with the central unoxidized region of the AlGaInPAs layer 2105.

In view of the fact that the oxidized regions 2107 of the AlGaInPAs layer 2105, having a composition generally represented as $Al_xGa_yIn_{1-x-y}P_tAs_{1-t}$ ($0.8 \leq x \leq 1$, $0 \leq y \leq 0.2$, $0 \leq t \leq 1$), has a refractive index smaller than a refractive index of the layer 2105 itself, there is formed a refractive index profile in the layer 2105 and the refractive index profile forms a real-refractive index waveguide structure effective for lateral mode control. For example, it is possible to control the lateral mode of laser oscillation by optimizing the distance between the active layer 2104 and the layer 2105 of AlGaInPAs of the foregoing general composition of $Al_xGa_yIn_{1-x-y}P_tAs_{1-t}$ ($0.8 \leq x \leq 1$, $0 \leq y \leq 0.2$, $0 \leq t \leq 1$).

In view of the fact that the laser diode uses a material free from optical absorption in the wavelength range corresponding to the oscillation wavelength of the laser diode, for the part in the vicinity of the active layer 2104. Thereby, the laser diode can produce a large optical output power.

In the fabrication process of the laser diode of FIG. 28, it should be noted only a single re growth process is necessary for forming the desired current-confinement structure including the ridge stripe structure. In conventional laser diodes having a buried heterostructure, formation such a current-confinement structure requires a number of regrowth process steps. Thus, the fabrication process of the laser diode is simplified in the present embodiment and the fabrication of the laser diode is facilitated. Associated with this, the yield of production of the laser diode is improved.

In the construction of FIG. 28, it should be noted that the off-angle of the $GaP_{0.4}As_{0.6}$ substrate 101 is small. As noted previously, the off-angle of only 2° is used in the construction of FIG. 28. Thereby, the present embodiment successfully avoids the problem of hillock formation, which is frequently observed in an AlGaInP layer grown by an MOCVD process on a substrate such as GaP, GaAs or $GaP_{0.4}As_{0.6}$, for the case in which the substrate has a small off-angle. It should be noted that this tendency of hillock formation becomes conspicuous when the Al content is increased. In the case of the laser diode having a structure as shown in FIG. 28, the effect of the hillock formation on the device performance can become serious in view of the use of large thickness for the cladding layers.

In the present embodiment, the problem of hillock formation is successfully avoided by introducing As into the layer of AlGaInP. By incorporating As, the droplet formation of Al or Ga during the MOCVD process of the AlGaInP layer is suppressed. Thereby, the hillock formation is successfully suppressed even in such a case the off-angle of the substrate 2101 is set small.

The laser diode of FIG. 28 has another advantageous feature in that Al content can be reduced as compared with a conventional material formed on a GaAs substrate while maintaining the same bandgap. For example, the Al content in the optical waveguide layers 2114 and 2115 is reduced as compared with a conventional optical waveguide layer, and the current associated with non-optical recombination of carriers is reduced. Thereby, the efficiency of light-emission is improved. Further, in view of the fact that the surface recombination current is also reduced and the degradation of optical cavity edge surface is reduced at the same time, the output power of the laser diode can be increased as compared with a conventional laser diode. Thus, the laser diode of the present embodiment can be used for a high-power red-wavelength laser diode under a high temperature environment.

In the laser diode of FIG. 28, it should be noted that the active layer 2004 of the single quantum well structure can be replaced with a multiple quantum well structure. In this case, the quantum well layer repeated alternately together with a barrier layer having a composition represented as $(Al_{x2}Ga_{1-x2})_{\alpha2}In_{1-\alpha2}P_{t2}As_{1-t2}$ ($0 \leq x_2 < 1$, $0.5 < \alpha_2 < 1$, $0 \leq t_2 \leq 1$). It should be noted that the optical waveguide layers 2114 and 2115 may contain As.

In the present embodiment, it should be noted that the to-be-oxidized layer 2105 of p-type $Al_xGa_yIn_{1-x-y}P_tAs_{1-t}$ (x=1, y=0 and t=0.4) may be replaced with a p-type AlAs layer. In this case, the compositional parameters y and t are set to zero (y=t=0) while the compositional parameter x is set to one (x=1). When this composition is used, the layer 2105 accumulates a compressive strain of about 1.4%. Thus, there is a limitation in the thickness of the layer 2105 and the layer 2105 is formed to have a thickness of about 20 nm. It was found that the oxidation rate of an AlAs layer is larger than the oxidation rate of an AlPAs layer of the same thickness but contains P. The growth of a binary mixed crystal layer of AlAs is much easier than growing a ternary mixed crystal layer of AlPAs.

Twentieth Embodiment

Figure 29:
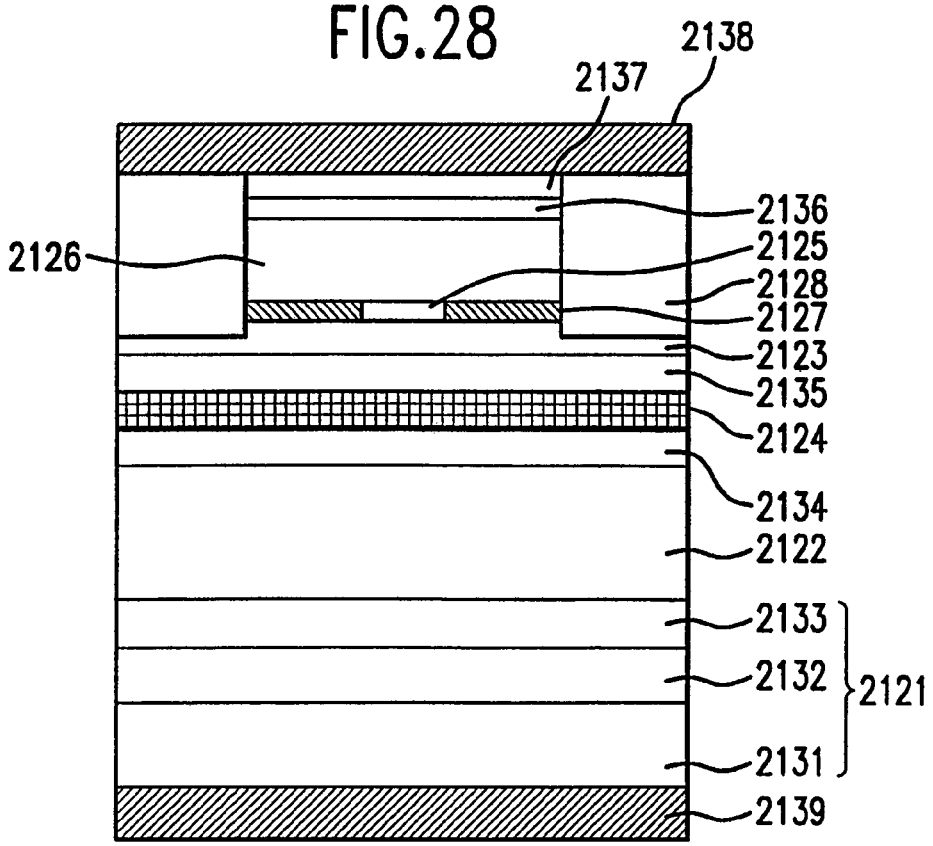
FIG. 29 is a diagram showing the construction of a laser diode according to a twentieth embodiment of the present invention.

FIG. 29 shows the construction of a semiconductor optical device according to a twentieth embodiment of the present invention, wherein the device of FIG. 29 is actually a laser diode having an SCH-MQW structure.

Referring to FIG. 29, the laser diode is constructed on a GaAs offset-substrate 2131 having an inclined principal surface inclined from the (100) surface in the [110] direction with an offset angle of 2°.

On the substrate 2131, there is formed a composition-graded layer 2132 of n-type GaPAs by a vapor phase epitaxial process such that the P content increases gradually from 0 to 0.4. Thus, the GaPAs composition-graded layer 2132 has a composition of $GaP_{0.4}As_{0.6}$ on the top part thereof. On the composition-graded layer 2132, a GaPAs layer 2133 having the foregoing composition of $GaP_{0.4}As_{0.6}$ is formed such that the total thickness of the layers 2132 and 2133 becomes about 90 μm. The GaPAs layers 2132 and 2133 form a GaPAs substrate 2121 together with the GaAs substrate 2131.

On the GaPAs substrate 2121, a cladding layer 2122 of n-type AlGaInPAs having a composition represented as $(Al_yGa_{1-y})_\beta In_{1-\beta}P_vAs_{1-v}$ (y=0.5, β=0.8, v=0.85) is formed by an MOCVD process with a thickness of 1 μm, wherein the cladding layer contains As and has the composition set so as to achieve lattice matching with the $GaP_{0.4}As_{0.6}$ substrate 2121.

On the cladding layer 2122, there is formed an optical waveguide layer 2134 of p-type AlGaInPAs having a composition represented as $(Al_zGa_{1-z})_\gamma In_{1-\gamma}P_uAs_{1-u}$ (z=0, γ=0.7, u=1) by an MOCVD process with a thickness of 0.1 μm, and a quantum-well layer of AlGaInPAs having thickness of about 10 nm and a composition represented as $(Al_xGa_{1-x})_\alpha In_{1-\alpha}P_tAs_{1-t}$ (x=0, α=0.65, t=0.9) and a barrier layer of AlGaInPAs having a thickness of 10 nm and a composition represented as $(Al_zGa_{1-z})_\gamma In_{1-\gamma}P_uAs_{1-u}$ (z=0, γ=0.7, u=1) are repeated alternately on the optical waveguide layer 2134 to form an active layer 2124 of a multiple quantum well structure, wherein the composition of the quantum well layer is selected so as to accumulate a compressive strain therein.

Further, an optical waveguide layer 2135 of p-type AlGaInPAs having a composition represented as $(Al_zGa_{1-z})_\gamma In_{1-\gamma}P_uAs_{1-u}$ (z=0.1, γ=0.7, u=1) is formed on the active layer 2124 with a thickness of 0.1 μm, and a first p-type cladding layer 2123 of p-type AlGaInPAs is formed on the optical waveguide layer 2135 with a thickness of 0.1 μm and a composition represented as $(Al_yGa_{1-y})_\beta In_{1-\beta}P_vAs_{1-v}$ (y=0.5, β=0.8, v=0.85).

On the first p-type cladding layer 2123, there is formed a layer 2125 of p-type AlGaInPAs layer with a thickness of 50 nm such that the layer 2125 has a composition represented as $Al_xGa_yIn_{1-x-y}P_tAs_{1-t}$ (x=1, y=0, t=0.4), wherein this composition is actually represented as $AlP_{0.4}As_{0.6}$.

Further, a second p-type cladding layer 2126 is formed on the AlPAs layer 2125 with a thickness of about 0.9 μm, wherein the p-type cladding layer 2126 has a composition represented as $(Al_yGa_{1-y})_\beta In_{1-\beta}P_vAs_{1-v}$ (y=0.5, β=0.8, v=0.85). Further, a buffer layer 2136 of p-type GaInP having a composition represented as $Ga_{0.7}In_{0.3}P$ and a contact layer 2137 of p-type GaPAs having a composition represented as $GaP_{0.4}As_{0.6}$ are grown consecutively on the second p-type cladding layer 2126 with respective thicknesses of 0.1 μm and 0.2 nm.

In the foregoing layered structure, it should be noted that the cladding layers 2122, 2123 and 2126, the optical waveguide layers 2134 and 2135, and the layer 2125 achieve a lattice matching with the GaPAs substrate 2121.

Next, the layered structure thus obtained is subjected to a photolithographic patterning process to form a central ridge stripe structure, wherein the ridge stripe structure used in the embodiment of FIG. 29 has an increased width of 50 μm as compared with the previous embodiment of FIG. 28. Thereby, the etching process is continued until the cladding layer 2123 underneath the layer 2125 is exposed. Further, an oxidation process is conducted in a water vapor atmosphere at the temperature of 450° C. to cause an oxidation in the $AlP_{0.4}As_{0.6}$ layer 2125. Thereby, the oxidation starts at the exposed edge of the layer 2125 and proceeds to the interior of the ridge stripe structure along the layer 2125, and a pair of oxidized regions 2127 are formed as a result such that each oxidized region 2127 extends into the interior of the ridge stripe structure from a side wall thereof along the layer 2125 with a distance of about 22.5 μm. Thereby, a region of unoxidized AlPAs layer 2125 is left at the center of the two oxidized regions 2127 with a width of 5 μm, wherein this unoxidized region provides the current path of the drive current. On the other hand, the oxidized regions 2127 function as a current-blocking regions and there is formed a current-confinement structure in the ridge stripe structure by the unoxidized part of the AlPAs layer 2125 and the oxidized regions 2127. In correspondence to the injection of the drive current via the unoxidized part of the layer 2125, there occurs a light emission right underneath the unoxidized part of the layer 2125. In the present embodiment, the ratio of the width of the unoxidized part to the entire width of the ridge stripe structure is about 0.1.

After formation of the ridge stripe structure, the lateral sides of the ridge stripe structure are filled with a polyimide as represented by regions 2128 and a p-type electrode 2138 is formed on the top part of such a planarized structure in contact with the contact layer 2137. Further, the bottom surface of the GaAs substrate 2131 is polished to a thickness of 100 μm, and an n-type electrode 2139 is formed on such a polished bottom surface.

According to the construction of FIG. 29, a laser diode oscillating at the wavelength of 650 nm is obtained.

As a result of the selective oxidation of the AlGaInPAs layer 2125 containing Al with high concentration, a part of the layer 2125 is converted into insulator in correspondence to the regions 2127, and the oxidized regions 2127 form the desired current-confinement structure together with the central unoxidized region of the AlGaInPAs layer 2125.

In view of the fact that the oxidized regions 2127 of the AlGaInPAs layer 2125, having a composition generally represented as $Al_xGa_yIn_{1-x-y}P_tAs_{1-t}$ ($0.8 \leq x \leq 1$, $0 \leq y \leq 0.2$, $0 \leq t \leq 1$), has a refractive index smaller than a refractive index of the layer 2125 itself, there is formed a refractive index profile in the layer 2125 and the refractive index profile forms a real-refractive index waveguide structure effective for lateral mode control. For example, it is possible to control the lateral mode of laser oscillation by optimizing the distance between the active layer 2124 and the layer 2125 of AlGaInPAs of the foregoing general composition of $Al_xGa_yIn_{1-x-y}P_tAs_{1-t}$ ($0.8 \leq x \leq 1$, $0 \leq y \leq 0.2$, $0 \leq t \leq 1$).

As the waveguide structure is formed inside the ridge stripe with a sufficient distance from the side wall of the ridge stripe structure, the laser diode of the present embodiment successfully minimizes the waveguide loss associated with the fluctuation of the edge width.

In the fabrication process of the laser diode of FIG. 29, it should be noted only a single regrowth process is necessary for forming the desired current-confinement structure including the ridge stripe structure. In conventional laser diodes having a buried heterostructure, formation such a current-confinement structure requires a number of regrowth process steps. Thus, the fabrication process of the laser diode is simplified in the present embodiment and the fabrication of the laser diode is facilitated. Associated with this, the yield of production of the laser diode is improved.

Further, in view of the fact that the laser diode of FIG. 29 uses a wide ridge stripe structure having a width of 50 μm, and thus, a wide contact area is secured on the ridge stripe structure, it is possible to dissipate heat efficiently via the contact area. Thereby, the differential resistance of the laser diode device is minimized.

Figure 6:
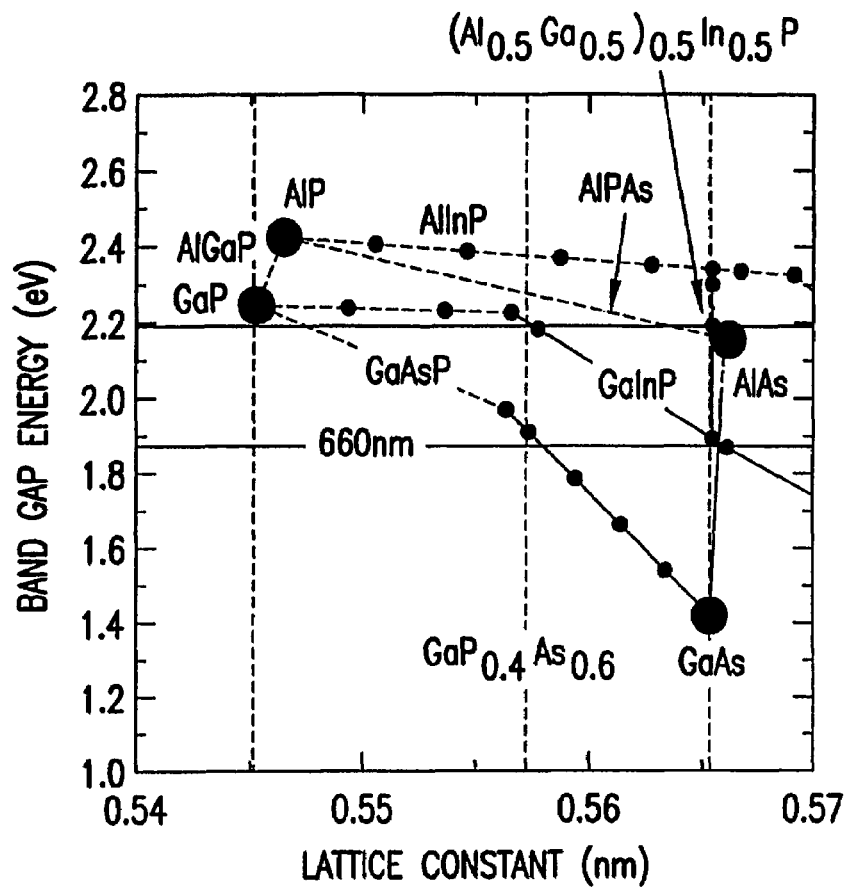
FIG. 6 is another diagram showing the relationship between bandgap energy and lattice constant for a III-V semiconductor material system.
Figure 7:
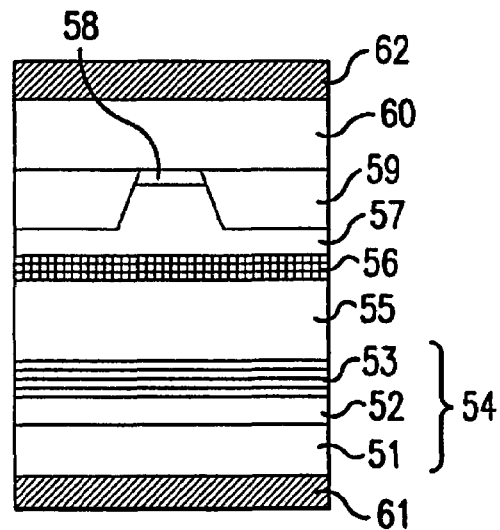
FIG. 7 is a diagram showing the construction of a conventional laser diode of edge-emission type.

Further, it should be noted that the optical waveguide layers 2314 and 2135 and the active layer 2124 are free from Al in the laser diode of the present embodiment. Referring back to FIG. 6 showing the relationship between the bandgap and the lattice constant for the composition of $(Al_{0.5}Ga_{0.5})_{0.5}In_{0.5}P$, which is widely used in a visible laser diode of the AlGaInP system constructed on a GaAs substrate, it can be seen that the same bandgap is realized by a $Ga_{0.7}In_{0.3}P$ composition that achieves a lattice matching with the $GaP_{0.4}As_{0.6}$ substrate 2101. Thus, the present invention successfully uses the $Ga_{0.7}In_{0.3}P$ composition for the optical waveguide layers 2134 and 2135 and minimizes the non-optical recombination of carriers, which is caused in relation to the existence of Al. Thereby, the laser diode of the present embodiment can produce a large output power. The present embodiment provides a red-wavelength laser diode operable under high temperature environment with a large output optical power.

Twenty-First Embodiment

Figure 30:
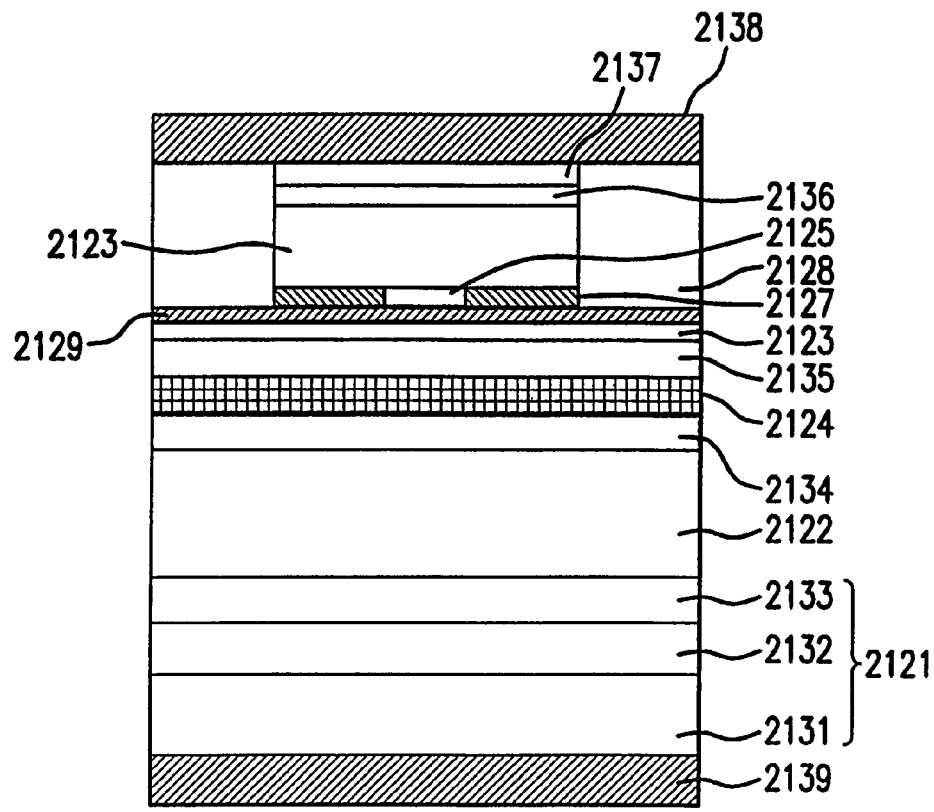
FIG. 30 is a diagram showing the construction of a laser diode according to a twenty-first embodiment of the present invention.

FIG. 30 shows the construction of a semiconductor optical device according to a twenty-first embodiment of the present invention, wherein those parts corresponding to the parts described previously are designated by the same reference numerals and the description thereof will be omitted.

Referring to FIG. 30, the optical semiconductor device is a laser diode and has a structure similar to that described with reference to FIG. 29, except that an etching stopper layer 2129 of GaInPAs having a composition represented as $Ga_yIn_{1-y}P_tAs_{1-t}$ ($0<y \leq 1$, $0 \leq t \leq 1$) is interposed between the to-be-oxidized layer 2125 and the substrate 2121. In fact, the etching stopper layer 2129 is provided right underneath the to-be-oxidized layer 2125. It should be noted that a III-V material having a high Al concentration or P concentration can be etched effectively by a hydrochloric acid etchant, while a material containing As with high concentration resists against the etching process. Thus, the layer 2129 of the composition $Ga_yIn_{1-y}P_tAs_{1-t}$ ($0<y \leq 1$, $0 \leq t \leq 1$) can be used as an etching stopper.

With the use of the etching stopper layer 2129, the etching process for forming the ridge stripe structure is controlled easily, and the yield of production of the laser diode is improved. Otherwise, the laser diode of the present embodiment is similar to the laser diode described with reference to FIG. 30.

Twenty-Second Embodiment

Figure 31:
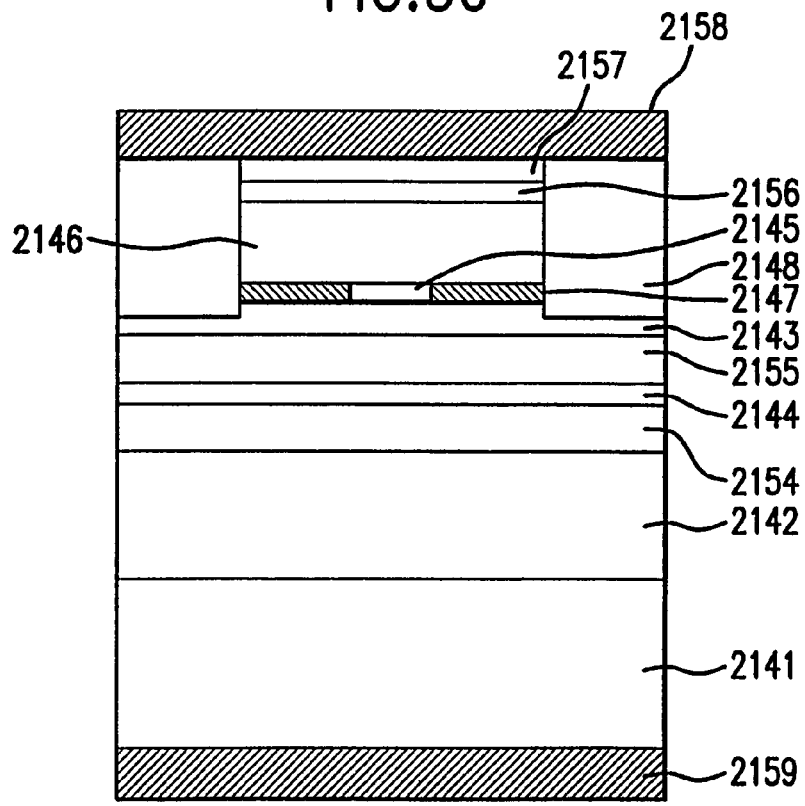
FIG. 31 is a diagram showing the construction of a laser diode according to a twenty-second embodiment of the present invention.

FIG. 31 shows the construction of a laser diode according to a twenty-second embodiment of the present invention.

Referring to FIG. 31, the laser diode is constructed on a GaAs offset-substrate 2141 having an inclined principal surface inclined from the (100) surface in the [110] direction with an offset angle of 15°.

On the GaPAs substrate 2141, a cladding layer 2142 of n-type AlGaInPAs having a composition represented as $(Al_yGa_{1-y})_\beta In_{1-\beta}P$ (y=0.5, β=0.8) is formed by an MOCVD process with a thickness of 1 μm, and an optical waveguide layer 2154 of AlGaInPAs having a composition represented as $(Al_zGa_{1-z})_\gamma In_{1-\gamma}P$ (z=0.5, γ=0.7) is formed on the cladding layer 2142 by an MOCVD process with a thickness of 0.1 μm. Further, a quantum-well layer of AlGaInPAs having a thickness of about 10 nm is formed on the optical waveguide layer 2154 with a composition represented as $(Al_xGa_{1-x})_\alpha In_{1-\alpha}P$ (x=0, α=0.65), wherein the composition of the quantum well layer is selected so as to accumulate a compressive strain therein.

Further, an optical waveguide layer 2155 of p-type AlGaInPAs having a composition represented as $(Al_zGa_{1-z})_\gamma In_{1-\gamma}P$ (z=0.1, γ=0.7) is formed on the active layer 2124 with a thickness of 0.1 μm, and a first p-type cladding layer 2143 of p-type AlGaInPAs is formed on the optical waveguide layer 2155 with a thickness of 0.1 μm and a composition represented as $(Al_yGa_{1-y})_\beta In_{1-\beta}P$ (y=0.7, β=0.5).

On the first p-type cladding layer 2143, there is formed a layer 2145 of p-type AlGaInPAs layer with a thickness of 50 nm such that the layer 2145 has a composition represented as $Al_xGa_yIn_{1-x-y}P_tAs_{1-t}$ (x=1, y=0, t=0.037), wherein this composition is actually represented as $AlP_{0.037}As_{0.963}$.

Further, a second p-type cladding layer 2146 is formed on the AlPAs layer 2145 with a thickness of about 0.9 μm, wherein the p-type cladding layer 2146 has a composition represented as $(Al_yGa_{1-y})_\beta In_{1-\beta}P$ (y=0.7, β=0.5). Further, a buffer layer 2146 of p-type GaInP having a composition represented as $Ga_{0.5}In_{0.5}P$ and a contact layer 2157 of p-type GaAs are grown consecutively on the second p-type cladding layer 2146 with respective thicknesses of 0.1 μm and 0.2 nm.

In the foregoing layered structure, it should be noted that the cladding layers 2142, 2143 and 2146, the optical waveguide layers 2154 and 2155, and the layer 2145 achieve a lattice matching with the GaAs substrate 2141.

Next, the layered structure thus obtained is subjected to a photolithographic patterning process to form a central ridge stripe structure, wherein the ridge stripe structure used in the embodiment of FIG. 31 has a width of 50 μm. Thereby, the etching process of the photolithographic patterning process is continued until the cladding layer 2143 underneath the layer 2145 is exposed. Further, an oxidation process is conducted in a water vapor atmosphere at the temperature of 450° C. to cause an oxidation in the $AlP_{0.037}As_{0.963}$ layer 2145. Thereby, the oxidation starts at the exposed edge of the layer 2145 and proceeds to the interior of the ridge stripe structure along the layer 2145, and a pair of oxidized regions 2147 are formed as a result such that each oxidized region 2147 extends into the interior of the ridge stripe structure from a side wall thereof along the layer 2145 with a distance of about 22.5 μm. Thereby, a region of unoxidized AlPAs layer 2145 is left at the center of the two oxidized regions 2147 with a width of 5 μm, wherein this unoxidized region provides the current path of the drive current. On the other hand, the oxidized regions 2147 function as a current-blocking regions and there is formed a current-confinement structure in the ridge stripe structure by the unoxidized part of the AlPAs layer 2145 and the oxidized regions 2147. In correspondence to the injection of the drive current via the unoxidized part of the layer 2145, there occurs a light emission right underneath the unoxidized part of the layer 2145. In the present embodiment, the ratio of the width of the unoxidized part to the entire width of the ridge stripe structure is about 0.1.

After formation of the ridge stripe structure, the lateral sides of the ridge stripe structure are filled with a polyimide as represented by regions 2148 and a p-type electrode 2158 is formed on the top part of such a planarized structure in contact with the contact layer 2157. Further, the bottom surface of the GaAs substrate 2141 is polished to a thickness of 100 μm, and an n-type electrode 2159 is formed on such a polished bottom surface.

In the embodiment of FIG. 31, too, a similar advantageous effect as the device describe previously is obtained. In the device of the present embodiment constructed on the GaAs substrate 2141, an adversary effect is expected when an AlAs layer is used for the to-be-oxidized layer 2145 due to the lattice misfit of as much as about 0.14%. The present embodiment successfully avoids such an adversary effect by using an AlGaInPAs layer containing P with the composition represented as $Al_xGa_yIn_{1-x-y}P_tAs_{1-t}$ (0.8≤x≤1, 0<t≤1) for the layer 2145. By incorporating P into the layer 2145, it becomes possible to achieve a lattice matching with the GaAs substrate 2141 and the adversary effect associated with the strain in the layer 2145 is eliminated.

Twenty-Third Embodiment

Figure 32:
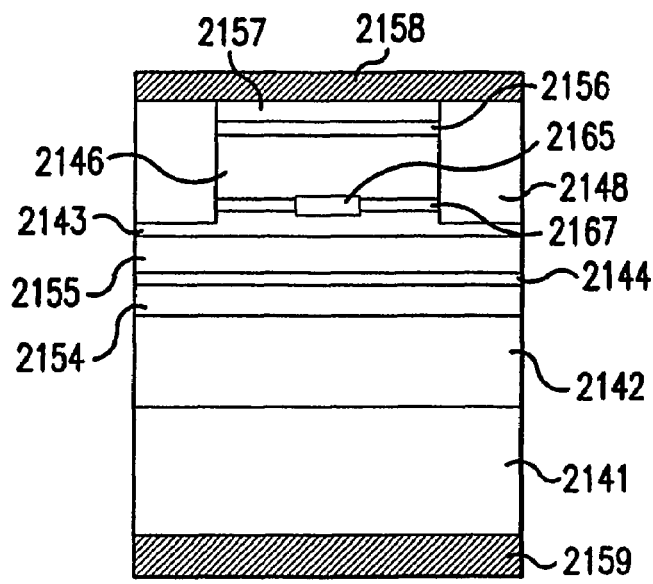
FIG. 32 is a diagram showing the construction of a laser diode according to a twenty-third embodiment of the present invention.

FIG. 32 shows the construction of a semiconductor light-emitting device according to a twenty-third embodiment of the present invention, wherein those parts corresponding to the parts described previously are designated by the same reference numerals and the description thereof will be omitted.

Referring to FIG. 32, the laser diode has a construction similar to that of the laser diode of FIG. 31 except that an AlAs layer 2165 of p-type is provided in place of the AlGaInPAs layer 2145.

As a result of the selective oxidation of the AlAs layer 2165 containing Al with high concentration, a part of the layer 2165 is converted into insulator in correspondence to regions 2167, and the oxidized regions 2167 form the desired current-confinement structure together with the central unoxidized region of the AlAs layer 2165.

In view of the fact that the oxidized regions 21.67 of the AlAs layer 2165 has a refractive index smaller than a refractive index of the layer 2165 itself, there is formed a refractive index profile in the layer 2165 and the refractive index profile forms a real-refractive index waveguide structure effective for lateral mode control. For example, it is possible to control the lateral mode of laser oscillation by optimizing the distance between the active layer 2144 and the layer 2165 of AlAs.

As the waveguide structure is formed inside the ridge stripe with a sufficient distance from the side wall of the ridge stripe structure, the laser diode of the present embodiment successfully minimizes the waveguide loss associated with the fluctuation of the edge width.

In the fabrication process of the laser diode of FIG. 32, it should be noted only a single regrowth process is necessary for forming the desired current-confinement structure including the ridge stripe structure. In conventional laser diodes having a buried heterostructure, formation such a current-confinement structure requires a number of regrowth process steps. Thus, the fabrication process of the laser diode is simplified in the present embodiment and the fabrication of the laser diode is facilitated. Associated with this, the yield of production of the laser diode is improved.

Further, in view of the fact that the laser diode of FIG. 32 uses a wide ridge stripe structure having a width of 50 μm, and thus, a wide contact area is secured on the ridge stripe structure, it is possible to dissipate heat efficiently via the contact area. Thereby, the differential resistance of the laser diode device is minimized.

Thus, the present embodiment enables a semiconductor light-emitting device having a current-confinement structure and capable of lateral mode control by a simple fabrication process.

While the description has been provided so far with reference to a laser diode, the semiconductor light-emitting device of FIGS. 22-32 may also be a light-emitting diode (LED). According to the present invention, a visible LED of high-luminosity and having an excellent temperature characteristic can be obtained.

Twenty-Fourth Embodiment

Figure 33:
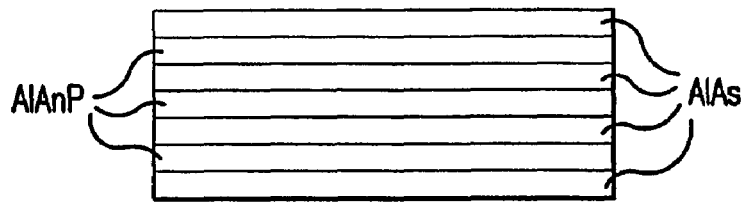
FIG. 33 is a diagram showing a part of a laser diode according to a twenty-fourth embodiment of the present invention.

FIG. 33 shows a construction of the layer 2125 used in a laser diode according to a twenty-fourth embodiment of the present invention.

Referring to FIG. 33, the laser diode of the present embodiment has a construction described already with reference to FIG. 29 or FIG. 30, except that the layer 2125 is formed of an alternate stacking of an AlAs layer having a thickness of 5 nm and a layer having a lattice constant between GaP and GaAs. In the illustrated example, the latter layer is an AlPAs layer having a composition of $AlP_{0.4}As_{0.6}$ and a thickness of 1 nm, wherein the $AlP_{0.4}As_{0.6}$ achieves a lattice matching with the $GaP_{0.4}As_{0.6}$ substrate 2121. By repeating the AlAs layer and the $AlP_{0.4}As_{0.6}$ layer (four times in the illustrated example), there is formed a superlattice structure in the layer 2125. While the AlAs layer has a lattice strain of about 1.4% with respect to the $AlP_{0.4}As_{0.6}$ substrate 2111, the AlAs layer can be grown on the substrate 2111 without lattice relaxation due to the small thickness (5 nm).

With increasing thickness of the layer 2125, the oxidation rate of the layer 2125 increases. Further, the oxidation rate increases with increasing Al content. Thereby, the lateral extent of the oxidized region 2127 is represented as being proportional to the square root of the duration of the oxidation process. Further, it turned out that the oxidation proceeds faster in the mixed crystal of AlPAs that contains P than in the mixed crystal of AlAs. Thus, it is preferable to use a mixed crystal of AlAsP having a composition close to AlAs or AlAs itself for the layer 2125 in order to reduce the duration for the oxidation process.

In the case the $GaP_{0.4}As_{0.6}$ substrate 2121 is used for the substrate of the laser diode, it should be noted that the AlAs layer accumulates a lattice strain of 1.4%. Thus, it is necessary to limit the thickness of the AlAs layer to be smaller than a critical thickness above which lattice relaxation takes place. On the other hand, such a restriction of thickness of the AlAs layer decreases the oxidation rate. On the other hand, the construction of FIG. 33, in which a number of AlAs layers, each having a thickness smaller than the critical thickness of the AlAs layer, are stacked repeatedly and alternately with an intervening layer, is effective for preventing lattice relaxation and for realizing a sufficient oxidation rate.

Figure 34:
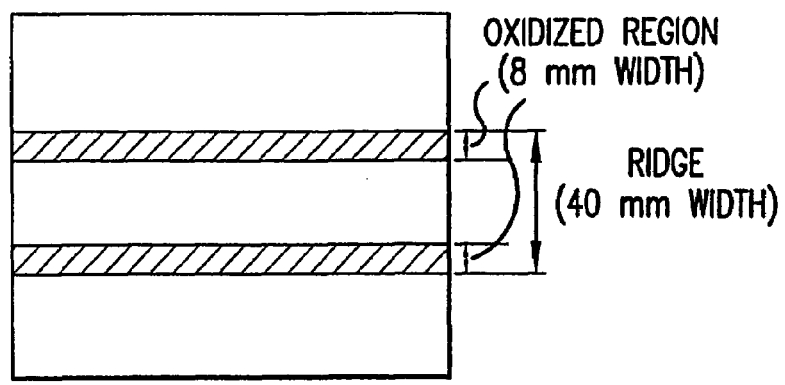
FIG. 34 is a diagram showing a selective oxidation used in the fabrication process of the laser diode of the twenty-fourth embodiment.

FIG. 34 shows the result of an experiment conducted by the inventor of the present invention.

In the experiment, the structure of FIG. 33 is used and a layer identical in composition with the p-type cladding layer 2123 is grown thereon with a thickness of 0.2 μm. Next, the cladding layer 2123 thus formed is patterned until the etching stopper layer 2129 (see FIG. 30) is exposed, and a ridge stripe structure is formed with a width of 40 μm.

The structure thus formed is subjected to a selective oxidation process at 460° C. for 10 minutes.

FIG. 34 shows the plan view of the specimen used in the experiment wherein FIG. 34 shows the ridge region and the region of the layer 2125 where the selective oxidation has taken place. It should be noted that the region where the selective oxidation has taken place is represented in FIG. 34 by hatching. As can be seen in FIG. 34, the oxidized region is formed with a lateral width of 8 μm only after 10 minutes of selective oxidation process. This rate of oxidation is sufficient for practical use of the selective oxidation process for the formation of the oxidized regions 2127 in the actual fabrication process of the laser diode. This rapid oxidation is attributed to the large diffusion rate of oxygen taking place along the surface of the layer 2125. By using the structure of FIG. 33, the number of the surfaces available for oxygen diffusion is increased, and this leads to the increase of the total oxidation rate of the layer 2125.

It should be noted that the superlattice structure of FIG. 33 is applicable to any of the embodiments from FIGS. 22-32. Further, it should be noted that the $AlP_{0.4}As_{0.6}$ layer in the construction of FIG. 33 may be replaced with any material of the system GaAsP, AlInP, GaInP, AlGaInP, GaInAsP, and AlGaInAsP, provided that the material has a lattice constant that eliminates lattice relaxation by the AlAs layer. The layer may achieve a lattice matching with the substrate or accumulate a strain compensating the strain of the AlAs layer. In view of the rapid rate of oxidation, the material of AlPAs, which contains Al as the only group III element, is most preferable. The thickness of the layers constituting the superlattice structure of FIG. 33 may be changed variously from the value described before.

Twenty-Fifth Embodiment

Figure 35:
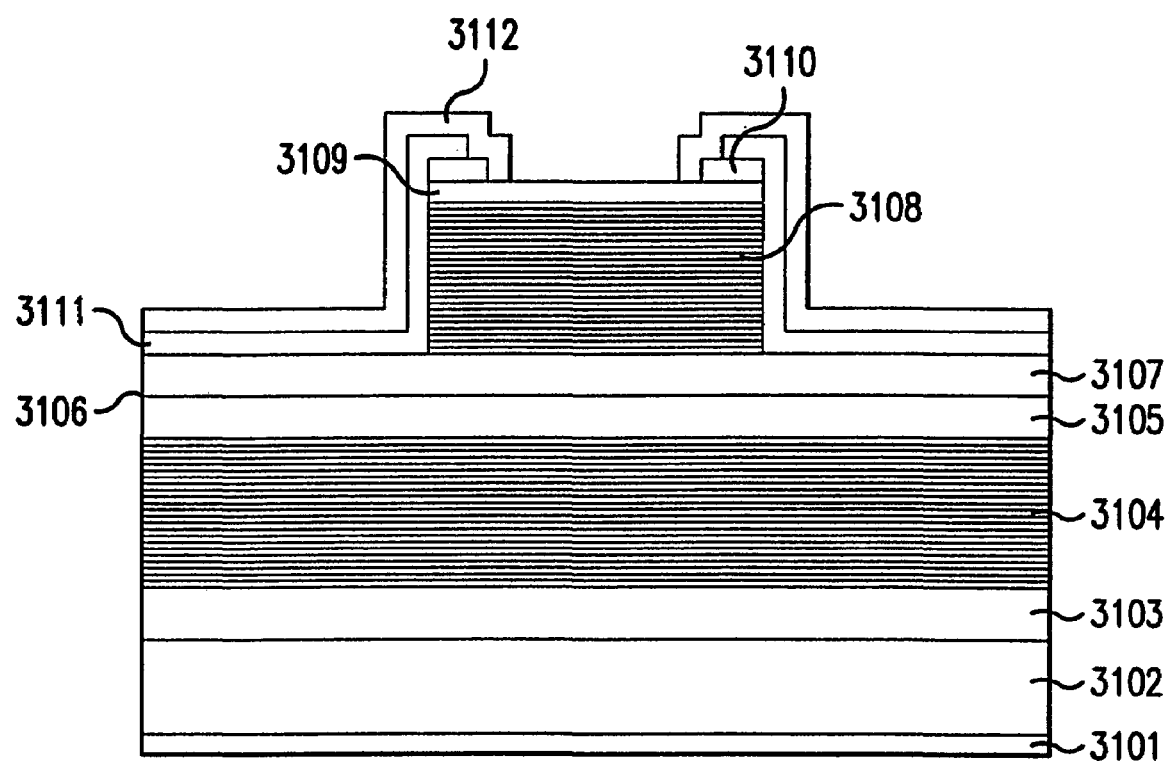
FIG. 35 is a diagram showing the construction of a laser diode according to a twenty-fifth embodiment of the present invention.

FIG. 35 shows the construction of a vertical-cavity laser diode according to a twenty-fifth embodiment of the present invention.

It should be noted that the laser diode of the present invention uses a distributed Bragg reflector (DBR) having a lattice constant between GaAs and GaP, wherein at least one of the two semiconductor layers repeated alternately to form the distributed Bragg reflector, has a composition represented as $(Al_{x1}Ga_{1-x1})_{y1}In_{1-y1}As_{z1}P_{1-z1}$ ($0 \leq x_1 \leq 1$, $0.5 \leq y_1 \leq 1$, $0 < z_1 < 1$).

In the system of AlGaInAsP, it should be noted that the bandgap energy is increased with decrease of the lattice constant. See the relationship of FIG. 8. Thus, the DBR based on the semiconductor layers of the AlGaInAsP system and having a lattice constant between GaAs and GaP does not cause absorption of the optical radiation emitted by the laser diode with the wavelength of 630-650 nm. Thereby, the optical waveguide loss caused by the DBR is minimized.

Further, in view of the fact that the semiconductor layer contains As, the hillock density or surface defects including surface undulation of the semiconductor layers constituting the DBR is reduced. Thereby, the reflectance of the DBR is maximized.

It is known that, in the semiconductor mixed crystal such as AlInP or AlGaInP, there is a tendency of increasing hillock density and surface undulation with increasing Al content. While this problem can be reduced, to some extent, by using an offset substrate having a surface offset from the (100)

surface or increasing the growth temperature, it has been difficult to suppress the hillock formation or surface undulation perfectly.

The present inventor discovered experimentally that hillock formation is effectively suppressed by adding As into the mixed crystal of AlGaInP. Thereby, it was also discovered that only a small amount of As, such as 1-2% in terms of the atomic fraction for the group V elements, is sufficient for achieving the desired effect. In achieving the desired effect, it is not necessary to restrict the growth condition or surface orientation of the substrate. Thus, by using a mixed crystal of the AlGaInAsP system containing As for the DBR, it becomes possible to improve the quality of the surface of the crystal layers forming the DBR.

FIG. 35 shows the construction of the vertical-cavity laser diode according to the present embodiment.

Referring to FIG. 35, the vertical-cavity laser diode is constructed on a substrate 3102 of n-type GaAsP having a lattice misfit of −1.4% with respect to a GaAs substrate and includes, on the substrate of 3102, a buffer layer 3103 of n-type GaAsP, a DBR structure 3104 formed of an alternate repetition of an n-type AlInAsP layer and an n-type GaInAsP layer, a cladding layer 3105 of undoped AlGaInAsP, an active layer 3106 of undoped GaInP, a cladding layer 3107 of undoped AlGaInAsP, a DBR structure 3108 formed of an alternate repetition of a p-type AlInAsP layer and a p-type GaInAsP layer, a spike elimination layer 3109 of GaInP, and a contact layer 3110 of GaAsP, wherein the layers 3103-3110 are deposited consecutively on the substrate 3102 by an MOCVD process.

After the formation of the foregoing layered structure, a photolithographic patterning process is conducted in which the DBR 3108, the spike elimination layer 3109 and the contact layer 3110 are patterned to form a central post structure, wherein the patterning process is conducted until the AlGaInAsP cladding layer 3107 is exposed. In the construction of FIG. 35, it should be noted that the layers 3103-3110 achieve a lattice matching with the GaAsP substrate 3102.

After the formation of the central post structure, an $SiO_2$ film 3111 is deposited uniformly by a CVD process so as to cover the central post structure, and a photolithographic patterning process is conducted to form a first contact window in the $SiO_2$ film 3111 by using a resist mask such that the first contact window exposes the GaAsP contact layer 3110 at top part of the central post structure. Further, the contact layer 3110 is patterned by using another photolithographic process so as to expose the spike elimination layer 3109 in correspondence to a second contact window formed in the first contact window, and a circular resist mask pattern is formed so as to cover the spike elimination layer 3109 thus exposed such that the circular resist mask pattern is located centrally to the spike elimination layer 3909 exposed in the second contact window.

Further a p-type electrode layer is deposited on the structure thus covered by the circular resist mask by an evaporation-deposition process, and a p-type electrode 3112 is formed by lifting off the circular resist mask. Further, the bottom surface of the GaAsP substrate 3102 is polished and an n-type electrode 3101 is deposited by an evaporation-deposition process.

Thereafter, a thermal annealing process is applied to form an ohmic contact at each of the electrodes 3101 and 3112.

In the laser diode of the present embodiment, the laser beam is emitted from the circular opening formed in the p-type electrode 3112. In order to facilitate the emission of the laser beam, the GaAsP contact layer 3110, which is not transparent to the laser beam, is removed in correspondence to the second contact window.

As is well known in the art, each of the layers constituting the DBR structure 3104 or 3108 has a thickness set to be equal to a quarter wavelength of the laser beam produced by the laser diode. Further, the cladding structure including the cladding layers 3105 and 3107 and the active layer 3106 is set to be equal to an integer multiple of the half-wavelength optical distance. In the case the refractive index of the semiconductor layers constituting the DBR structure adjacent to the cladding layer is smaller than the refractive index of the cladding layer, a full-wavelength optical cavity is formed. In the opposite case, a half-wavelength optical cavity is formed.

According to the present embodiment, the active layer 3106 has a composition of GaInP causing a laser oscillation at the wavelength of 635 nm, wherein the active layer 3106 of such a composition is applied with a compressive strain from the substrate 3102. In view of the fact that the DBR structure includes, at least a part thereof, a layer of AlGaInAsP or AlInAsP that contains As with a concentration of 2% with respect to the group V elements. Thus, the hillock formation is eliminated on the surface of the semiconductor layers constituting the DBR structure and a uniform inter interface is realized. Associated therewith, the characteristic of the DBR structure is improved and the performance of the laser diode is improved with respect to the oscillation threshold current and device lifetime.

Twenty-Sixth Embodiment

Next, a vertical-cavity laser diode according to a twenty-sixth embodiment of the present invention will be described with reference to FIG. 36.

In the laser diode of the present embodiment, a DBR having a composition between GaAs and GaP is used similarly to the laser diode of FIG. 35, except that the active layer is formed of GaInAsP. More specifically, the laser diode of the present embodiment uses a composition of $Ga_{y2}In_{1-y2}As_{z2}P_{1-z2}$ ($0<y_2\leq1$, $0<z_2\leq1$) for the active layer, in combination with the DBR having a lattice constant between GaAs and GaP.

According to the present embodiment, it is possible to control the oscillation wavelength and further the strain of the active layer with respect to the DBR structure by controlling the As content in the active layer of GaInAsP.

It should be noted that the wavelength obtained from a mixed crystal of GaInP having a lattice matching composition to a GaAs substrate is about 650 nm, wherein this wavelength decreases with decrease of the lattice constant of the GaInP mixed crystal. Thus, it is necessary to increase the Ga content in such a GaInP active layer for increasing the wavelength, while such an increase of the Ga content causes accumulation of a compressive strain in the active layer.

Meanwhile, it is possible, in a GaInAsP active layer to decrease the bandgap energy by increasing the As content. While such an increase of As content induces an increase of the lattice constant, the increase of the lattice constant can be successfully compensated for by using a GaInP composition having a small lattice constant as the starting composition of the active layer and add As to such a starting composition. As the change of the bandgap energy induced by As is much larger than the change of the bandgap energy caused by the associated lattice strain or a change of Ga content in a GaInP mixed crystal, the foregoing construction of the present embodiment easily increases the oscillation wavelength and achieves minimization of the lattice misfit with respect to the DBR.

For example, it is necessary to use a composition of $Ga_{0.45}In_{0.55}P$ for obtaining an oscillation wavelength of 660 nm when a GaInP layer formed on a $Ga_{0.7}In_{0.3}P$ substrate is used for the active layer. In this case, a strain of about 1.9% is accumulated in the GaInP active layer. In the case of the present embodiment, in which a composition of $Ga_{0.8}In_{0.2}As_{0.5}P_{0.5}$ is used for the active layer, it is possible to achieve a laser oscillation at the wavelength of 660 nm while reducing the strain to one half (½).

Further, the use of the mixed crystal of GaInAsP for the active layer reduces the problem of deterioration of crystal quality. Thus, the present embodiment enables the desired oscillation wavelength while reducing the strain in the active layer as compared with the case of achieving the foregoing desired oscillation wavelength while using a GaInP mixed crystal for the active layer.

Further, the present embodiment has an advantageous feature in that the lattice constant of the DBR can be set close to the lattice constant of GaP. Thereby, the refractive index difference between the AlInAsP layer and the GaInAsP layer constituting the DBR structure is increased and the number of stacks of the layers in the DBR structure can be reduced.

Figure 36:
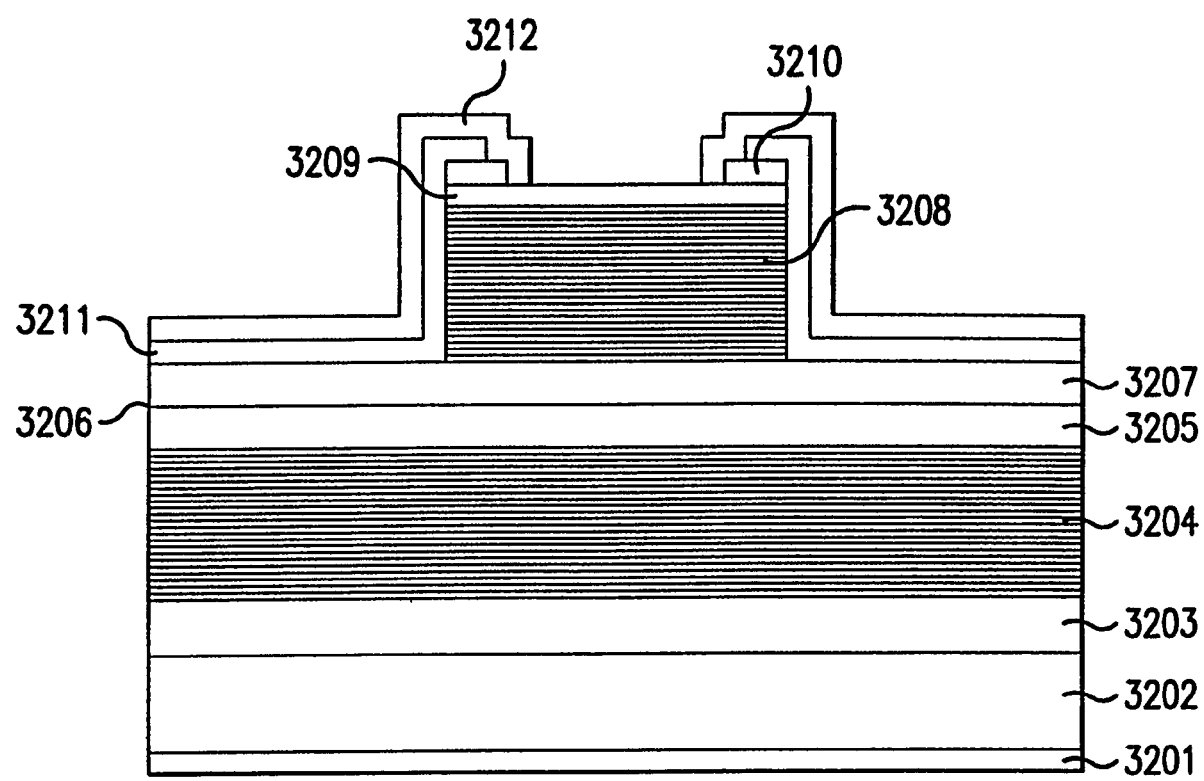
FIG. 36 is a diagram showing the construction of a laser diode according to a twenty-sixth embodiment of the present invention.

FIG. 36 shows the construction of the vertical-cavity laser diode according to the present embodiment.

Referring to FIG. 36, the vertical-cavity laser diode is constructed on a substrate 3202 of n-type GaAsP having a lattice misfit of −2.0% with respect to a GaAs substrate and includes, on the substrate of 3202, a buffer layer 3203 of n-type GaAsP, a DBR structure 3204 formed of an alternate repetition of an n-type AlInAsP layer and an n-type GaAsP layer, a cladding layer 3205 of undoped AlGaInAsP, an active layer 3206 of undoped GaInAsP, a cladding layer 3207 of undoped AlGaInAsP, a DBR structure 3208 formed of an alternate repetition of a p-type AlInAsP layer and a p-type GaAsP layer, a spike elimination layer 3209 of p-type GaInP, and a contact layer 3210 of p-type GaAsP, wherein the layers 3203-3210 are deposited consecutively on the substrate 3202 by an MOCVD process.

After the formation of the foregoing layered structure, a photolithographic patterning process is conducted in which the DBR structure 3208, the spike elimination layer 3209 and the contact layer 3210 are patterned to form a central post structure. The patterning process is conducted until the AlGaInAsP cladding layer 3207 is exposed.

In the construction of FIG. 36, it should be noted that the GaAsP layer forming the DBR structures 3204 and 3208 achieves a lattice matching with the GaAsP substrate 3202. It should be noted that the GaAsP layer having such a lattice matching composition to the GaAsP substrate 3202 is transparent to the optical radiation produced by the laser diode.

After the formation of the central post structure, an $SiO_2$ film 3211 is deposited uniformly on the central post structure by a CVD process, and a photolithographic patterning process is conducted to form a first contact window in the $SiO_2$ film 3211 by using a resist mask so as to expose the GaAsP contact layer 3210 at top part of the central post structure. Further, the contact layer 3210 is patterned by using another photolithographic process as to expose the spike elimination layer 3209 in a second contact window formed in the first contact window, and a circular resist mask pattern is formed so as to cover the spike elimination layer 3209 thus exposed by the second contact window. The circular resist mask is formed centrally to the second contact window.

Further a p-type electrode layer is deposited on the structure thus covered by the circular resist mask by an evaporation-deposition process, and a p-type electrode 3212 is formed by lifting off the circular resist mask. Further, the bottom surface of the GaAsP substrate 3202 is polished and an n-type electrode 3201 is deposited by an evaporation-deposition process.

Thereafter, a thermal annealing process is applied to form an ohmic contact at each of the electrodes 3201 and 3212.

In the laser diode of the present embodiment, the laser beam is emitted from the circular opening formed in the p-type electrode 3212. In order to facilitate the emission of the laser beam, the GaAsP contact layer 3210, which is not transparent to the laser beam, is removed in correspondence to the second contact window.

In the laser diode of FIG. 36, it should be noted that the active layer 3206 may have the foregoing composition of $Ga_{0.8}In_{0.2}As_{0.5}P_{0.5}$. Further, the DBR structure 3204 is formed of an alternate stacking of an n-type AlInAsP layer and an n-type GaAsP layer. The DBR structure 3208, on the other hand, is formed of an alternate stacking of a p-type AlInAsP layer and a p-type GaAsP layer. In the illustrated example, a composition that achieves a lattice misfit of −2.0% with respect to a GaAs substrate is used for the GaAsP substrate 3202 as noted already.

Similarly to the previous embodiment, the cladding layers 3205 and 3207 use a composition of AlGaInAsP that contains As. Further, the DBR structures 3204 and 3208 use the alternate stacking of the layers of AlInAsP and GaAsP that contains As therein. Thus, the hillock formation at the semiconductor layer interface in the DBR structure is effectively suppressed. It should be noted that the layer of GaAsP used in the DBR structure 3204 or 3208 is transparent to the laser oscillation wavelength in the composition that achieves lattice matching with the GaAsP substrate 3202.

By using a composition providing an oscillation wavelength of 650 nm for the active layer 3206, it is possible to reduce the lattice strain of the active layer to be one half (½). Further, it is possible to set the lattice constant of the GaAsP substrate 3202 to be close to the lattice constant of GaP. Thus, a large refractive index difference is achieved between the semiconductor layers constituting the DBR structures 3204 and 3208, and the number of stacks in the DBR structure can be reduced.

Because of the reduced strain, the quality of the crystal constituting the active layer 3206 is improved. As a result of decrease of the number of stacks of the semiconductor layers in the DBR structures, the resistance of the laser diode is also reduced.

Twenty-Seventh Embodiment

Next, a vertical-cavity laser diode according to a twenty-seventh embodiment of the present invention will be described with reference to FIG. 37.

In the laser diode of the present embodiment, the laser diode includes a DBR structure having a lattice constant between GaP and GaAs, and a pair of carrier confinement layers having a composition represented as $Ga_{y3}In_{1-y3}P$ ($0.5<y_3\leq 1$) are provided so as to sandwich the active layer 3206 vertically.

Figure 8:
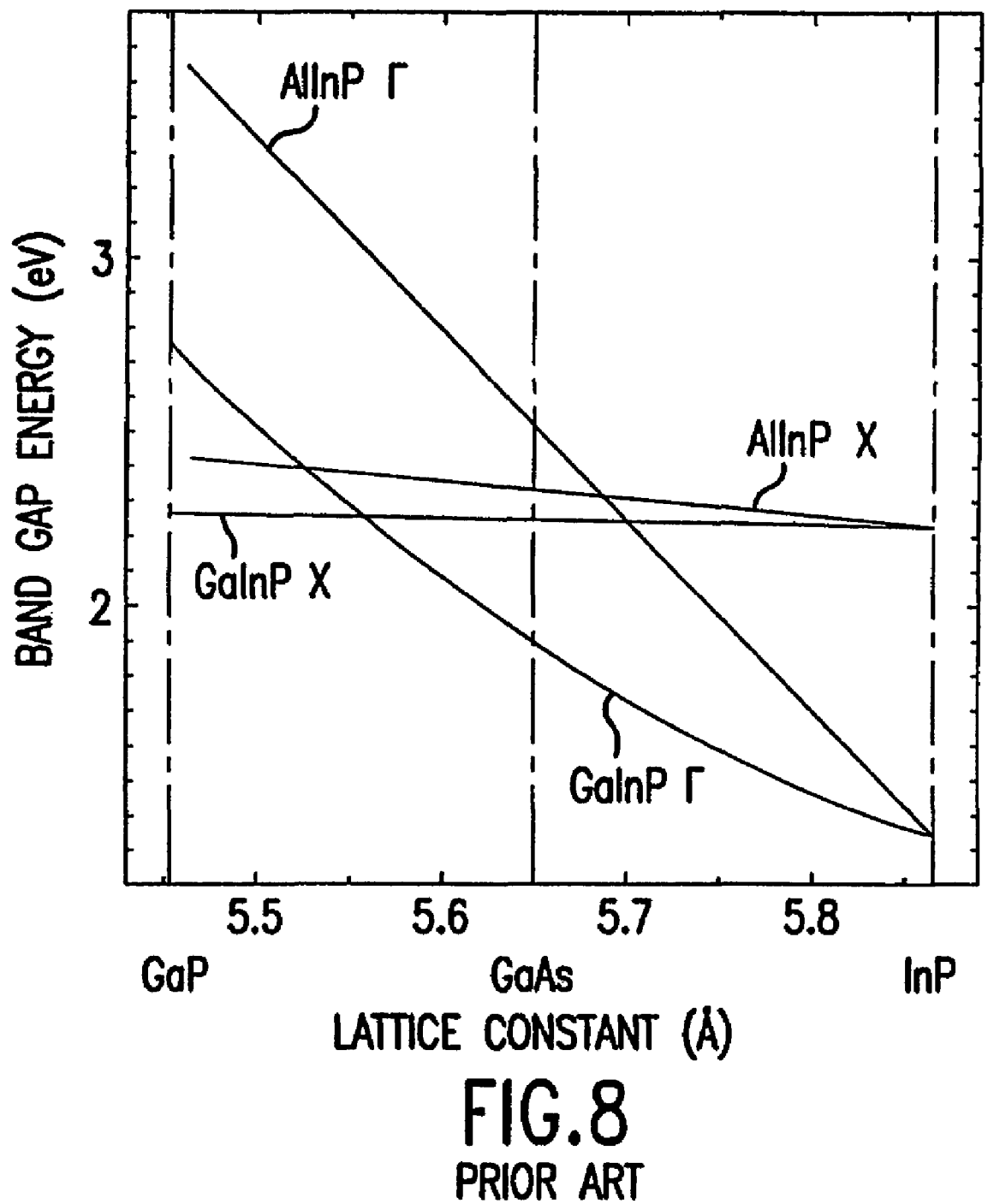
FIG. 8 is another diagram showing the relationship between bandgap energy and lattice constant for a III-V semiconductor material system.

As can be seen in FIG. 8, the bandgap energy increases in the material of the system GaInP with decreasing lattice constant. Thus, the GaInP layer having a lattice matching composition with the DBR structure has a bandgap energy larger than the optical wavelength range of 630-650 nm and functions as an effective carrier confinement layer with regard to the active layer 3306.

According to the present embodiment, carrier confinement is achieved by a semiconductor layer of GaInP, which is free from Al. Thus, the problem of non-optical recombination of carriers associated with the use of an Al-containing layer such as an AlGaInP layer is successfully avoided. The laser diode of the present embodiment has an advantageous feature of low threshold of laser oscillation.

Further, the vertical-cavity laser diode of the present embodiment uses a semiconductor layer transparent to the optical radiation of the wavelength of laser oscillation for the contact layer. As a result of use of such a transparent contact layer, it becomes possible to eliminate the patterning process to remove the contact layer 3110 or 3210 in the previous embodiment for forming the optical window.

Figure 37:
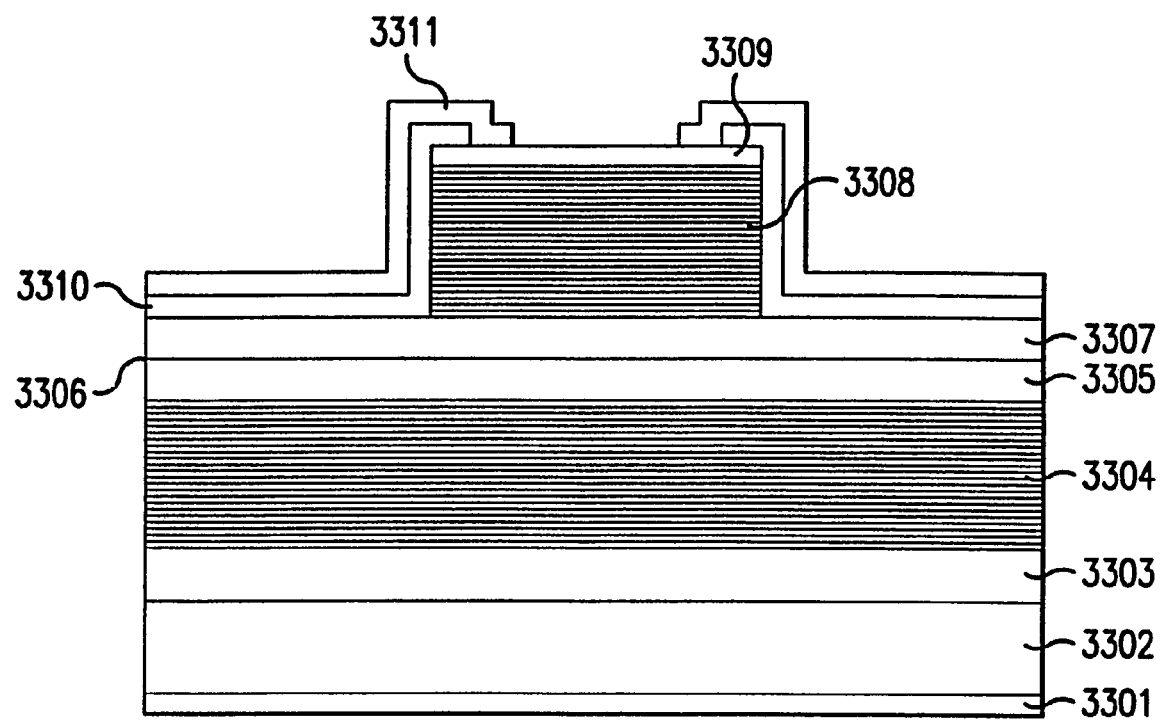
FIG. 37 is a diagram showing the construction of a laser diode according to a twenty-seventh embodiment of the present invention.

FIG. 37 shows the construction of the vertical-cavity laser diode according to the present embodiment.

Referring to FIG. 37, the vertical-cavity laser diode is constructed on a substrate 3302 of n-type GaAsP and includes, on the substrate of 3302, a buffer layer 3303 of n-type GaAsP, a DBR structure 3304 formed of an alternate repetition of an n-type AlInAsP layer and an n-type GaInP layer, a carrier confinement layer 3305 of undoped GaInP, an active layer 3306 of undoped GaInAsP, another carrier confinement layer 3307 of undoped GaInP, another DBR structure 3308 formed of an alternate repetition of a p-type AlInAsP layer and a p-type GaInP layer, and a contact layer 3309 of p-type GaInP, wherein the layers 3303-3309 are deposited consecutively on the substrate 3302 by an MOCVD process.

After the formation of the foregoing layered structure, a photolithographic patterning process is conducted in which the DBR structure 3308, and the contact layer 3309 are patterned to form a central post structure. The patterning process is conducted until the GaInP optical waveguide layer 3307 is exposed.

After the formation of the central post structure, an $SiO_2$ film 3310 is deposited uniformly by a CVD process, and a photolithographic patterning process is conducted to form a contact window in the $SiO_2$ film 3310 so as to expose the GaInP contact layer 3309 in correspondence to the contact window at top part of the central post structure. Further, a circular resist mask pattern is formed so as to cover the contact layer 3309 thus exposed by the contact window, and a p-type electrode layer is deposited on the structure thus covered by the circular resist mask by an evaporation-deposition process. By lifting off the circular resist pattern, a p-type electrode 3311 is formed in a circular shape. Further, the bottom surface of the GaAsP substrate 3302 is polished and an n-type electrode 3301 is deposited by an evaporation-deposition process.

Thereafter, a thermal annealing process is applied to form an ohmic contact at each of the electrodes 3301 and 3311.

In the laser diode of the present embodiment, the laser beam is emitted from the circular opening formed in the p-type electrode 3311. Because the GaInP contact layer 3309 is transparent to the optical beam produced by the laser diode, the process for forming an optical window in the contact layer 3309 as in the case of the previous embodiments of FIGS. 35 and 36 can be eliminated.

It should be noted that the GaInP mixed crystal having a lattice constant between GaAs and GaP is transparent to the optical radiation in the wavelength range of 630-660 nm. Thus, the GaInP contact layer 3309 can be formed with lattice matching to the GaAs substrate 3302. Further, it is possible to use a GaAsP layer for the transparent contact layer 3309, provided that the GaAsP layer has an As content smaller than about 0.63. A GaAsP layer containing As with a concentration exceeding the foregoing limit shows an optical absorption to the optical beam produced by the laser diode. It should be noted that a GaAsP mixed crystal layer having such a composition can achieve a lattice matching with the GaAsP substrate 3302. In the case of using a GaAsP layer for the contact layer 3309, a high-concentration doping can be achieved easily. In the event a transparent GaAsP layer cannot be obtained at the lattice matching composition to the DBR structure or the substrate, it is possible to use a transparent GaAsP layer accumulating a strain.

As noted previously, the present embodiment can eliminate the problem of non-recombination of carriers as a result of use of Al-free composition for the layers 3304 and 3307 and the efficiency of laser oscillation is improved substantially.

Twenty-Eighth Embodiment

Next, a vertical-cavity laser diode according to a twenty-eighth embodiment of the present invention will be described with reference to FIG. 38.

In the laser diode of the present embodiment that uses a DBR structure having a lattice constant between the lattice constant of GaAs and the lattice constant of GaP, an AlAsP layer having a composition represented as $AlAs_{z4}P_{1-z4}$ ($0 \leq z_4 \leq 1$) is used for constructing the DBR structure. By using the AlAsP layer, it is possible to increase the reflectance of the DBR structure. Thereby, the number of stacks of the semiconductor layers in the DBR structure can be reduced. In the DBR structure having a lattice constant between GaAs and GaP, it is possible to use a mixed crystal layer of AlAsP in addition to AlInP.

It is estimated that a mixed crystal of AlAsP has a smaller refractive index as compared with a mixed crystal of AlInP of the same lattice constant, due to the reason that the mixed crystal of AlAsP has a larger bandgap energy between the r point of the conduction band and the valence band. As the number of stacks of layers in the DBR structure is reduced by using the staking structure of AlAsP/GaInP as compared with the case of using the stacking structure of AlInP/GaInP, it is possible to achieve a high reflectance with a reduced number of the stacks and the resistance of the laser diode caused by the DBR structure is reduced. In view of the fact that the AlAsP mixed crystal is free from In, the relative proportion of As in the mixed crystal is increased and the problem of hillock formation is effectively suppressed.

Figure 38:
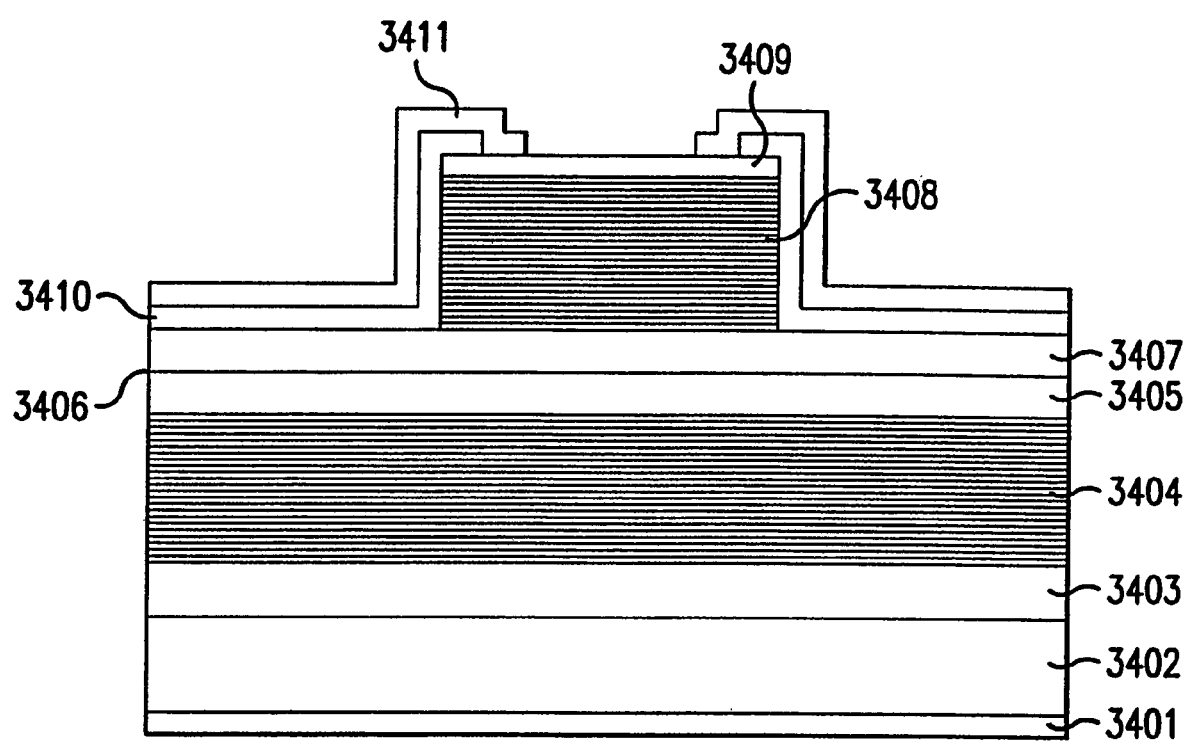
FIG. 38 is a diagram showing the construction of a laser diode according to a twenty-eighth embodiment of the present invention.

FIG. 38 shows the construction of the vertical-cavity laser diode according to the present embodiment.

Referring to FIG. 38, the vertical-cavity laser diode is constructed on a substrate 3402 of n-type GaAsP and includes, on the substrate of 3402, a buffer layer 3403 of n-type GaAsP, a DBR structure 3404 formed of an alternate repetition of an n-type AlAsP layer and an n-type GaInP layer, a carrier confinement layer 3405 of undoped GaInP, an active layer 3406 of undoped GaInAsP, another carrier confinement layer 3407 of undoped GaInP, another DBR structure 3408 formed of an alternate repetition of a p-type AlAsP layer and a p-type GaInP layer, and a contact layer 3409 of p-type GaInP, wherein the layers 3403-3409 are deposited consecutively on the substrate 3402 by an MOCVD process.

After the formation of the foregoing layered structure, a photolithographic patterning process is conducted in which the DBR structure 3408 and the contact layer 3409 are patterned to form a central post structure. The patterning process is conducted until the GaInP optical waveguide layer 3407 is exposed.

After the formation of the central post structure, an $SiO_2$ film 3410 is deposited uniformly by a CVD process, and a photolithographic patterning process is conducted to form a contact window in the $SiO_2$ film 3410 so as to expose the GaInP contact layer 3409 in correspondence to the contact window at top part of the central post structure. Further, a circular resist mask pattern is formed so as to cover the contact layer 3409 thus exposed by the contact window, and a p-type electrode layer is deposited on the structure thus covered by the circular resist mask by an evaporation-deposition process. By lifting off the circular resist pattern, a p-type electrode 3411 is formed in a circular shape. Further, the bottom surface of the GaAsP substrate 3402 is polished and an n-type electrode 3401 is deposited by an evaporation-deposition process.

Thereafter, a thermal annealing process is applied to form an ohmic contact at each of the electrodes 3401 and 3411.

In the vertical-cavity laser diode of FIG. 38, the AlAsP layer and the GaInP layer constituting the DBR structure 3404 or 3408 have a lattice matching composition to the GaAsP substrate 3402. As the AlAsP layer has a smaller refractive index as compared with the AlInP layer of the same lattice constant, it is possible to increase the refractive index difference or step formed between the AlAsP layer and the GaInP layer in the DBR structure 3404 or 3408. As a result, the number of stacks of layers in the DBR structures 3404 and 3408 is reduced and the resistance of the laser diode is reduced accordingly. In the DBR structure 3404 or 3408, it should be noted that the AlAsP layer may be used together with a semiconductor layer other than GaInP. For example, the AlAsP layer may be used together with a layer of AlGaAsP to form the DBR structure. In this case, the superlattice structure of the DBR structure 3404 or 3408 is easily formed by an MOCVD process while merely switching the supply of gaseous source of Ga.

Twenty-Ninth Embodiment

Next, a vertical-cavity laser diode according to a twenty-ninth embodiment of the present invention will be described with reference to FIG. 39.

In the present embodiment, the laser diode includes a current-confinement structure formed in a part of the DBR structure, wherein the current-confinement structure is formed in the DBR structure by a selective oxidation process of an AlAsP layer having a composition represented as $AlAs_{z5}P_{1-z5}$ ($0 \leq z_5 \leq 1$). The AlAsP layer has a low refractive and forms the DBR structure together with another semiconductor layer of a high refractive index.

It should be noted that the foregoing AlAsP layer is not necessarily be the only one low-refractive-index layer of the DBR structure. For example, the AlAsP layer may be formed only in the vicinity of the active layer. In this case, the low-refractive-index layer in the region away from the active layer may be formed of AlInAsP. By doing so, the current-confinement structure can be formed without increasing the resistance of the laser diode.

The AlAsP layer is not required to achieve a lattice matching with other layers of the DBR structure but may accumulate a strain therein. As the AlAsP layer is used only in a part of the DBR structure, there occurs no serious degradation of crystal quality even when the AlAsP layer accumulates a strain.

According to the present embodiment, a vertical-cavity laser diode having a reduced threshold current is obtained. Because of the use of AlAsP for the part of the DBR structure where the selective oxidation process is to be conducted, the selective oxidation process proceeds rapidly. It should be noted that the layer of AlAsP contains Al as the only group III element. It should be noted that the oxide layer formed as a result of the oxidation of Al becomes an insulator. Thereby, drive current of the laser diode is caused to flow through the unoxidized region encircled by the insulating region thus oxidized.

Figure 39:
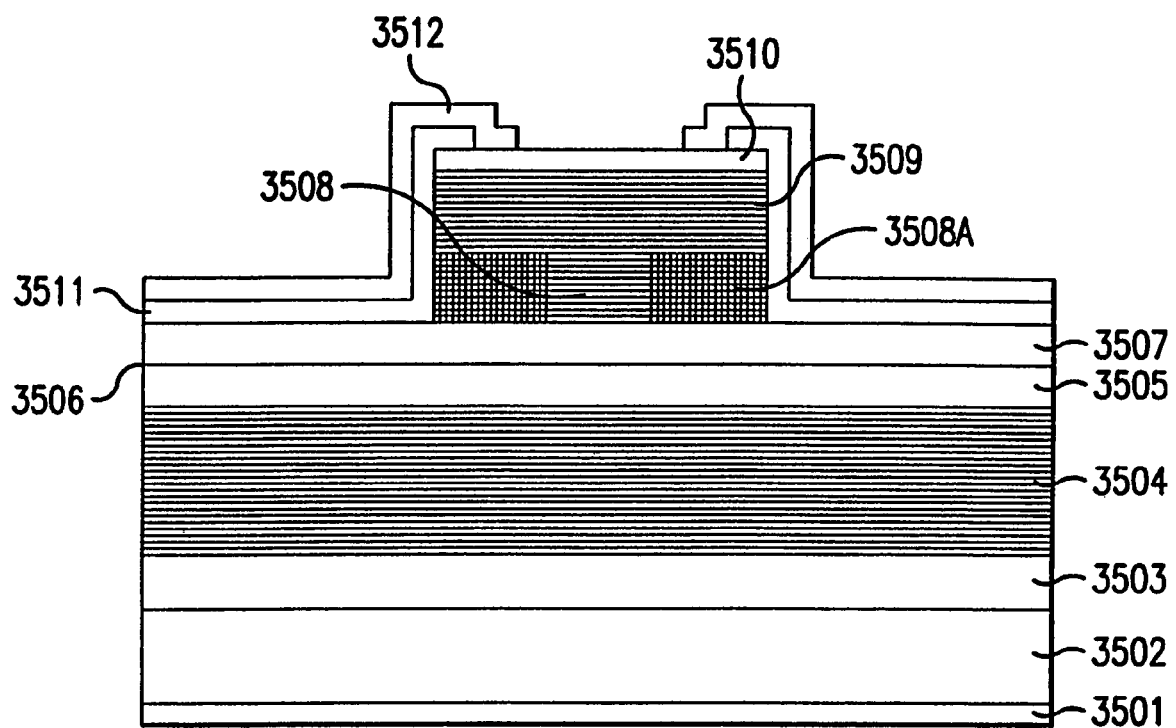
FIG. 39 is a diagram showing the construction of a laser diode according to a twenty-ninth embodiment of the present invention.

FIG. 39 shows the construction of the vertical-cavity laser diode according to the present embodiment.

Referring to FIG. 39, the vertical-cavity laser diode is constructed on a substrate 3502 of n-type GaAsP and includes, on the substrate of 3502, a buffer layer 3503 of n-type GaAsP, a first DBR structure 3504 formed of an alternate repetition of an n-type AlAsP layer and an n-type GaInP layer, a carrier confinement layer 3505 of undoped GaInP, an active layer 3506 of undoped GaInAsP, another carrier confinement layer 3507 of undoped GaInP, a second DBR structure 3508 formed of an alternate repetition of a p-type AlAsP layer and a p-type GaInP layer, a third DBR structure 3509 formed of an alternate repetition of a p-type AlInAsP layer and a p-type GaInP layer, and a contact layer 3510 of p-type GaInP, wherein the layers 3403-3510 are deposited consecutively on the substrate 3502 by an MOCVD process.

After the formation of the foregoing layered structure, a photolithographic patterning process is conducted in which the DBR structure 3508, 3509 and the contact layer 3510 are patterned to form a central post structure. The patterning process is conducted until the GaInP optical waveguide layer 3507 is exposed.

After the formation of the central post structure, a selective oxidation process is conducted in a water vapor atmosphere to induce a selective oxidation of the AlAsP layer constituting the second DBR structure 3508. The oxidation of the AlAsP layer proceeds laterally into the interior of the central post structure in the DBR structure 3508 along the AlAsP layers therein, and there is formed an oxidized region 3508A such that the oxidized region 3508A surrounds the central, unoxidized region that provides the current path of the drive current.

Further, an $SiO_2$ film 3511 is deposited uniformly by a CVD process, and a photolithographic patterning process is conducted to form a contact window in the $SiO_2$ film 3511 so as to expose the GaInP contact layer 3510 in correspondence to the contact window at top part of the central post structure. Further, a circular resist mask pattern is formed so as to cover the contact layer 3510 thus exposed by the contact window, and a p-type electrode layer is deposited on the structure thus covered by the circular resist mask by an evaporation-deposition process. By lifting off the circular resist pattern, a p-type electrode 3512 is formed in a circular shape. Further, the bottom surface of the GaAsP substrate 3502 is polished and an n-type electrode 3501 is deposited by an evaporation-deposition process.

Thereafter, a thermal annealing process is applied to form an ohmic contact at each of the electrodes 3501 and 3512.

In the present embodiment, the process of selective oxidation for forming the oxidized region 3508A is substantially facilitated by forming the second DBR structure 3508 by a repetitive and alternate stacking of AlAsP and GaInP layers. While it is possible to form the third DBR structure 3509 also to have the AlAsP/GaInP structure similarly to the second DBR structure, it is advantageous to use the AlInAsP/GaInP stacking structure for the third DBR structure 3509 for minimizing the resistance of the laser diode.

Further, it is possible to use a stacking structure of AlAs/GaInP for the second DBR structure 3508.

According to the present embodiment, a current confinement structure is formed inside the DBR structure and the threshold current of laser oscillation can be reduced substantially.

Thirtieth Embodiment

Next, a vertical-cavity laser diode according to a thirtieth embodiment of the present invention will be described with reference to FIG. 40.

In the present embodiment, the vertical-cavity laser diode includes a DBR structure similarly to the vertical-cavity laser diodes of the previous embodiments except that there is interposed a current confinement structure of an AlAsP layer between the DBR structure and the active layer, wherein the AlAsP layer has a composition represented as $AlAs_{z6}P_{1-z6}$ ($0 \leq z_6 \leq 1$) and includes therein an insulator region formed as a result of selective oxidation.

In the present embodiment, it is not necessary for the AlAsP layer to achieve a lattice matching to the DBR structure but may accumulate a strain. Because a sufficient current-confinement effect is obtained with the thickness of only 10-20 nm for the AlAsP layer, it is also possible to use an AlAs layer in place of the AlAsP layer without causing any serious deterioration of crystal quality.

In the laser diode of the present embodiment, it is preferable to provide the current-confinement structure of AlAsP as close to the active layer as possible for eliminating unwanted spreading of the drive current after passing through the current-confinement structure. The oxidized region thus formed as a result of the selective oxidation process has a reduced refractive index, and the current-confinement structure forms also an optical confinement structure, which is effective for lateral mode control of the laser oscillation.

Figure 40:
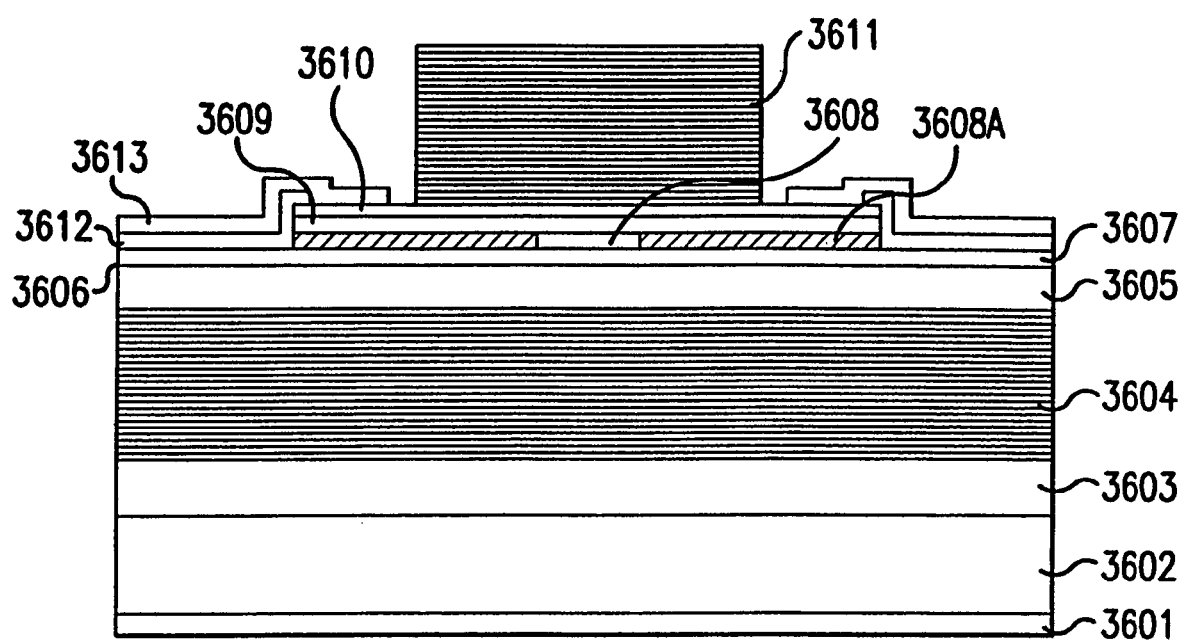
FIG. 40 is a diagram showing the construction of a laser diode according to a thirtieth embodiment of the present invention.

FIG. 40 shows the construction of the vertical-cavity laser diode according to the present embodiment.

Referring to FIG. 40, the vertical-cavity laser diode is constructed on a substrate 3602 of n-type GaAsP and includes, on the substrate of 3602, a buffer layer 3603 of n-type GaAsP, a DBR structure 3604 formed of an alternate repetition of an n-type AlAsP layer and an n-type GaInP layer, a first carrier confinement layer 3605 of undoped GaInP, an active layer 3606 of undoped GaInAsP, a second carrier confinement layer 3607 of undoped GaInP, a to-be-oxidized layer 3608 of p-type. AlAsP, a third optical confinement layer 3609 of undoped GaInP, a contact layer 3610 of p-type GaInP, and another DBR structure 3611, wherein the layers 3603-3611 are deposited consecutively on the substrate 3602 by an MOCVD process.

After the formation of the foregoing layered structure, a photolithographic patterning process is conducted in which the DBR structure 3611 is patterned to form a central post structure. The patterning process is conducted until the GaInP contact layer 3610 is exposed.

After the formation of the central post structure, the central post structure is protected by a circular resist pattern, and the GaInP contact layer 3610, the GaInP carrier confinement layer 3609 and the AlAsP to-be-oxidized layer 3608 are patterned consecutively until the carrier confinement layer 3607 is exposed, while using the circular resist pattern as a mask.

Next, the structure thus obtained is subjected to a selective oxidation process in a water vapor atmosphere, and there is formed an oxidized region 3608A in the to-be-oxidized layer 3608 as a result of the oxidation that proceeds toward the interior of the layer 3608, starting from the outermost, exposed surface. Thereby, the oxidized region 3608A acts as a current-blocking region and there is formed a current-confinement structure within the to-be-oxidized layer 3608.

Further, an $SiO_2$ film 3612 is deposited uniformly by a CVD process, and a photolithographic patterning process is conducted to form a contact window in the $SiO_2$ film 3612 so as to expose DBR structure 3611 and a part of the p-type GaInP contact layer 3610. Further, a resist mask pattern is formed so as to cover the DBR structure 3611 and a p-type electrode layer is deposited on the structure thus covered by the resist mask pattern by an evaporation-deposition process. By lifting off the resist mask pattern, a p-type electrode 3613 is formed in contact with the contact layer 3610. Further, the bottom surface of the GaAsP substrate 3602 is polished and an n-type electrode 3601 is deposited by an evaporation-deposition process.

Thereafter, a thermal annealing process is applied to form an ohmic contact at each of the electrodes 3601 and 3613.

As noted before, the vertical-cavity laser diode of FIG. 40 includes a current-confinement structure formed as a result of selective oxidation process of the AlGaP to-be-oxidized layer 3608. As the layer 3608 is formed close to the active layer 3606, the carriers corresponding to the drive current of the laser diode are injected into the active layer 3606 with minimum lateral spreading, and the efficiency of laser oscillation is improved substantially. Further, the oxidized region 3608A and the unoxidized region of the layer 3608 form an optical confinement structure effective for lateral mode control of laser oscillation. Thereby, the vertical-cavity laser diode of the present embodiment oscillates stably at a single lateral mode.

It should be noted that a thickness of 10-20 nm is sufficient for the AlAsP to-be-oxidized layer 3608. Further, AlAs may be used for the layer 3608 without causing a serious deterioration of crystal quality.

It should be noted that the foregoing embodiments of FIGS. 35-40 can be constructed also on a GaInP substrate. Such a GaInP substrate can be formed by depositing a composition-graded layer on a GaAs substrate by a vapor phase epitaxial process.

Thirty-First Embodiment

Next, a vertical-cavity laser diode according to a thirty-first embodiment of the present invention will be described with reference to FIG. 31.

In the present embodiment, the vertical-cavity laser diode uses a pair of DBR structures having a lattice constant between GaAs and GaP, wherein the vertical-cavity laser diode is constructed such that an output laser beam is obtained through the DBR structure located closer to the substrate. The vertical-cavity laser diode of such a construction is suitable for a flip-chip mounting, as the laser beam is emitted in the upward direction in the state that the laser diode is mounted on a support substrate such as a printed circuit board in a face-down state or junction-down state.

Figure 41:
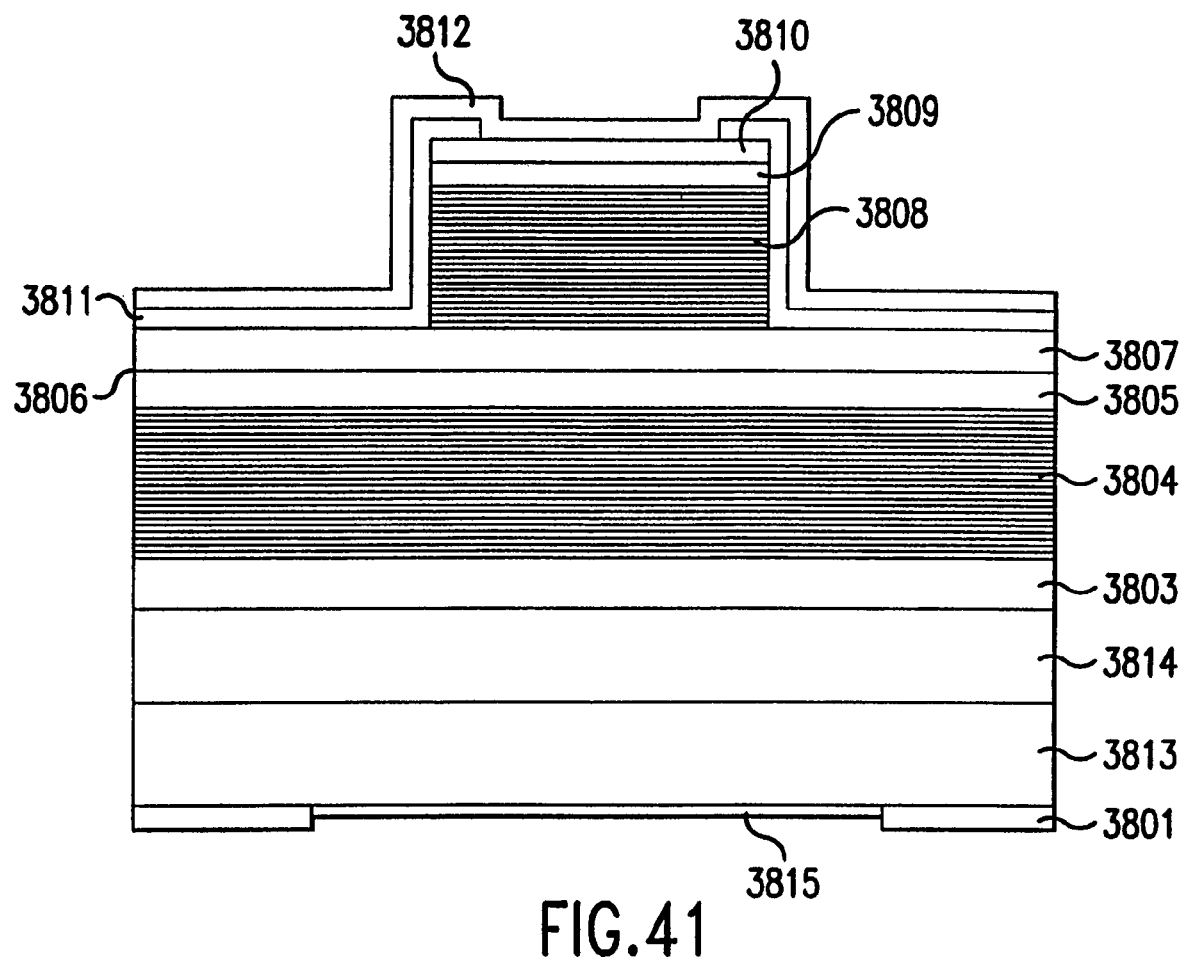
FIG. 41 is a diagram showing the construction of a laser diode according to a thirty-first embodiment of the present invention.

FIG. 41 shows the construction of the vertical-cavity laser diode according to the present embodiment.

Referring to FIG. 41, the vertical-cavity laser diode is constructed on a substrate 3813 of n-type GaP carrying thereon a composition-graded layer 3814 of n-type GaAsP formed by a vapor phase epitaxial process, wherein the composition-graded layer 3814 changes a composition thereof from GaP to GaAsP.

The laser diode includes, on the composition-graded layer 3814, a buffer layer 3803 of n-type GaAsP, a DBR structure 3804 formed of an alternate repetition of an n-type AlInAsP layer and an n-type GaInP layer, a carrier confinement layer 3805 of undoped AlGaInAsP, an active layer 3806 of undoped GaInAsP, another carrier confinement layer 3807 of undoped GaInP, a DBR structure 3808 formed of an alternate repetition of a p-type AlInAsP layer and a p-type GaInP layer, a spike elimination layer 3809 of p-type GaInP, and a contact layer 3810 of p-type GaAsP, wherein the layers 3803-3810 are deposited consecutively on the composition-graded layer 3814 by an MOCVD process.

After the formation of the foregoing layered structure, a photolithographic patterning process is conducted in which the DBR 3808, the spike elimination layer 3809 and the contact layer 3810 are patterned to form a central post structure while using a resist mask. The patterning process is conducted until the GaInP carrier confinement layer 3807 is exposed.

After the formation of the central post structure, an SiO$_2$ film 3811 is deposited uniformly by a CVD process, and a photolithographic patterning process is conducted to form a contact window in the SiO$_2$ film 3811 by using a resist mask so as to expose the GaAsP contact layer 3810, and a p-type electrode 3812 is deposited by an evaporation-deposition process.

In the present embodiment, the bottom surface of the GaAsP substrate 3802 is polished and a resist pattern is provided so as to cover the region aligned with the post structure, and an n-type electrode is deposited by an evaporation-deposition process. Further, by lifting off the resist pattern, there is formed an n-type electrode 3801 such that the n-type electrode 3801 has an optical window in correspondence to the part where the resist pattern has been provided.

Thereafter, a thermal annealing process is applied to form an ohmic contact at each of the electrodes 3801 and 3812.

Finally, an SiO$_2$ anti-reflection coating 3815 is provided on the bottom surface of the substrate 3801 in correspondence to the optical window with a thickness corresponding to a quarter wavelength of the laser oscillation wavelength.

In the construction of FIG. 41, it should be noted that the GaP substrate 3813 and the GaAsP composition-graded layer 3814 thereon are transparent to the optical radiation of the oscillation wavelength of the laser diode of 635 nm. Thus, it is not necessary to remove a part of the substrate 3813 or 3814 to provide a passage for the output optical beam. Thereby, the fabrication process of the laser diode is simplified.

In the present embodiment, it is also possible to use other absorption-free substrates such as GaInP substrate for the substrate 3813. Further, the process of forming the composition-graded layer 3814 on the substrate 3813 is not limited to a vapor phase epitaxial process.

Thirty-Second Embodiment

Next, a vertical cavity laser diode according to a thirty-second embodiment of the present invention will be described with reference to FIG. 42.

In the present embodiment, the vertical-cavity laser diode includes a pair of DBR structures having a lattice constant between GaAs and GaP, wherein the laser diode is designed to produce the output optical beam through the DBR structure located closer to the substrate while using simultaneously a GaAsP substrate.

In the present embodiment, a part of the GaAsP substrate is etched away for providing the path of the output optical beam, wherein the process of etching the GaAsP substrate is facilitated in the present embodiment by interposing a GaInAsP etching stopper layer between the GaAsP substrate and the DBR structure located closer to the GaPAs substrate.

It should be noted that a GaAsP mixed crystal is not transparent to the optical radiation of the wavelength of 630-660 nm when the As content is equal to or larger than 0.63. Thus, there can be a case in which the GaAsP substrate absorbs the output laser beam in the vertical-cavity laser diode of the type that emits the output laser beam through the DBR structure located closer to the GaAsP substrate, depending on the composition of the GaAsP substrate. Thus, it is necessary in such a vertical-cavity laser diode to remove a part of the GaAsP substrate for allowing the laser beam to go out without absorption.

While such an etching of the GaAsP substrate can be achieved by using a sulfuric acid etchant, the sulfuric acid etchant, reacting upon a mixed crystal of AlGaInAsP, can act on the DBR structure depending on the composition of the DBR structure. On the other hand, a mixed crystal of GaInAsP containing As with a concentration smaller than the As content of the GaAsP substrate, a high selectivity of etching is realized with respect to the GaAsP substrate. Thus, the present embodiment uses a GaInAsP mixed crystal layer as an etching stopper layer in the process of forming an opening in the GaAsP substrate as a passage of the output laser beam. In view of the fact that the selectivity of etching increases with decreasing As content, it is possible to use a mixed crystal composition of GaInP for the etching stopper layer.

Figure 42:
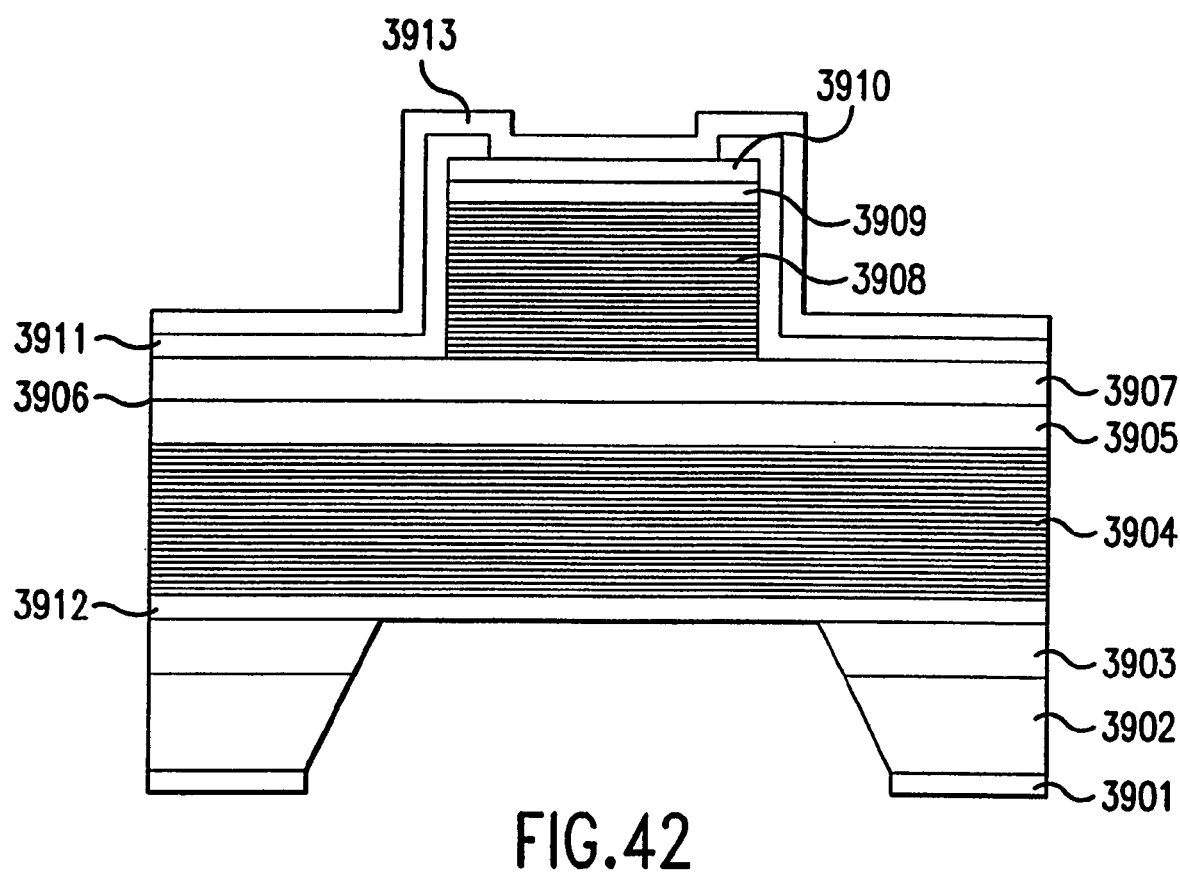
FIG. 42 is a diagram showing the construction of a laser diode according to a thirty-second embodiment of the present invention.

FIG. 42 shows the construction of the vertical-cavity laser diode according to the present embodiment.

Referring to FIG. 42, the vertical-cavity laser diode is constructed on a substrate 3902 of n-type GaAsP, wherein the laser diode includes, on the GaAsP substrate 3902, a buffer layer 3903 of n-type GaAsP, an etching stopper layer 3912 of n-type GaInP, a DBR structure 3904 formed of an alternate repetition of an n-type AlInAsP layer and an n-type AlGaAsP layer, a carrier confinement layer 3905 of undoped GaInP, an active layer 3906 of undoped GaInAsP, another carrier confinement layer 3907 of undoped GaInP, a DBR structure 3908 formed of an alternate repetition of a p-type AlInAsP layer and a p-type AlGaAsP layer, a spike elimination layer 3909 of p-type GaInP, and a contact layer 3910 of p-type GaAsP, wherein the foregoing layers 3903-3910, including the layer 3912, are deposited consecutively on the substrate 3902 by an MOCVD process.

In the present embodiment the n-type GaAsP substrate 3902 has a composition set such that a lattice strain of −1.4% is accumulated with respect to GaAs. Further, the active layer 3906 of GaInAsP has a composition that provides a laser oscillation wavelength of 650 nm. Further, it should be noted that the DBR structure 3904 uses AlInAsP for the low-refractive-index layer and AlGaAsP for the high-refractive-index layer.

After the formation of the foregoing layered structure, a photolithographic patterning process is conducted in which the DBR 3908, the spike elimination layer 3909 and the contact layer 3910 are patterned to form a central post structure while using a resist mask. The patterning process is conducted until the GaInP carrier confinement layer 3907 is exposed.

After the formation of the central post structure, an SiO$_2$ film 3910 is deposited uniformly by a CVD process, and a photolithographic patterning process is conducted to form a contact window in the SiO$_2$ film 3910 by using a resist mask so as to expose the GaAsP contact layer 3910, and a p-type electrode 3911 is deposited by an evaporation-deposition process.

In the present embodiment, the bottom surface of the GaAsP substrate 3902 is polished and a resist pattern is provided so as to expose the region aligned with the post structure, and a wet etching process is applied to the GaAsP substrate 3902 while using a sulfuric acid etchant. Thereby, the wet etching process proceeds until the GaInP etching stopper layer 3912 is exposed, wherein the etching stops spontaneously upon the exposure of the GaInP etching stopper layer 3912 due to the selectivity of the GaInP composition. As a result of the wet etching process, an opening is formed in the GaAsP substrate 3902 as the output path of the laser beam.

After the step of forming the opening in the GaAsP substrate 3902, an n-type electrode is deposited by an evaporation-deposition process on the bottom surface of the GaAsP substrate 3902. Further, a thermal annealing process is applied to form an ohmic contact at each of the electrodes 3901 and 3911.

By using the etching stopper layer 3912, the etching process for forming the opening in the GaAsP substrate 3902 is controlled exactly and the laser diode can be produced with little variation.

As noted previously, a GaInAsP mixed crystal can be used for the etching stopper layer 3912.

Thirty-Third Embodiment

The laser diodes of the present invention described heretofore with reference to FIGS. 9-42 can be used for various applications.

Figure 43:
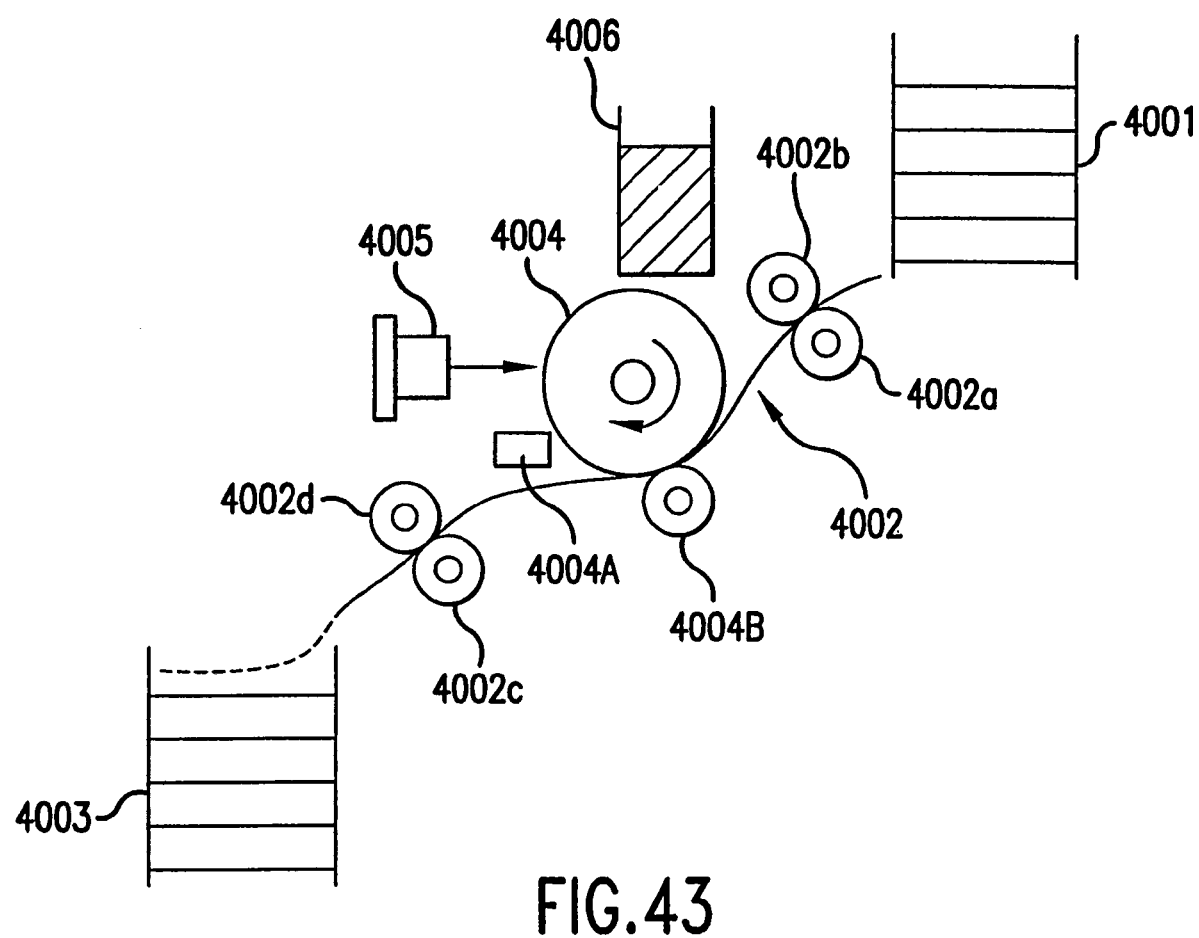
FIG. 43 is a diagram showing the construction of a xerographic image recording apparatus according to a thirty-third embodiment of the present invention.

FIG. 43 shows the construction of a xerographic printer that uses the laser diode according to any of the embodiments of the present invention.

Referring to FIG. 43, the xerographic printer includes a sheet feed path 4002 including guide rollers 4002a-4002d for feeding a sheet from a sheet feed stack 4001 one by one to a sheet recovery tray 4003.

In correspondence to an intermediate location on the sheet feed path 4002 between the sheet feed stack 4001 and the recovery tray 4003, there is provided a photosensitive medium 4004, which may be a photosensitive drum or a photosensitive belt, and a laser diode array 4005 writes an image to be recorded on the sheet by way of an optical beam, wherein the laser diode array may include the visible to red wavelength laser diode described with reference to any of the embodiments of FIGS. 9-42 as an optical source.

The photosensitive medium 4004 is electrically charged by an electric charger 4004A, and an electrostatic latent image is formed on the charged surface of the photosensitive medium 4004 in correspondence to the part irradiated by the laser beam.

The electrostatic latent image thus formed on the photosensitive medium 4004 is developed by toner powers held in a toner cartridge 4006 and a toner image is formed on the photosensitive medium 4004 in correspondence to the toner image. The toner image thus formed on the photosensitive medium 4004 is then transferred to the sheet on the sheet feed path 4002 by urging the sheet strongly to the photosensitive medium 4004 by an urging roller 4004B.

The recording sheet thus formed with the toner image is then fixed by a fixing unit and is forwarded to the sheet recovery tray.

In the xerographic image recording apparatus, writing of the electrostatic latent image onto the photosensitive medium 4004 can be achieved by using a red color beam, which is advantageous for high-speed and high-resolution image recording.

Thirty-Fourth Embodiment

Figure 44:
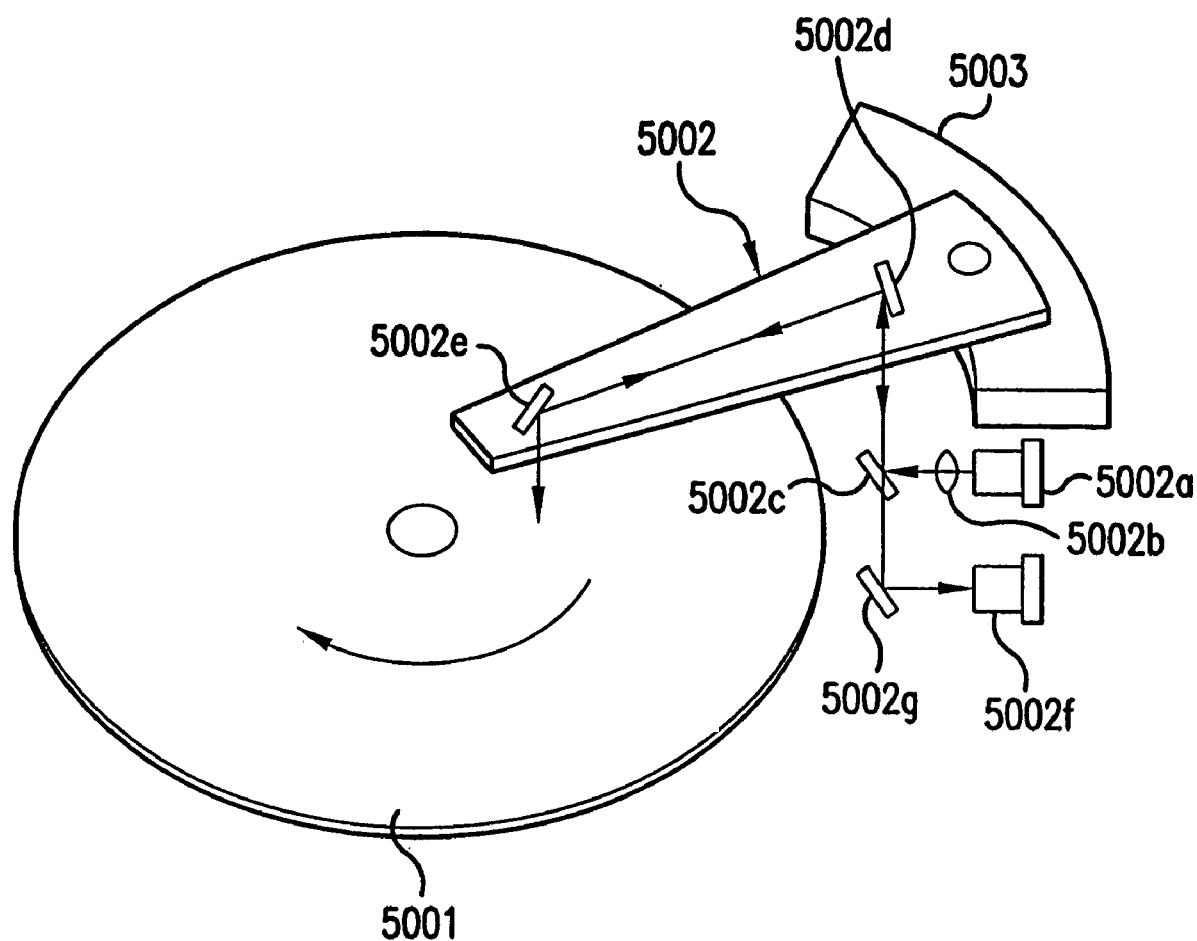
FIG. 44 is a diagram showing the construction of an optical disk drive according to a thirty-fourth embodiment of the present invention.

FIG. 44 shows the construction of an optical disk drive according to a thirty-fourth embodiment of the present invention.

Referring to FIG. 44, the optical disk drive includes a rotary optical disk 5001 and an optical head 5002 driven by a driving mechanism 5003 so as to scan over the surface of the rotary optical disk 5001, wherein the optical head 5002 includes a red-wavelength laser diode 5002a according to any of the embodiments described heretofore with reference to FIGS. 9-42.

The laser beam produced by the laser diode 5002a is directed to the surface of the rotary optical disk 5001 via a lens 5002a, a half-transparent mirror 5002c and mirrors 5002d and 5002e, while the optical beam reflected by the optical disk 5001 is guided to a photo-detector 5002f via the mirrors 5002e and 5002d, the half-transparent mirror 5002c and the mirror 5002g.

By using the red-wavelength laser diode of the previous embodiments, optical reading and optical writing becomes possible with a small drive current.

Thirty-Fifth Embodiment

Figure 45:
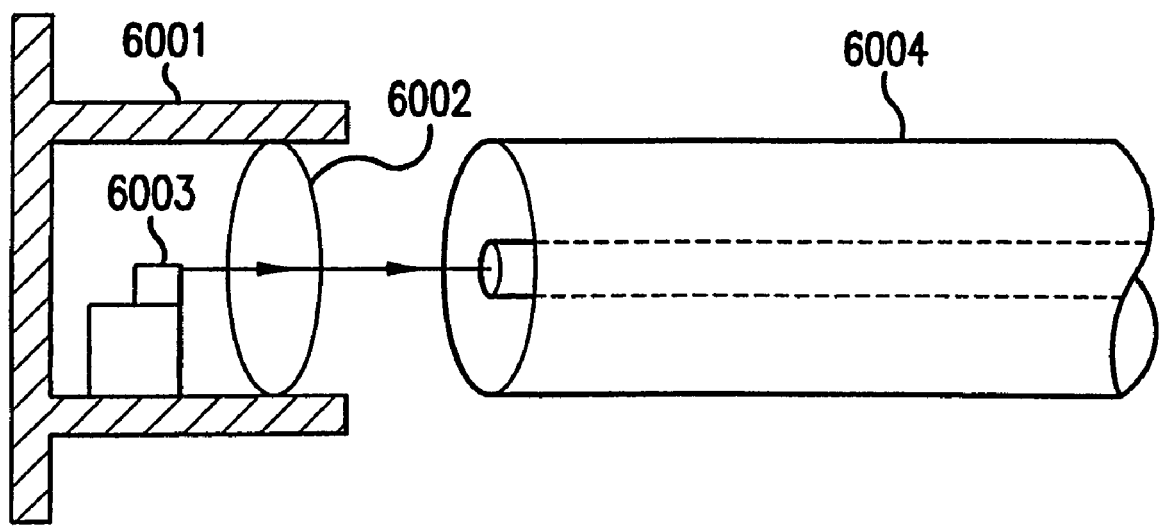
FIG. 45 is a diagram showing the construction of an optical module according to a thirty-fifth embodiment of the present invention.

FIG. 45 shows the construction of an optical module according to a thirty-fifth embodiment of the present invention.

Referring to FIG. 45, the optical module includes, in a module housing 6001, a lens 6002 and a laser diode 6003 in optical alignment with the lens 6002, wherein the laser diode 6003 may be any of the red-wavelength laser diode described in the previous embodiments with reference to FIGS. 9-42. Further, the optical module includes a plastic optical fiber 6004 in optical alignment with the lens 6002, and hence the laser diode 6003. Thereby, the laser beam produced by the laser diode 6003 is injected into the plastic optical fiber 6004.

According to the optical module of the present embodiment, a laser beam in the wavelength range of about 650 nm is produced efficiently by using a red-wavelength laser diode explained before, wherein it should be noted that this wavelength of about 650 nm corresponds to the minimum transmission loss of PMMA which is used extensively for the material of a plastic optical fiber.

Thus, the optical module of the present embodiment, and hence the red-wavelength laser diode of the present invention, is expected to play an important role in a low-cost, short-distance optical network.

While it is illustrated in FIG. 45 that the laser diode 6003 is an edge-emission type laser diode, the vertical-cavity laser diode explained with reference to FIGS. 35-42 is also applicable to the optical module of FIG. 45.

Further, the present invention is by no means limited to the embodiments described heretofore, but various variations and modifications may be made without departing from the scope of the invention.

The invention claimed is:

1. A vertical-cavity laser diode, comprising:
a substrate of GaAsP or GaInP;
an active layer provided over said substrate, said active layer emitting optical radiation in the wavelength range of 630-650 nm; and
a distributed Bragg reflector provided over said substrate in an optical path of said optical radiation emitted from said active layer in a direction perpendicularly to a plane of said active layer, said distributed Bragg reflector comprising a plurality of layers stacked over said substrate, said distributed Bragg reflector having a lattice constant between GaAs and GaP and consisting of at least two semiconductor layers of respective, mutually different compositions,
at least one of said semiconductor layers having a composition represented as $(Al_{x1}Ga_{1-x1})_{y1}In_{1-y1}As_{z1}P_{1-z1}$ ($0<x_1\leq1$, $0.5\leq y_1\leq1$, $0<z_1<1$), said distributed Bragg reflector being in lattice matching with said substrate.

2. A vertical-cavity laser diode as claimed in claim 1, wherein said substrate carries an optical window at a bottom surface thereof.

3. A vertical-cavity laser diode as claimed in claim 1, wherein said substrate has a composition of GaAsP, and wherein said vertical-cavity laser diode further includes a GaInAsP layer between said substrate and said distributed Bragg reflector.

4. A vertical-cavity laser diode as claimed in claim 1, wherein said substrate has a composition of GaAsP, and wherein said vertical-cavity laser diode includes a GaInP layer between said semiconductor substrate and said distributed Bragg reflector.

5. A vertical-cavity laser diode, comprising:
a substrate of GaAsP or GaInP;
an active layer provided over said substrate, said active layer emitting optical radiation in the wavelength range of 635-650 nm; and
a distributed Bragg reflector provided over said substrate in an optical path of said optical radiation emitted from said active layer in a direction perpendicularly to a plane of said active layer, said distributed Bragg reflector comprising a plurality of layers stacked over said substrate,
said active layer having a composition represented as $Ga_{y2}In_{1-y2}As_{z2}P_{1-z2}$ ($0 \leq y_2 \leq 1$, $0 < z_2 \leq 1$),
said distributed Bragg reflector having a lattice constant between GaAs and GaP and consisting of at least two semiconductor layers of respective, mutually different compositions, and
at least one of said semiconductor layers having a composition represented as $(Al_{x1}Ga_{1-x1})_{y1}In_{1-y1}As_{z1}P_{1-z1}$ ($0 < x_1 \leq 1$, $0.5 \leq y_1 \leq 1$, $0 < z_1 < 1$),
said distributed Bragg reflector being in lattice matching with said substrate.

6. A vertical-cavity laser diode as claimed in claim 5, wherein said substrate carries an optical window at a bottom surface thereof.

7. A vertical-cavity laser diode as claimed in claim 5, wherein said substrate has a composition of GaAsP, and wherein said vertical-cavity laser diode further includes a GaInAsP layer between said substrate and said distributed Bragg reflector.

8. A vertical-cavity laser diode as claimed in claim 5, wherein said substrate has a composition of GaAsP, and wherein said vertical-cavity laser diode includes a GaInP layer between said semiconductor substrate and said distributed Bragg reflector.

* * * * *